(12) United States Patent
Ohmae et al.

(10) Patent No.: US 11,081,028 B2
(45) Date of Patent: Aug. 3, 2021

(54) LIGHT-EMITTING DEVICE ASSEMBLY, METHOD OF PRODUCING THE SAME, AND DISPLAY APPARATUS

(71) Applicant: SONY CORPORATION, Tokyo (JP)

(72) Inventors: Akira Ohmae, Kanagawa (JP); Yusuke Kataoka, Kanagawa (JP); Tatsuo Ohashi, Kanagawa (JP); Sayaka Aoki, Kanagawa (JP); Hiroki Naito, Tokyo (JP); Ippei Nishinaka, Kanagawa (JP); Tsuyoshi Sahoda, Kagoshima (JP); Toshio Fujino, Kanagawa (JP); Hideyuki Nishioka, Kagoshima (JP); Goshi Biwa, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 327 days.

(21) Appl. No.: 16/088,068

(22) PCT Filed: Feb. 17, 2017

(86) PCT No.: PCT/JP2017/005972
§ 371 (c)(1),
(2) Date: Sep. 24, 2018

(87) PCT Pub. No.: WO2017/169269
PCT Pub. Date: Oct. 5, 2017

(65) Prior Publication Data
US 2020/0302835 A1  Sep. 24, 2020

(30) Foreign Application Priority Data
Mar. 30, 2016 (JP) .............................. JP2016-067406

(51) Int. Cl.
*G09F 9/33* (2006.01)
*H01L 25/075* (2006.01)
(Continued)

(52) U.S. Cl.
CPC ............ *G09F 9/33* (2013.01); *H01L 25/0753* (2013.01); *H01L 33/18* (2013.01); *H01L 33/36* (2013.01); *H01L 33/62* (2013.01)

(58) Field of Classification Search
None
See application file for complete search history.

(56) References Cited

U.S. PATENT DOCUMENTS 6,462,354 B1 * 10/2002 Okuyama ............... H01L 33/32
257/103
2011/0266039 A1  11/2011 Tomoda
2014/0008691 A1  1/2014 Tomoda et al.

FOREIGN PATENT DOCUMENTS

CN  102237478 A  11/2011
CN  103531557 A  1/2014
(Continued)

OTHER PUBLICATIONS

International Search Report and Written Opinion of PCT Application No. PCT/JP2017/005972, dated Apr. 11, 2017, 10 pages of ISRWO.

(Continued)

*Primary Examiner* — Bo B Jang
(74) *Attorney, Agent, or Firm* — Chip Law Group

(57) ABSTRACT

A light-emitting device assembly includes a light-emitting device including a light-emitting layer, a first electrode, and a second electrode, and a first connecting portion and a second connecting portion provided on a base, in which the first connecting portion and the second connecting portion are separated from each other by a separation portion, the base is exposed from the separation portion, a wide portion is on a first connecting portion side of the separation portion, the first electrode includes a first portion and a second portion, the second portion of the first electrode is connected to the first connecting portion, the first portion of the first (Continued)

electrode extends from the second portion of the first electrode, and an orthographic projection image of the first portion of the first electrode with respect to the base and the wide portion of the separation portion overlap with each other at least in part.

11 Claims, 40 Drawing Sheets

(51) Int. Cl.
*H01L 33/18* (2010.01)
*H01L 33/36* (2010.01)
*H01L 33/62* (2010.01)

(56) References Cited

FOREIGN PATENT DOCUMENTS

| | | |
|---|---|---|
| CN | 105977232 A | 9/2016 |
| JP | 07-183304 A | 7/1995 |
| JP | 2011-233733 A | 11/2011 |
| JP | 2014-013818 A | 1/2014 |
| KR | 10-2011-0120218 A | 11/2011 |
| TW | 201212304 A | 3/2012 |
| TW | 201316556 A | 4/2013 |
| TW | 201537777 A | 10/2015 |

OTHER PUBLICATIONS

Twain Office Action for Application No. 106103775 dated Jul. 29, 2020.

* cited by examiner

LIGHT-EMITTING DEVICE ASSEMBLY, METHOD OF PRODUCING THE SAME, AND DISPLAY APPARATUS

CROSS REFERENCE TO RELATED APPLICATIONS

This application is a U.S. National Phase of International Patent Application No. PCT/JP2017/005972 filed on Feb. 17, 2017, which claims priority benefit of Japanese Patent Application No. JP 2016-067406 filed in the Japan Patent Office on Mar. 30, 2016. Each of the above-referenced applications is hereby incorporated herein by reference in its entirety.

TECHNICAL FIELD

The present disclosure relates to a light-emitting device assembly, a method of producing the same, and a display apparatus.

BACKGROUND ART

Although various methods of mounting a large number of fine electric parts on a mounting substrate have been developed, one of which is a so-called transfer method (see, for example, Japanese Patent Application Laid-open No. 2011-233733). In this transfer method disclosed in the Patent Literature, a seed metal is formed on a wiring substrate, a light-emitting device is temporarily fixed to a wiring substrate in such a way that an electrode pad of the light-emitting device is electrically unconnected to the seed metal and located above the seed metal, electrolytic plating is performed using the seed metal as a power supply layer, and the electrode pad is bonded to the seed metal using the plating layer that grows by the electrolytic plating to fix the light-emitting device. Here, resin is used for temporarily fixing the light-emitting device to the wiring substrate.

CITATION LIST

Patent Literature

Patent Literature 1: Japanese Patent Application Laid-open No. 2011-233733

DISCLOSURE OF INVENTION

Technical Problem

Although the technology disclosed in the above-mentioned Patent Literature is an excellent mounting technology, since the resin for temporarily fixing the light-emitting device to the wiring substrate remains, there is a possibility that the resin for the temporary fixation is peeled off when the light-emitting device is used for a long time.

Therefore, it is an object of the present disclosure to provide a light-emitting device assembly having a configuration and a structure that does not cause a problem that the resin for the temporary fixation is peeled off when the light-emitting device is used for a long time, a method of producing the same, and a display apparatus including such a light-emitting device assembly.

Solution to Problem

In order to achieve the above-mentioned object, a light-emitting device assembly according to a first aspect of the present disclosure includes a light-emitting device including
a light-emitting layer,
a first electrode, and
a second electrode electrically connected to the light-emitting layer; and
a first connecting portion and a second connecting portion provided on a base, in which
the first connecting portion and the second connecting portion are separated from each other by a separation portion, the base being exposed from the separation portion,
a wide portion is provided on a first connecting portion side of the separation portion,
the first electrode includes a first portion and a second portion, the first portion being in contact with the light-emitting layer,
the second portion of the first electrode is connected to the first connecting portion,
the first portion of the first electrode extends from the second portion of the first electrode, and
an orthographic projection image of the first portion of the first electrode with respect to the base and the wide portion of the separation portion overlap with each other at least in part.

In order to achieve the above-mentioned object, a light-emitting device assembly according to a second aspect of the present disclosure includes
a light-emitting device including
a light-emitting layer,
a first electrode, and
a second electrode electrically connected to the light-emitting layer; and
a first connecting portion and a second connecting portion provided on a base, in which
the first connecting portion and the second connecting portion are separated from each other by a separation portion, the base being exposed from the separation portion,
the first electrode includes a first portion and a second portion, the first portion being in contact with the light-emitting layer,
the second portion of the first electrode is connected to the first connecting portion,
the first portion of the first electrode extends from the second portion of the first electrode, and
a communication unit (for convenience, referred to as "first communication unit" in some cases) is provided in a part of the light-emitting device in which the second portion of the first electrode is provided and around the part, the second portion of the first electrode communicating with the outside via the communication unit.

In order to achieve the above-mentioned object, a display apparatus according to the present disclosure includes the light-emitting device assemblies according to the first or second aspect of the present disclosure arranged in a two-dimensional matrix pattern.

In order to achieve the above-mentioned object, a method of producing the light-emitting device assembly according to the first aspect of the present disclosure is a method of producing a light-emitting device assembly including
a light-emitting device including a light-emitting layer, a first electrode, and a second electrode electrically connected to the light-emitting layer, and
a first connecting portion and a second connecting portion provided on a base, in which
the first connecting portion and the second connecting portion are separated from each other by a separation portion, the base being exposed from the separation portion, a wide portion is provided on a first connecting portion side of the separation portion, the first electrode includes a first portion and a second portion, the first portion being in contact with the light-emitting layer, the second portion of the first electrode is connected to the first connecting portion, the first portion of the first electrode extends from the second portion of the first electrode, and an orthographic projection image of the first portion of the first electrode with respect to the base and the wide portion of the separation portion overlap with each other at least in part, the method including at least:

disposing the light-emitting device on the base via an uncured or semi-cured energy ray-curable adhesive layer in such a way that an orthographic projection image of the first portion of the first electrode with respect to the base and the wide portion of the separation portion overlap with each other at least in part, the second portion of the first electrode faces the first connecting portion, and the light-emitting device covers the separation portion; then, applying an energy ray to the base from a side of the base opposite to a side on which the light-emitting device is disposed to cure a part of the adhesive layer that is not blocked by the first connecting portion and the second connecting portion, and then removing the part of the uncured or semi-cured adhesive layer; then, connecting the second portion of the first electrode and the first connecting portion to each other; and then, removing the cured adhesive layer via the separation portion.

In order to achieve the above-mentioned object, a method of producing the light-emitting device assembly according to the second aspect of the present disclosure is a method of producing a light-emitting device assembly including a light-emitting device including a light-emitting layer, a first electrode, and a second electrode electrically connected to the light-emitting layer, and a first connecting portion and a second connecting portion provided on a base, in which the first connecting portion and the second connecting portion are separated from each other by a separation portion, the base being exposed from the separation portion, the first electrode includes a first portion and a second portion, the first portion being in contact with the light-emitting layer, the second portion of the first electrode is connected to the first connecting portion, the first portion of the first electrode extends from the second portion of the first electrode, and a communication unit (first communication unit) is provided in a part of the light-emitting device in which the second portion of the first electrode is provided and around the part, the second portion of the first electrode communicating with the outside via the communication unit, the method including at least:

disposing the light-emitting device on the base via an uncured or semi-cured energy ray-curable adhesive layer in such a way that an orthographic projection image of the first portion of the first electrode with respect to the base and the wide portion of the separation portion overlap with each other at least in part, the second portion of the first electrode faces the first connecting portion, and the light-emitting device covers the separation portion; then, applying an energy ray to the base from a side of the base opposite to a side on which the light-emitting device is disposed to cure a part of the adhesive layer that is not blocked by the first connecting portion and the second connecting portion, and then removing the part of the uncured or semi-cured adhesive layer; then, connecting the second portion of the first electrode and the first connecting portion to each other; and then, removing the cured adhesive layer via the separation portion.

Advantageous Effects of Invention

In the light-emitting device assembly according to the first or second aspects of the present disclosure or the display apparatus according to the present disclosure including the light-emitting device assembly according to the first or second aspects of the present disclosure, the first connecting portion and the second connecting portion are separated from each other by a separation portion, the base being exposed from the separation portion. Specifically, no resin for the temporary fixation remains in the separation portion. Therefore, the problem that the resin for the temporary fixation is peeled off when the light-emitting device is used for a long time is not caused. Also in the method of producing the light-emitting device assembly according to the first or second aspect of the present disclosure, since the part of the cured adhesive layer (corresponding to the resin for the temporary fixation) is finally removed via the separation portion, the problem that the resin for the temporary fixation is peeled off when the light-emitting device is used for a long time is not caused. It should be noted that the effects described herein are merely examples and are not limited, and additional effects may be provided.

Figure 26A:
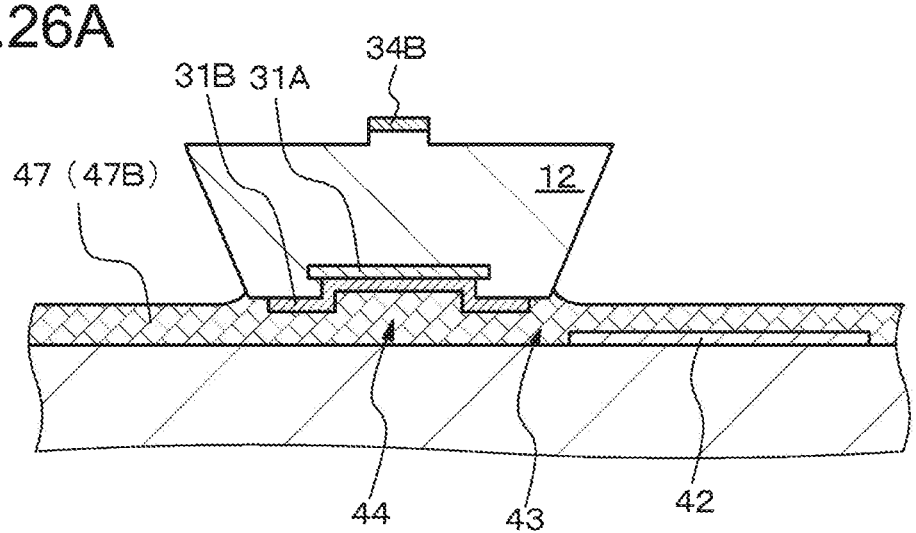
FIG. 26A and FIG. 26B are each a schematic partial end view of a light-emitting device and the like for describing a method of producing the light-emitting device assembly of the embodiment 2.
Figure 26B:
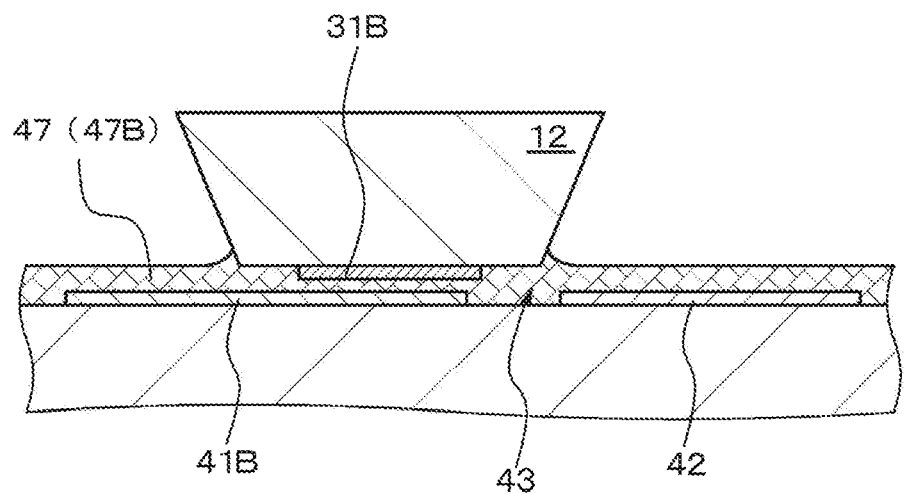
Figure 27A:
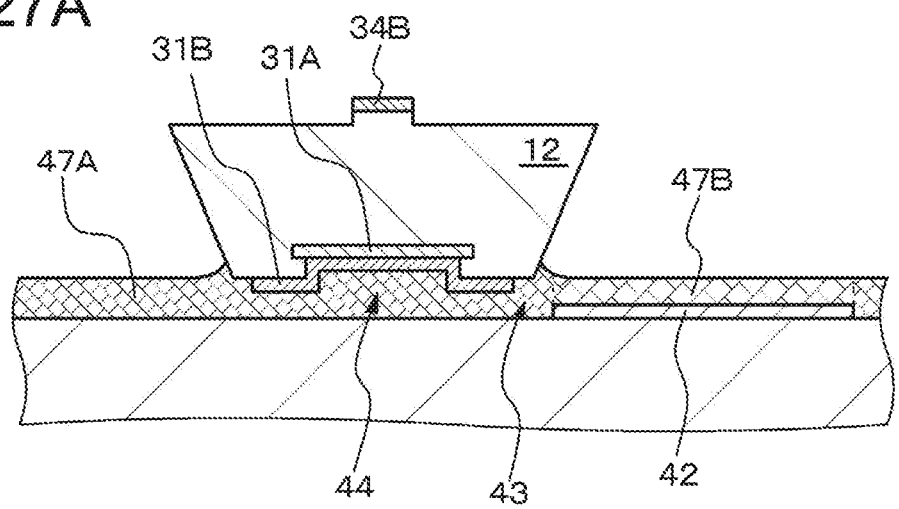
Figure 27B:
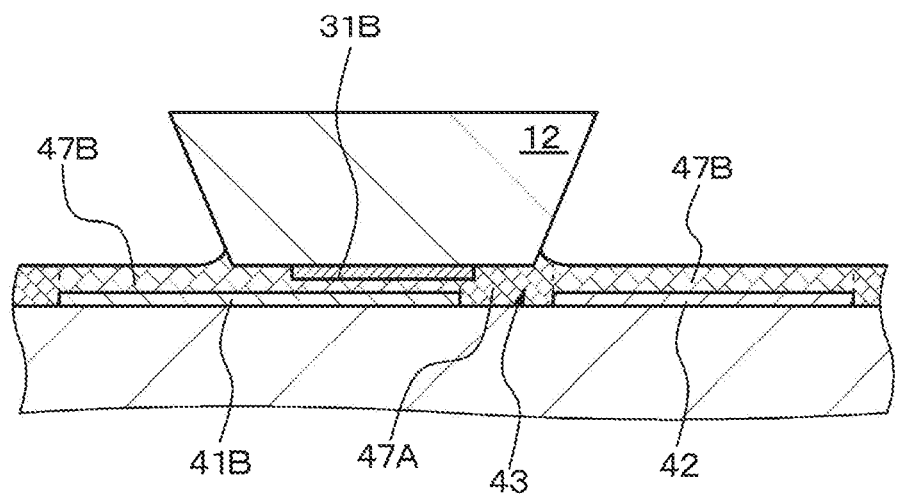

27A and FIG. 27B are each a schematic partial end view of the light-emitting device and the like for describing the method of producing the light-emitting device assembly of the embodiment 2, subsequently to FIG. 26A and FIG. 26B.

Figure 28A:
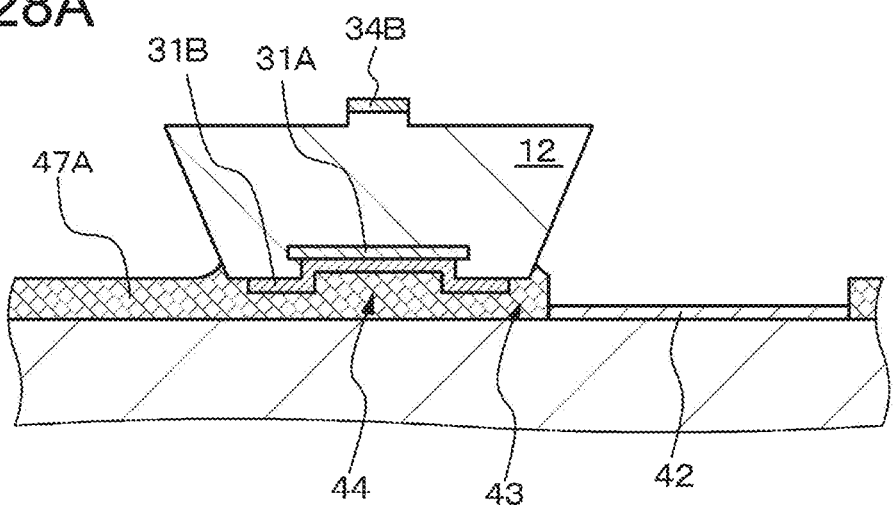
Figure 28B:
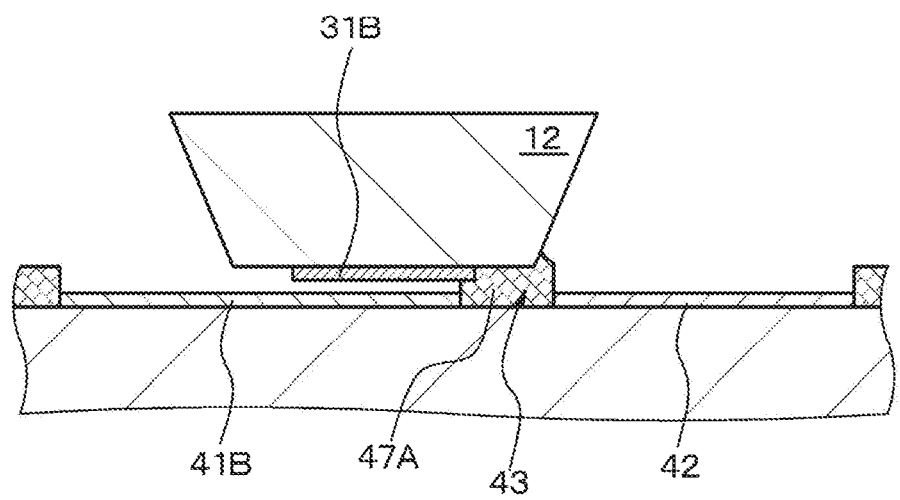

FIG. 28A and FIG. 28B are each a schematic partial end view of the light-emitting device and the like for describing the method of producing the light-emitting device assembly of the embodiment 2, subsequently to FIG. 27A and FIG. 27B.

Figure 29A:
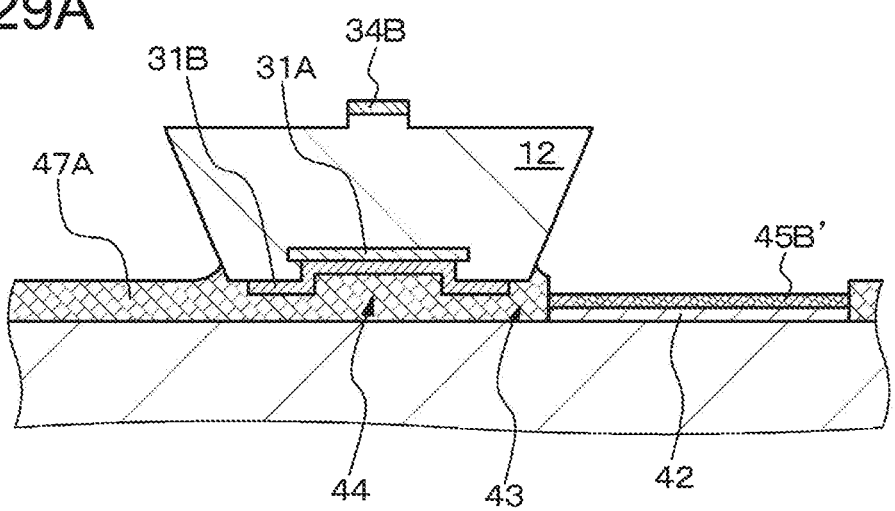
Figure 29B:
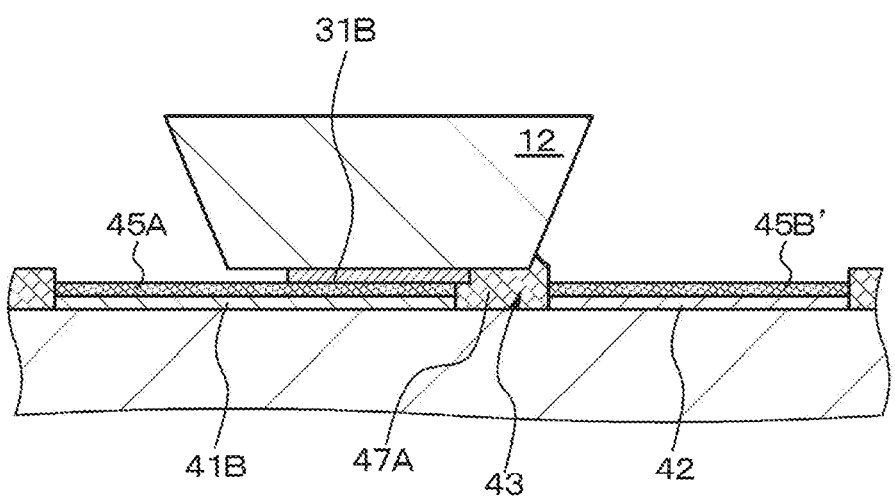

FIG. 29A and FIG. 29B are each a schematic partial end view of the light-emitting device and the like for describing the method of producing the light-emitting device assembly of the embodiment 2, subsequently to FIG. 28A and FIG. 28B.

Figure 30A:
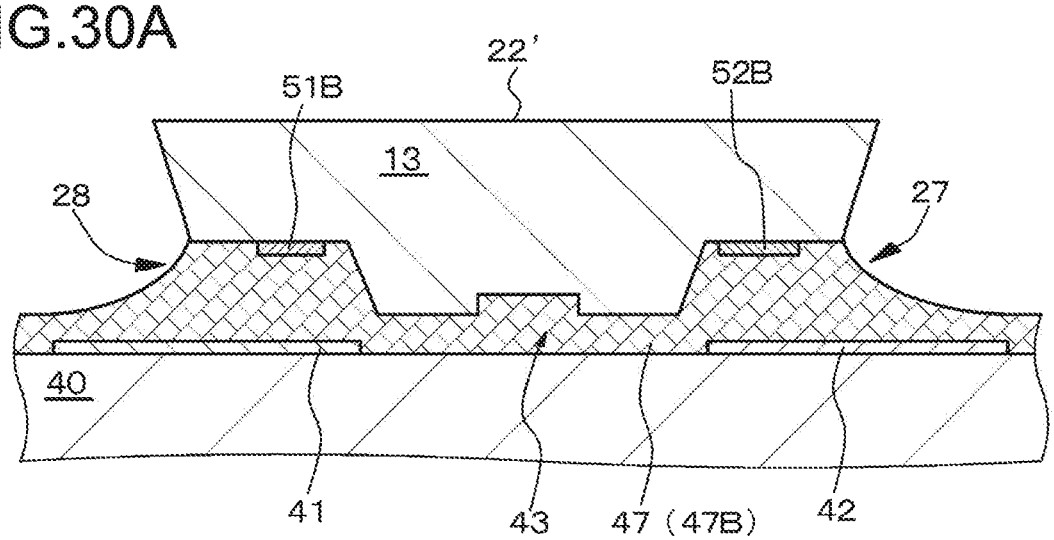
Figure 30B:
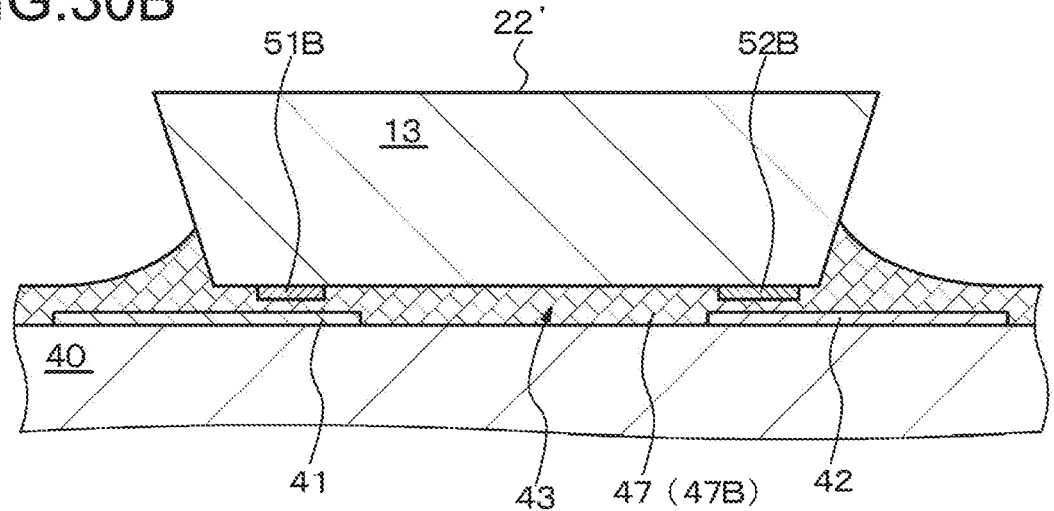

FIG. 30A and FIG. 30B are each a schematic partial end view of a light-emitting device and the like for describing a method of producing the light-emitting device assembly of the embodiment 3.

Figure 31A:
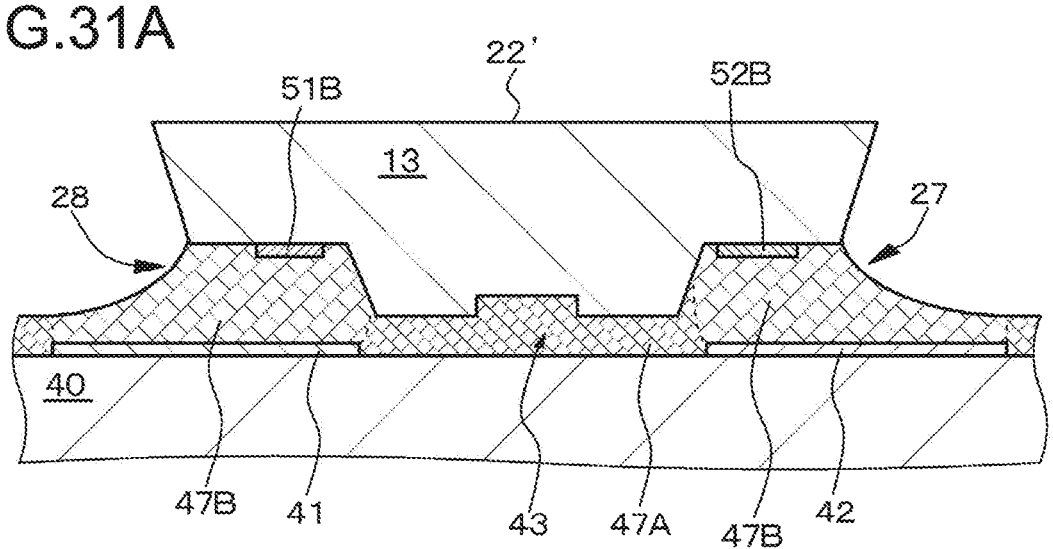
Figure 31B:
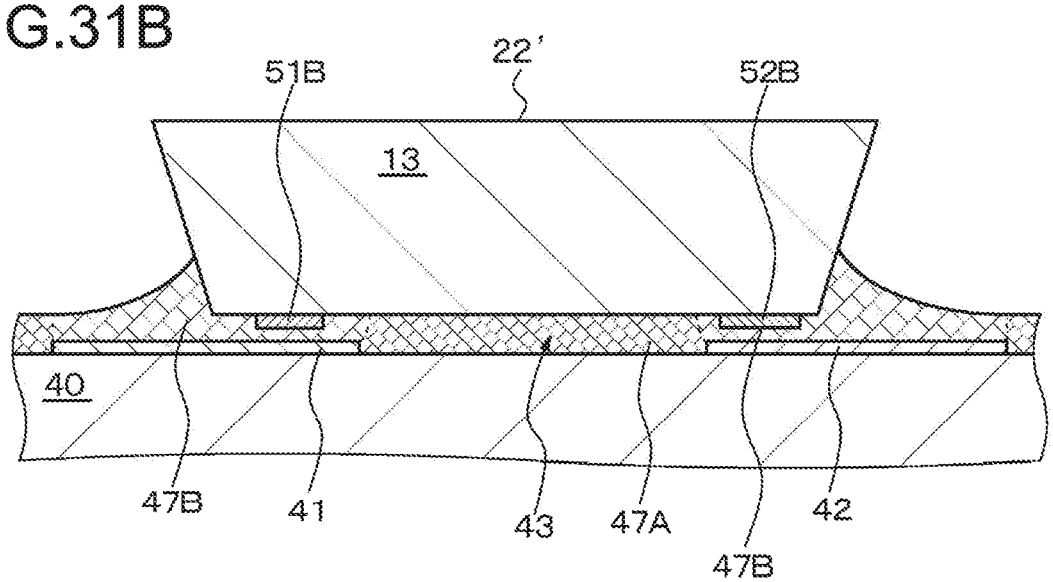

FIG. 31A and FIG. 31B are each a schematic partial end view of the light-emitting device and the like for describing the method of producing the light-emitting device assembly of the embodiment 3, subsequently to FIG. 30A and FIG. 30B.

Figure 32A:
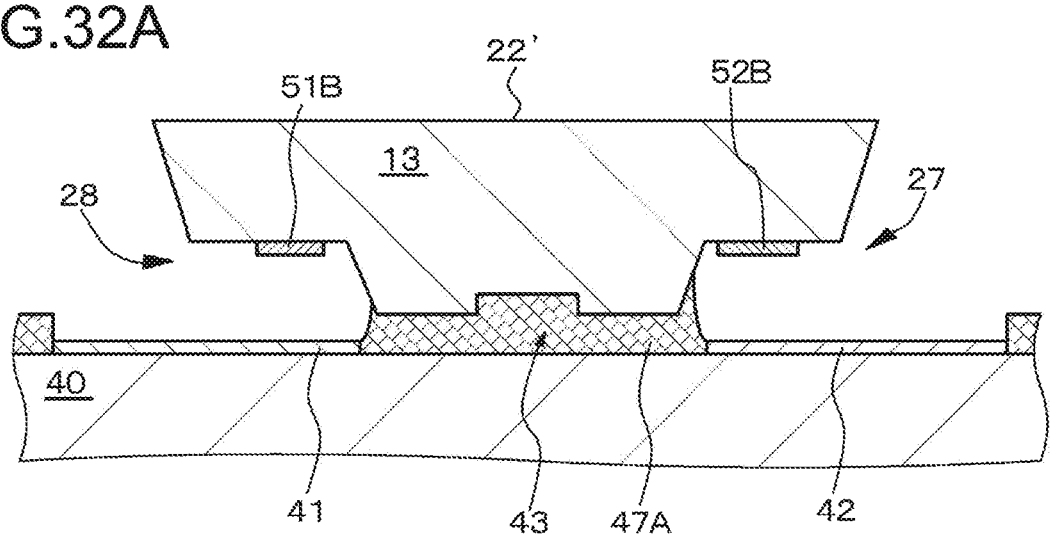
Figure 32B:
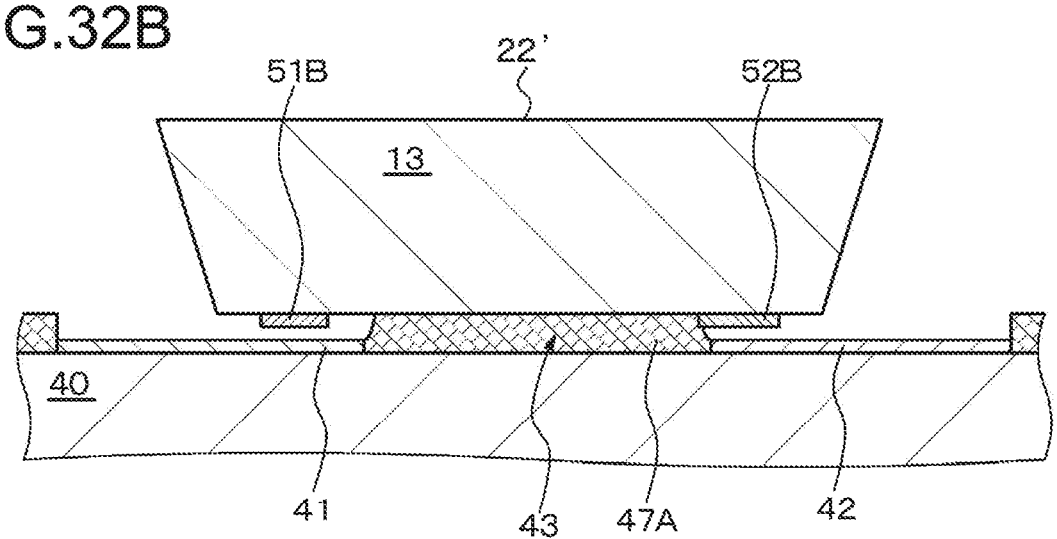

FIG. 32A and FIG. 32B are each a schematic partial end view of the light-emitting device and the like for describing the method of producing the light-emitting device assembly of the embodiment 3, subsequently to FIG. 31A and FIG. 31B.

Figure 33A:
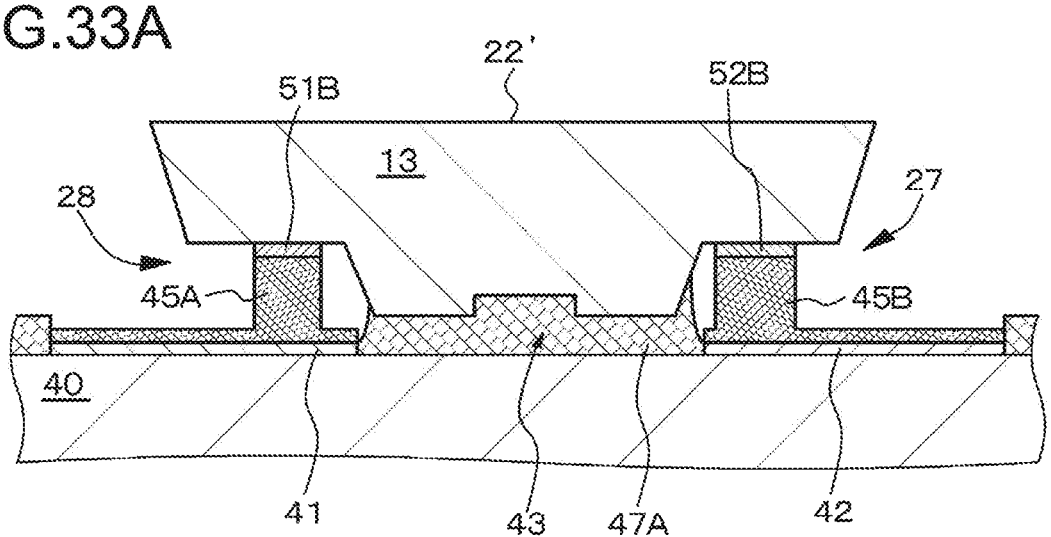
Figure 33B:
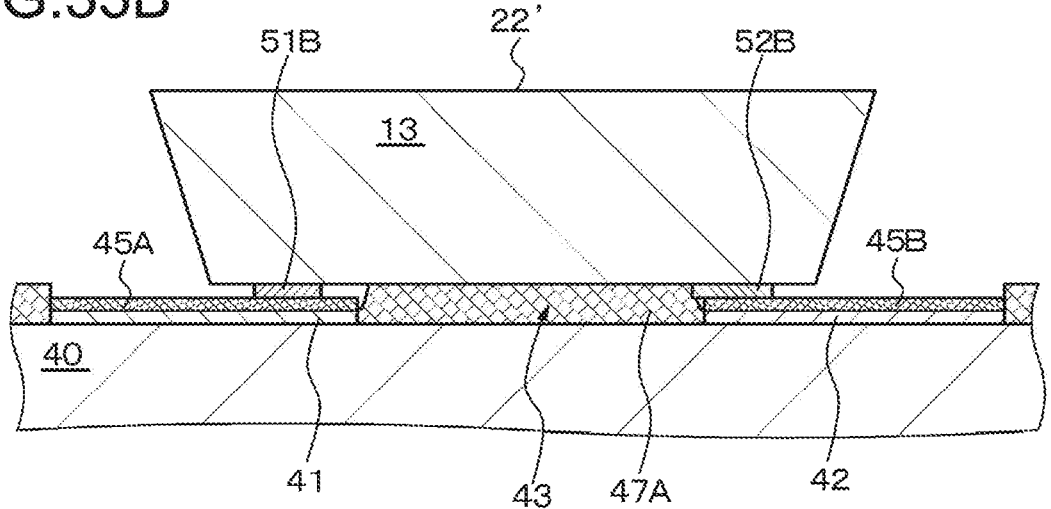

FIG. 33A and FIG. 33B are each a schematic partial end view of the light-emitting device and the like for describing the method of producing the light-emitting device assembly of the embodiment 3, subsequently to FIG. 32A and FIG. 32B.

Figure 34A:
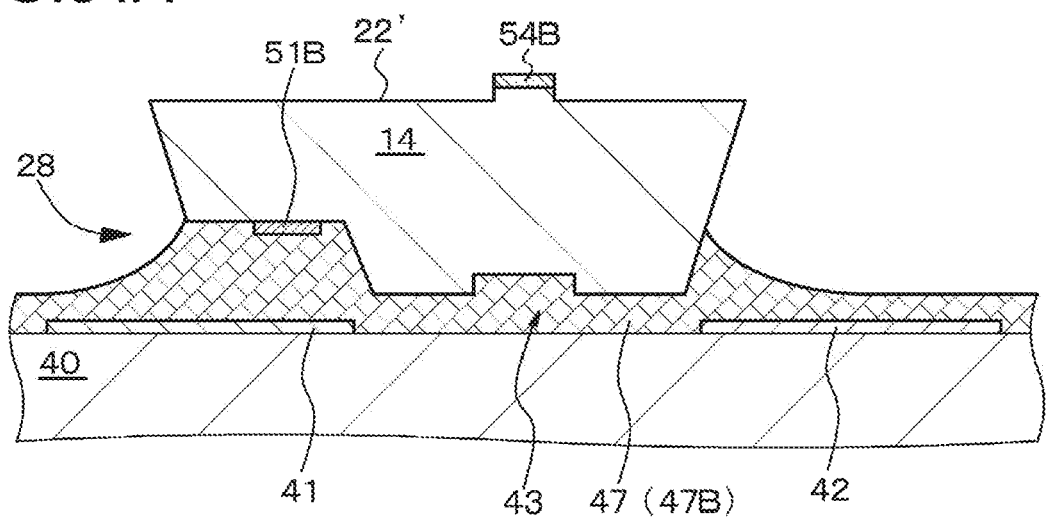
Figure 34B:
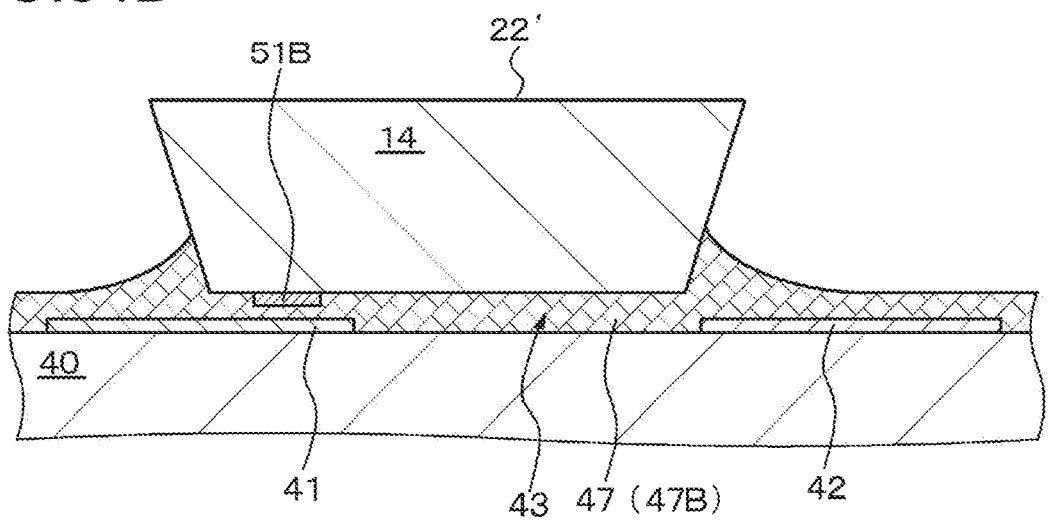

FIG. 34A and FIG. 34B are each a schematic partial end view of a light-emitting device and the like for describing a method of producing the light-emitting device assembly of the embodiment 4.

Figure 35A:
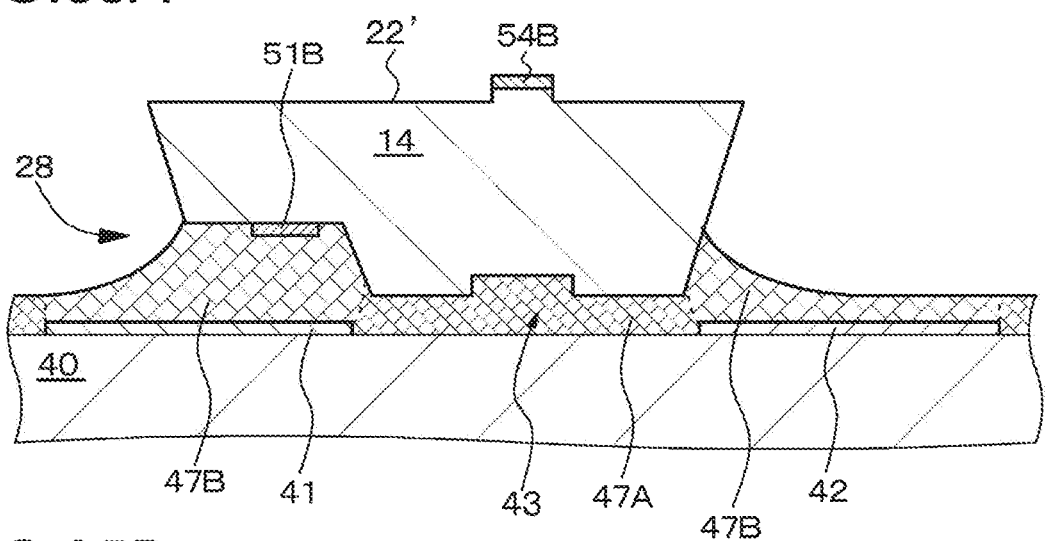
Figure 35B:
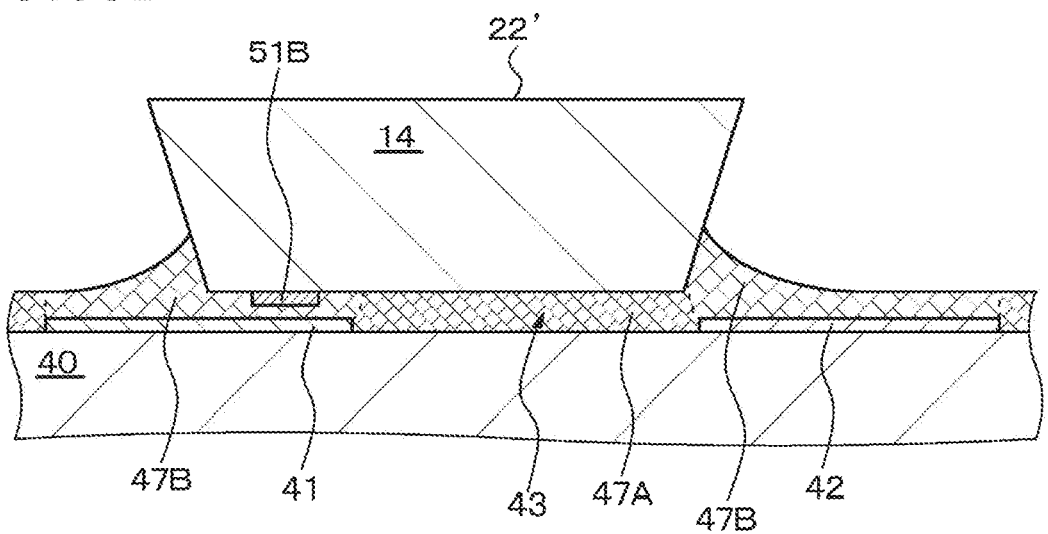

FIG. 35A and FIG. 35B are each a schematic partial end view of the light-emitting device and the like for describing the method of producing the light-emitting device assembly of the embodiment 4, subsequently to FIG. 34A and FIG. 34B.

Figure 36A:
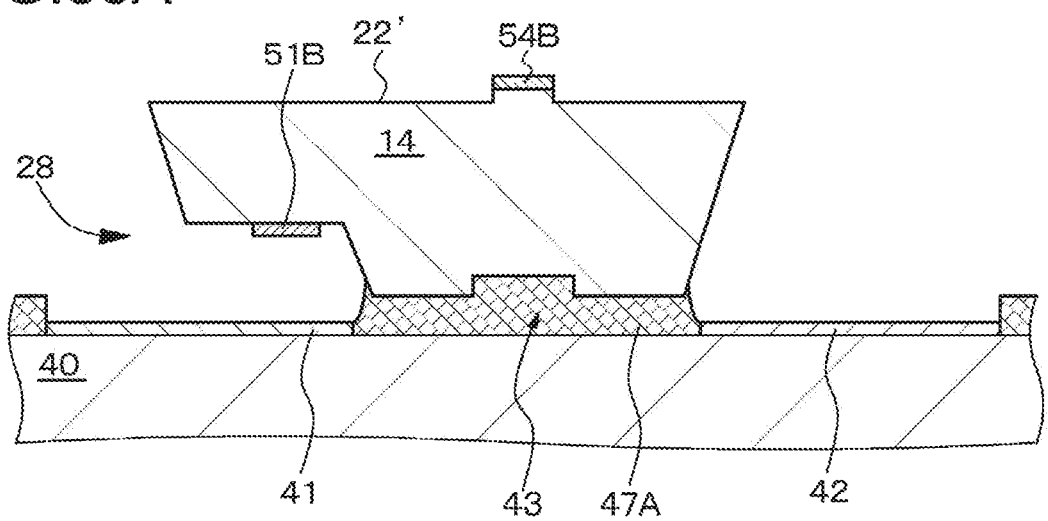
Figure 36B:
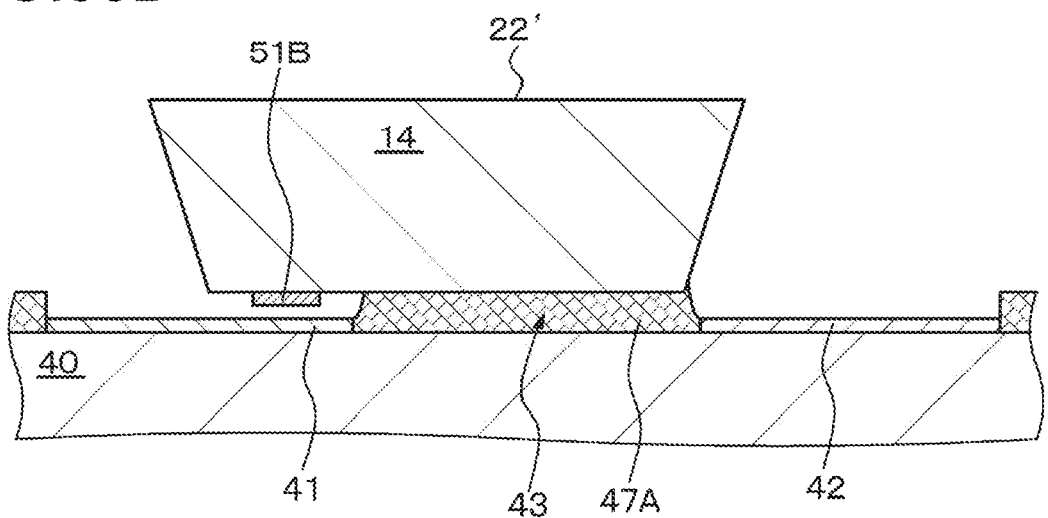

FIG. 36A and FIG. 36B are each a schematic partial end view of the light-emitting device and the like for describing the method of producing the light-emitting device assembly of the embodiment 4, subsequently to FIG. 35A and FIG. 35B.

Figure 37A:
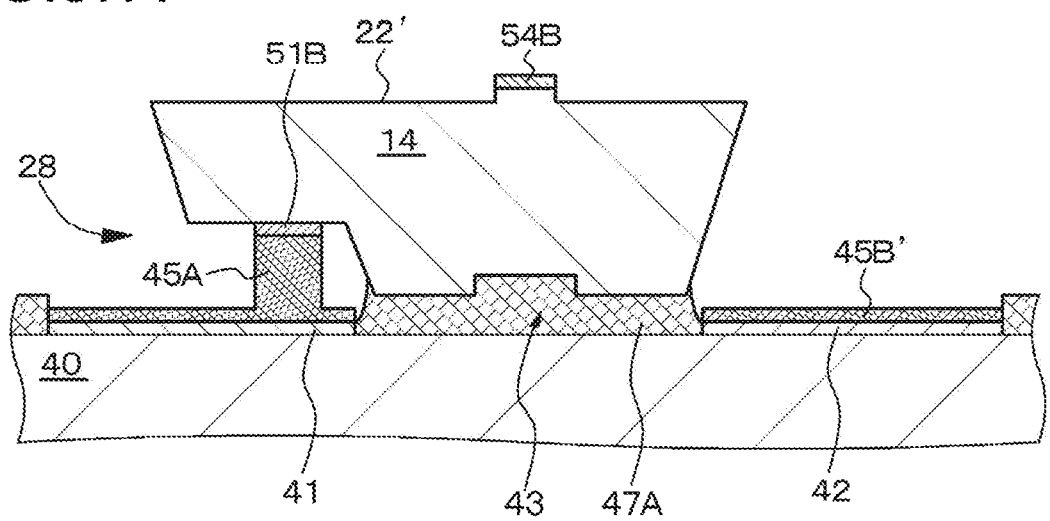
Figure 37B:
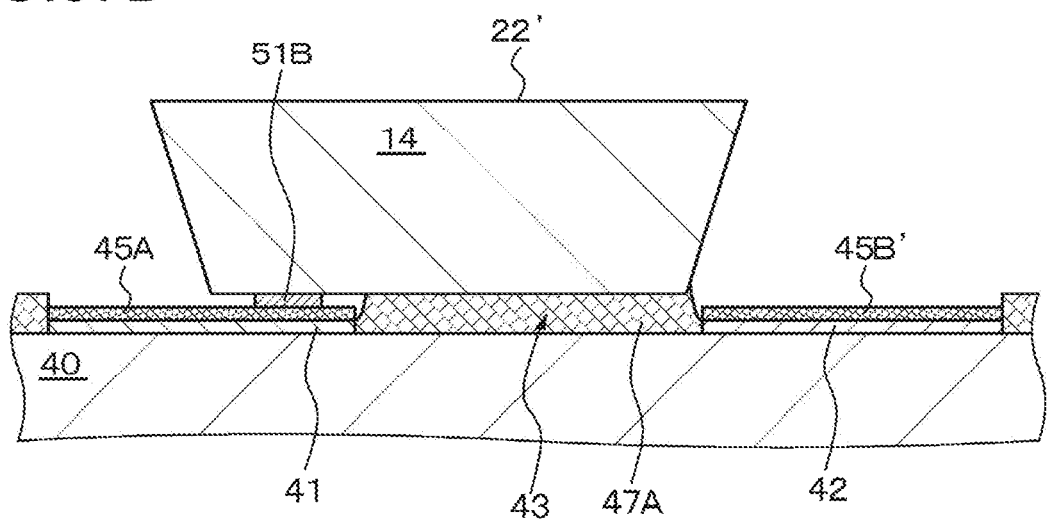

FIG. 37A and FIG. 37B are each a schematic partial end view of the light-emitting device and the like for describing the method of producing the light-emitting device assembly of the embodiment 4, subsequently to FIG. 36A and FIG. 36B.

Figure 38A:
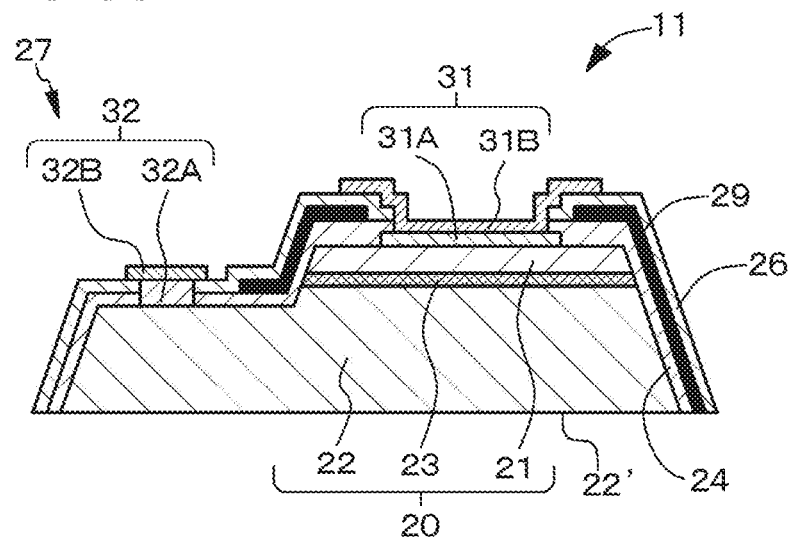
Figure 38B:
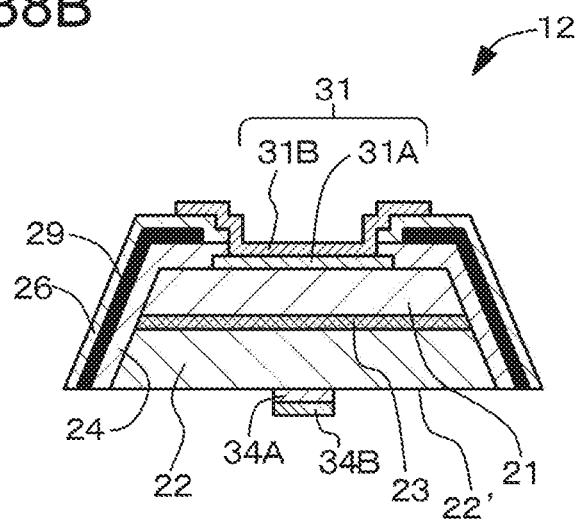

FIG. 38A is a schematic partial end view of a modified example of the light-emitting device constituting the light-emitting device assembly of the embodiment 1, and FIG. 38B is a schematic partial end view of a modified example of the light-emitting device constituting the light-emitting device assembly of the embodiment 2, FIG. 38A and FIG. 38B showing a light-emitting device in which a light-shielding film is formed.

Figure 39:
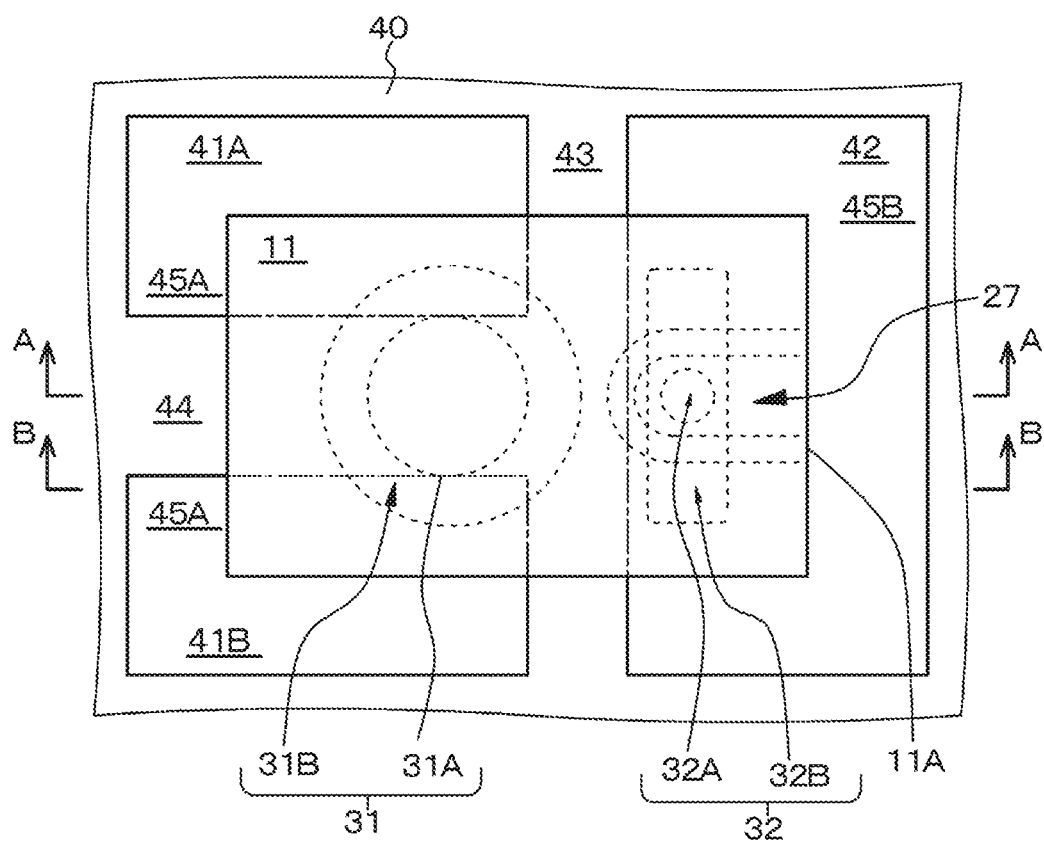

FIG. 39 is a schematic partial plan view of another modified example of the light-emitting device assembly of the embodiment 1.

Figure 40:
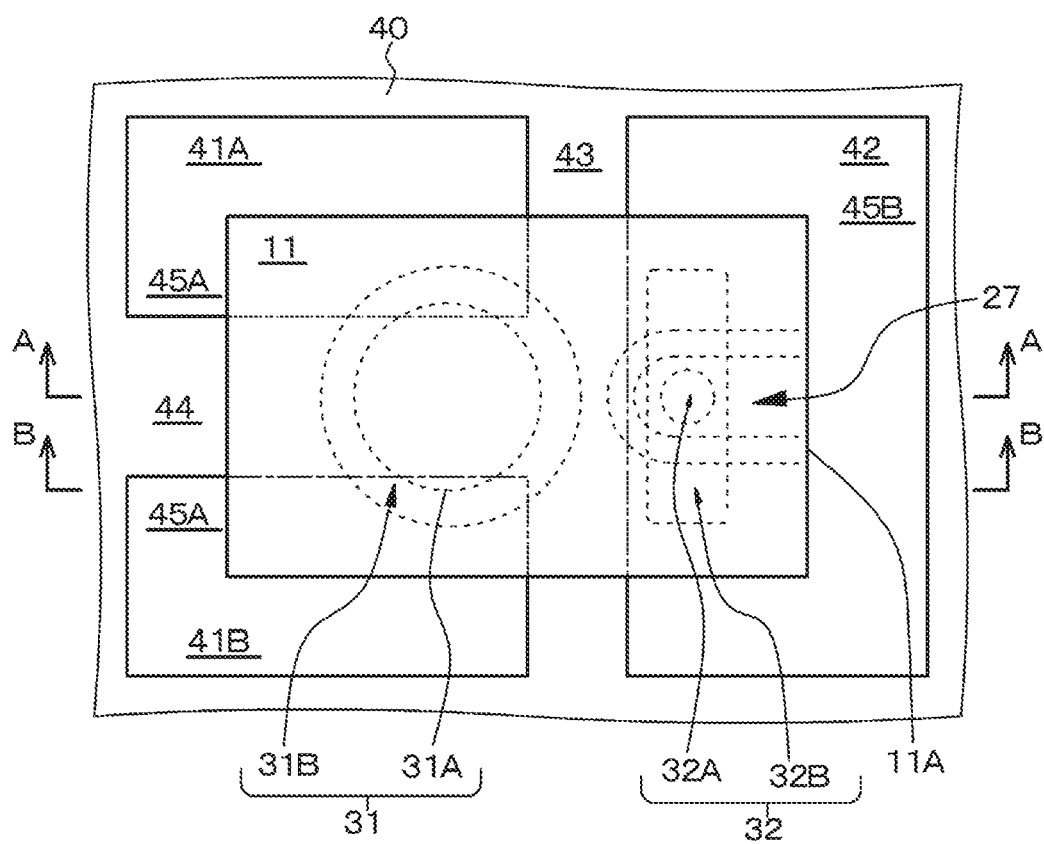

FIG. 40 is a schematic partial plan view of still another modified example of the light-emitting device assembly of the embodiment 1.

MODE(S) FOR CARRYING OUT THE INVENTION

Hereinafter, the present disclosure will be described on the basis of embodiments with reference to the drawings. The present disclosure is not limited to the embodiments, and various numerical values or materials in the embodiments are examples. Note that the description will be given in the following order.

1. General description regarding light-emitting device assemblies according to first and second aspects of the present disclosure, methods of producing the same, and display apparatus according to present disclosure
2. Embodiment 1 (light-emitting device assembly according to first aspect of present disclosure, method of producing the same, and display apparatus according to present disclosure)
3. Embodiment 2 (alternative of embodiment 1)
4. Embodiment 3 (light-emitting device assembly according to second aspect of present disclosure, method of producing the same)
5. Embodiment 4 (alternative of embodiment 3)
6. Embodiment 5 (alternatives of embodiment 1 to embodiment 4, method of mounting light-emitting device)
7. Others

General Description Regarding Light-Emitting Device Assemblies According to First and Second Aspects of the Present Disclosure, Methods of Producing the Same, and Display Apparatus According to Present Disclosure A light-emitting device assembly according to a first aspect of the present disclosure, a light-emitting device assembly produced by a method of producing the light-emitting device assembly according to the first aspect of the present disclosure, and a light-emitting device assembly according to the first aspect of the present disclosure provided in a display apparatus according to the present disclosure will be collectively referred to as "light-emitting device assembly and the like according to the first aspect of the present disclosure" below. Further, a light-emitting device assembly according to a second aspect of the present disclosure, a light-emitting device assembly produced by a method of producing the light-emitting device assembly according to the second aspect of the present disclosure, and a light-emitting device assembly according to the second aspect of the present disclosure provided in a display apparatus according to the present disclosure will be collectively referred to as "light-emitting device assembly and the like according to the second aspect of the present disclosure" below.

In the light-emitting device assembly and the like according to the first aspect of the present disclosure, the first connecting portion may be divided by the wide portion into two areas. Further, in this case, a planar shape of the whole of the separation portion and the wide portion may be a "T" shape, a horizontal bar of the "T" shape may constitute the separation portion that separates the first connecting portion and the second connecting portion from each other, and a vertical bar of the "T" shape may constitute the wide portion that divides the first connecting portion into the two areas. Note that the width of the separation portion may be wider than/the same as/narrower than the width of the wide portion. That is, the thickness of the horizontal bar of the "T" shape may be thicker than/the same as/thinner than the thickness of the vertical bar of the "T" shape.

In the light-emitting device assembly and the like according to the first aspect of the present disclosure including the favorable configuration described above, the second portion of the first electrode may extend from the first portion and surround the first portion while projecting toward the first connecting portion.

Further, in the light-emitting device assembly and the like according to the first aspect of the present disclosure including various favorable configurations described above, the first electrode and the second electrode may be provided on the same side with respect to the light-emitting layer. Further, in this case, a communication unit (referred to as "second communication unit" in some cases) may be provided in a part of the light-emitting device in which the second electrode is provided and around the part, the second electrode communicating with the outside via the communication unit. Alternatively, where the shortest distance of space between the second portion of the first electrode and the base is represented by $L_{11}$ and the shortest distance of space between the second electrode and the base is represented by $L_{12}$, a relationship of $L_{11}<L_{12}$ may be satisfied. Further, in these configurations, the second portion of the first electrode and the first connecting portion may be connected to each other via a first conductive unit, and the second electrode and the second connecting portion may be connected to each other via a second conductive unit.

Alternatively, in the light-emitting device assembly and the like according to the first aspect of the present disclosure including various favorable configurations described above, a second electrode may be provided on the opposite side of the first electrode with respect to the light-emitting layer, and the second electrode and the second connecting portion may be connected to each other via a conductor layer. Further, in this case, an orthographic projection image of a part of the conductor layer that does not overlap with a light-emitting device with respect to the second connecting portion may be included in the second connecting portion. Alternatively, a second wide portion facing the wide portion may be provided on a second connecting portion side of the separation portion, and the second connecting portion may be divided by the second wide portion into at least two regions. Since an orthographic projection image of a part of the conductor layer that does not overlap with a light-emitting device with respect to the second connecting portion is included in the second connecting portion, even when light output from the light-emitting device is reflected by the conductor layer, the reflected light does not reach the base. Therefore, it is possible to prevent the base from being deteriorated due to the light output from the light-emitting device.

In the light-emitting device assembly and the like according to the second aspect of the present disclosure, the first connecting portion does not necessarily need to be provided in a part of the base facing at least a part of the first electrode.

Further, in the light-emitting device assembly and the like according to the second aspect of the present disclosure including the favorable configuration described above, the first electrode and the second electrode may be provided on the same side with respect to the light-emitting layer. Further, in this case, a second communication unit may be provided in a part of the light-emitting device in which the second electrode is provided and around the part, the second electrode communicating with the outside via the second communication unit. Further, in those cases, the second portion of the first electrode and the first connecting portion may be connected to each other via a first conductive unit, and the second electrode and the second connecting portion may be connected to each other via a second conductive unit.

Alternatively, in the light-emitting device assembly and the like according to the second aspect of the present disclosure including the favorable configuration described above, a second electrode may be provided on the opposite side of the first electrode with respect to the light-emitting layer, and the second electrode and the second connecting portion may be connected to each other via a conductor layer. In this case, an orthographic projection image of a part of the conductor layer that does not overlap with a light-emitting device with respect to the second connecting portion may be included in the second connecting portion. By adopting such a configuration, even when light output from the light-emitting device is reflected by the conductor layer, the reflected light does not reach the base, and it is possible to prevent the base from being deteriorated due to the light output from the light-emitting device.

Further, in the light-emitting device assembly and the like according to the first and second aspects of the present disclosure including various favorable configurations described above (hereinafter, collectively referred to as "light-emitting device assembly and the like according to the present disclosure" in some cases), the second electrode is electrically connected to the second connecting portion. However, as described above, the second electrode and the second connecting portion may be connected to each other via the second conductive unit. Alternatively, the second electrode and the second connecting portion may be connected to each other via the conductor layer. The first conductive unit connecting the second portion of the first electrode and the first connecting portion, and the second conductive unit connecting the second electrode and the second connecting portion may each include a plating layer. However, the present disclosure is not limited thereto, and they may each include, for example, a solder ball or a solder bump. That is, examples of the method of connecting the second portion of the first electrode and the first connecting portion include a plating method. However, the present disclosure is not limited thereto, and a method of using a solder ball or a solder bump may be adopted. The conductor layer may include a plating layer. However, the present disclosure is not limited thereto, and it may be configured by so-called wire bonding, for example. That is, examples of the method of forming the conductor layer include a plating method. However, the present disclosure is not limited thereto, and a method of using so-called wire bonding may be adopted. The conductor layer is not in contact with parts of the light-emitting device other than the second electrode. Examples of the adhesive (resin) material forming the energy ray-curable adhesive layer include a well-known ultraviolet curable adhesive (resin), and examples of the energy ray include ultraviolet rays suitable for curing the adhesive to be used. However, the present disclosure is not limited thereto. In order to remove the uncured or semi-cured adhesive layer or the cured adhesive layer on the separation portion and the like, for example, an appropriate solvent may be selected depending on the adhesive to be used, and these adhesive layers may be dissolved in the solvent. Note that "semi-cured" means a state of being not completely cured.

In the light-emitting device assembly and the like according to the present disclosure, the light-emitting device may include a light-emitting diode (LED). However, the present disclosure is not limited thereto, and it may include a semiconductor laser device or the like. In the case where the light-emitting device include a light-emitting diode or a semiconductor laser device, the size (e.g., chip size) of the light-emitting device is not particularly limited, but is typically small, specifically, for example, not more than 1 mm, not more than 0.3 mm, or not more than 0.1 mm, more specifically, not more than 0.03 mm. Examples of the material forming the light-emitting layer of each of the red light-emitting device that emits red light, the green light-emitting device that emits green light, and the blue light-emitting device that emits blue light include one using a III-V compound semiconductor. Further, examples of the material forming the light-emitting layer of the red light-emitting device include one using an AlGaInP-based compound semiconductor. Examples of the III-V compound semiconductor include a GaN-based compound semiconductor (including an AlGaN mixed crystal, an AlGaInN mixed crystal, and a GaInN mixed crystal), a GaInNAs-based compound semiconductor (including a GaInAs mixed crystal and a GaNAs mixed crystal), an AlGaInP-based compound, an AlAs-based compound semiconductor, an AlGaInAs-based compound semiconductor, an AlGaAs-based compound semiconductor, a GaInAs-based compound semiconductor, a GaInAsP-based compound semiconductor, a GaInP-based compound semiconductor, a GaP-based compound semiconductor, an InP-based compound semiconductor, an InN-based compound semiconductor, and an AlN-based compound semiconductor.

The light-emitting layer has a stacked structure of a first compound semiconductor layer having a first conductivity type, an active layer, and a second compound semiconductor layer having a second conductivity type different from the first conductivity type. Note that in the case where the first conductivity type is an n-type, the second conductivity type is a p-type. In the case where the first conductivity type is a p-type, the second conductivity type is an n-type. Examples of the n-type impurity to be added to the compound semiconductor layer include silicon (Si), selenium (Se), germanium (Ge), tin (Sn), carbon (C), and titanium (Ti). Examples of the p-type impurity include zinc (Zn), magnesium (Mg), beryllium (Be), cadmium (Cd), calcium (Ca), barium (Ba), and oxygen (O). The active layer may include a single compound semiconductor layer, or may have single quantum well structure (SQW structure) or a multiple quantum well structure (MQW structure). Examples of forming (depositing) various compound semiconductor layers including the active layer include a metal-organic chemical vapor deposition (MOCVD method, MOVPE method), a metal-organic molecular beam epitaxy method (MOMBE method), a hydride vapor phase epitaxy method (HVPE method) in which halogen contributes to transport or reaction, a plasma-assisted physical vapor deposition (PPD method), an atomic layer deposition method (ALD method, atomic layer deposition method), and a migration-enhanced epitaxy method (Migration-Enhanced. Epitaxy, MEE method). In order to produce the red light-emitting device, the green light-emitting device, and the blue light-emitting device, it only needs to appropriately select the above-mentioned compound semiconductor and the composition thereof.

In the case where the first conductivity type is an n-type and the second conductivity type is a p-type, the first electrode is an n-side electrode and the second electrode is a p-side electrode. Meanwhile, in the case where the first conductivity type is a p-type and the second conductivity type is an n-type, the first electrode is a p-side electrode and the second electrode is an n-side electrode. Here, examples of the p-side electrode include Au/AuZn, Au/Pt/Ti(/Au)/AuZn, Au/Pt/TiW(/Ti) (/Au)/AuZn, Au/AuPd, Au/Pt/Ti(/Au)/AuPd, Au/Pt/TiW(/Ti) (/Au)/AuPd, Au/Pt/Ti, Au/Pt/TiW(/Ti), Au/Pt/TiW/Pd/TiW(/Ti), Ti/Cu, Pt, Ni, Ag, and Ge. Further, examples of the n-side electrode include Au/Ni/AuGe, Au/Pt/Ti(/Au)/Ni/AuGe, AuGe/Pd, Au/Pt/TiW(/Ti)/Ni/AuGe, and Ti. Note that the layer that is further to the front than "/" is located electrically more distant from the active layer. Alternatively, the second electrode may be formed of a transparent conductive material such as ITO, IZO, ZnO:Al, and ZnO:B. In the case where a layer formed of the transparent conductive material is used as a current diffusion layer and the second electrode is an n-side electrode, the metal stacked structure mentions in the case of using the second electrode of the p-side electrode may be combined. The second portion of the first electrode may include a pad portion (first pad portion), a second pad portion may be formed on the second electrode (surface), and a third pad portion may be formed on the second portion (surface) of the first electrode. In these cases, the third pad portion is included in the second portion of the first electrode, and the second pad portion is included in the second electrode. It is desirable that the pad portion has a single layer structure or a multilayer structure including at least one type of metal selected from the group consisting of Ti (titanium), aluminum (Al), Pt (platinum), Au (gold), and Ni (nickel). Alternatively, these pad portions may have a multilayer structure exemplified by a multilayer configuration of Ti/Pt/Au and a multilayer configuration of Ti/Au.

Examples of the light-emitting device production substrate for producing the light-emitting device include a GaAs substrate, a GaP substrate, an AlN substrate, an AlP substrate, an InN substrate, an InP substrate, an AlGaInN substrate, an AlGaN substrate, an AlInN substrate, a GaInN substrate, an AlGaInP substrate, an AlGaP substrate, an AlInP substrate, a GaInP substrate, a ZnS substrate, a sapphire substrate, a SiC substrate, an alumina substrate, a ZnO substrate, a LiMgO substrate, a LiGaO$_2$ substrate, a MgAl$_2$O$_4$ substrate, a Si substrate, a Ge substrate, and one obtained by forming an underlayer or a buffer layer on the surface (main surface) of these substrates. Note that in order to produce the red light-emitting device, the green light-emitting device, and the blue light-emitting device, it only needs to appropriately select one of these substrates.

In the light-emitting device, a light-shielding film may be formed in a desired region of the light-emitting device so that an undesired region is not irradiated with the light output from the light-emitting device. Examples of the material forming the light-shielding film include a material capable of blocking light or a material capable of reflecting visible light such as titanium (Ti), chromium (Cr), tungsten (W), tantalum (Ta), aluminum (Al), MoSi$_2$, gold (Au), copper (Cu), and nickel (Ni).

The material forming an insulating layer, a second insulating layer, and a third insulating layer to be described later include a silicon oxide (SiO$_X$), a silicon nitride (SiN$_Y$), a silicon oxynitride (SiO$_X$N$_Y$), a tantalum oxide (Ta$_2$O$_5$), a zirconium oxide (ZrO$_2$), an aluminum oxide (Al$_2$O$_3$), an aluminum nitride (AlN), a titanium oxide (TiO$_2$), a magnesium oxide (MgO), a chromium oxide (CrO$_x$), a vanadium oxide (VO$_x$), a tantalum nitride (TaN), a dielectric multilayer film (e.g., a dielectric multilayer film having a structure in which a low refractive index thin film such as SiO$_2$ and a high refractive index thin film such as TiO$_2$ and Ta$_2$O$_5$ are alternately stacked), and a stacked structure of SiO$_2$ layer/Si layer (the SiO$_2$ layer is a lower layer and the Si layer is an upper layer). The formation of the insulating layer can be performed by various physical vapor deposition methods (PVD methods) and various chemical vapor deposition methods (CVD methods) depending on the material to be used. Further, the patterning can be performed on the basis of the combination of a lithography technology and an etching technology.

Depending on the use and function of the display apparatus, the specification required for the display apparatus, and the like, the number, type, mounting (arrangement), interval, and the like of light-emitting device assemblies (specifically, light-emitting devices) constituting the display apparatus are determined. When the display apparatus includes the red light-emitting device (red light emitting sub-pixel), the green light-emitting device (green light-emitting sub-pixel), and the blue light-emitting device (blue light emitting sub-pixel), a display apparatus of color display can be obtained. In the case where the display apparatus includes a display apparatus of color display, one pixel in the display apparatus includes a combination (light-emitting unit) of the red light-emitting device, the green light-emitting device, and the blue light-emitting device. Further, each light-emitting device constitutes a sub-pixel. Further, a plurality of light-emitting device assemblies (a plurality of pixels) are arranged in a two-dimensional matrix pattern in a first direction and a second direction orthogonal to the first direction. When the number of red light-emitting devices constituting the light-emitting unit is $N_R$, the number of green light-emitting devices constituting the light-emitting unit is $N_G$, and the number of blue light-emitting devices constituting the light-emitting unit is $N_B$, $N_R$ may be an integer of 1 or 2 or more, $N_G$ may be an integer of 1 or 2 or more, and $N_B$ may be an integer of 1 or 2 or more. The values of $N_R$, $N_G$, and $N_B$ may be equal to or different from each other. In the case where the values of $N_R$, $N_G$, and $N_B$ are each an integer of 2 or more, the light-emitting device assemblies may be connected in series or in parallel in one light-emitting unit. Examples of the combination of the values of ($N_R$, NGr, and $N_B$) include, but not limited to, (1, 1, 1), (1, 2, 1), (2, 2, 2), and (2, 4, 2). In the case where one pixel includes three types of sub-pixels, examples of the arrangement of the three kinds of sub-pixels include delta arrangement, stripe arrangement, diagonal arrangement, and rectangle arrangement. Further, it only needs to cause the light-emitting device to be driven with a constant current on the basis of a PWM driving method. Alternatively, by preparing three panels, i.e., a first panel that includes a light-emitting unit including the red light-emitting device, a second panel that includes a light-emitting unit including the green light-emitting device, and a third panel that includes a light-emitting unit including the blue light-emitting device, it can also be applied to a projector that collects light from the three panels by using, for example, a dichroic prism.

Examples of the base include a glass substrate, a quartz substrate, and a silicon substrate, the first connecting portion and the second connecting portion each formed of a copper foil or a copper plating layer being formed on the surface of the substrate, and a rigid printed wiring board and a flexible printed wiring board, the first connecting portion and the second connecting portion each formed of a copper foil or a copper plating layer being formed on the surface of the substrate. Note that in order to cure the adhesive layer by irradiating the part with energy ray, it only needs to provide a region for passing the energy ray therethrough (region transparent to the energy ray) in the rigid printed wiring board and the flexible printed wiring board. It only needs to use an existing method as the method of producing the base. The base corresponds to a mounting substrate. The configuration of the base material constituting the rigid printed board is essentially arbitrary, and examples thereof include combinations of paper/phenolic resin, paper/epoxy resin, glass cloth/epoxy resin, glass nonwoven fabric/epoxy resin, glass cloth/glass nonwoven fabric/epoxy resin, synthetic fiber/epoxy resin, glass cloth/polyimide resin, glass cloth/modified polyimide resin, glass cloth/epoxy modified polyimide resin, glass cloth/bismaleimide/triazine/epoxy resin, glass cloth/fluorine resin, glass cloth/PPO (polyphenylene oxide) resin, and glass cloth/PPE (polyphenylene ether) resin.

In the display apparatus, the first connecting portion is connected to first wirings, and the second connecting portion is connected to second wirings. Each of the plurality of first wirings has a band shape as a whole and extends in a first direction, and each of the plurality of second wirings has a band shape as a whole and extends in a second direction (e.g., direction orthogonal to the first direction) different from the first direction. Note that the wiring having a band shape as a whole may include a trunk line extending in a band shape and a plurality of branch lines extending from the trunk line. Alternatively, the first wiring may include a common wiring (common electrode), the second wiring may include a plurality of wirings, and each of the plurality of wirings may extend in one direction as a whole. Alternatively, the first wiring may include a plurality of wirings, each of the plurality of wirings may extend in one direction as a whole, and the second wiring may include a common wiring (common electrode).

Examples of the material forming the first wiring and the second wiring include various metals includes metal such as gold (Au), silver (Ag), copper (Cu), palladium (Pd), platinum (Pt), chromium (Cr), nickel (Ni), cobalt (Co), zirconium (Zr), aluminum (Al), tantalum (Ta), niobium (Nb), molybdenum (Mo), tungsten (W), titanium (Ti), iron (Fe), indium (In), zinc (Zn), and tin (Sn); an alloy (e.g., MoW) or compound (e.g., a nitride such as TiW; TiN and WN) containing such a metal element; a silicide such as $WSi_2$, $MoSi_2$, $TiSi_2$, and $TaSi_2$; conductive particles containing these metals; conductive particles of alloys containing these metals; a semiconductor such as silicon (Si); a carbon thin film such as diamond; and a conductive metal oxide such as ITO (indium-tin oxide), an indium oxide, and a zinc oxide. A stacked structure of layers containing these elements may be adopted. In addition, an organic material (conductive polymer) such as poly (3,4-ethylenedioxythiophene)/polystyrenesulfonic acid [PEDOT/PSS] may be used. Although depending on the material constituting the first wiring and the second wiring, examples of the method of forming these wirings include various physical vapor deposition methods (PVD methods) including a vacuum evaporation method such as an electron beam evaporation method and a hot filament evaporation method, a sputtering method, an ion plating method, a laser ablation method; various chemical vapor deposition methods (CVD methods) including a MOCVD method; a spin coating method; various printing methods such as a screen printing method, an inkjet printing method, an offset printing method, a metal mask printing method, and a gravure printing method; various coating methods such as an air doctor coater method, a blade coater method, a rod coater method, a knife coater method, a squeeze coater method, a reverse roll coater method, a transfer roll coater method, a gravure coater method, a kiss coater method, a cast coater method, a spray coater method, a slit orifice coater method, a calendar coater method, and a dipping method; a stamp method; a lift-off method; a shadow mask method; a plating method such as an electrolytic plating method, an electroless plating method, and a combination thereof; a lift-off method; a sol-gel method; and a combination of any of spraying methods and a patterning technology as necessary. Note that examples of the PVD method include (a) various vacuum deposition methods such as electron beam heating method, a resistance heating method, and flash evaporation, (b) a plasma deposition method, (c) various sputtering methods such as a bipolar sputtering method, a direct current sputtering method, a direct current magnetron sputtering method, a high frequency sputtering method, a magnetron sputtering method, an ion beam sputtering method, and a bias sputtering method, and (d) various ion plating methods such as a DC (direct current) method, an RF method, a multi-cathode method, an activation reaction method, an electric field evaporation method, a high frequency ion plating method, and a reactive ion plating method. The material forming the first wiring and the material forming the second wiring may be the same or differ. Further, by appropriately selecting the formation method, it is also possible to directly form the patterned first wiring and the patterned second wiring.

Embodiment 1

Figure 1A:
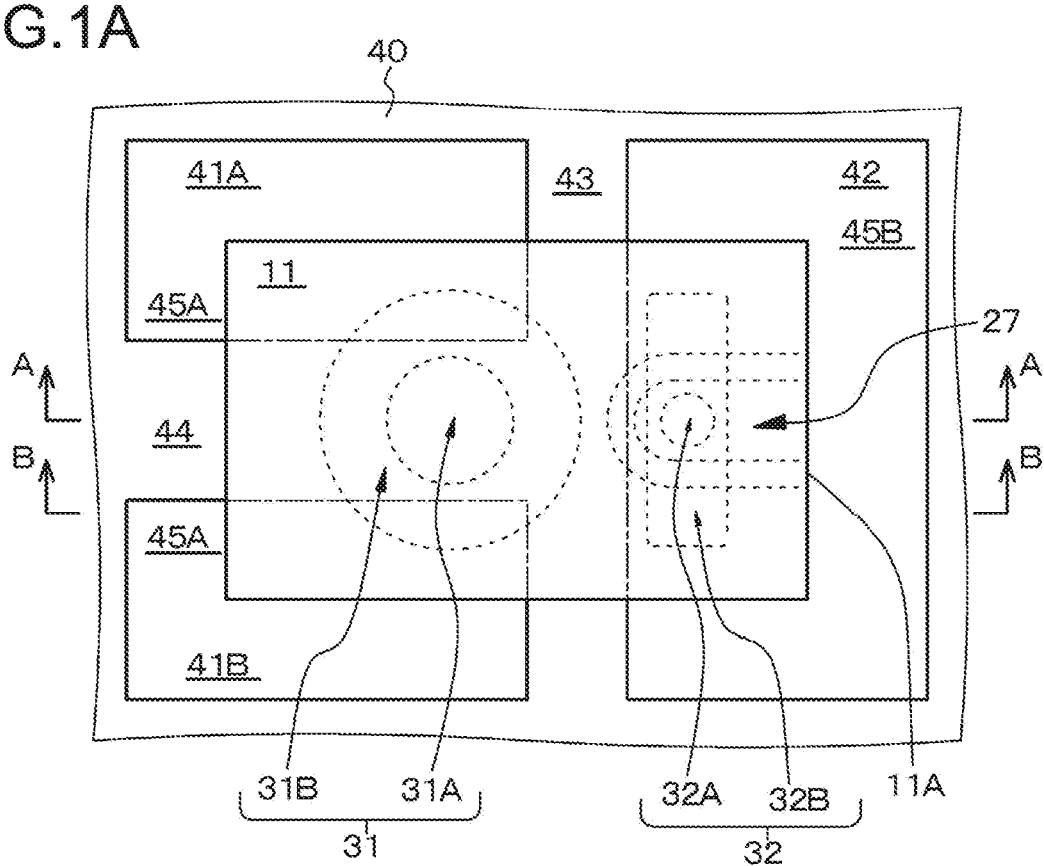
FIG. 1A is a schematic partial plan view of a light-emitting device assembly of an embodiment 1.
Figure 1B:
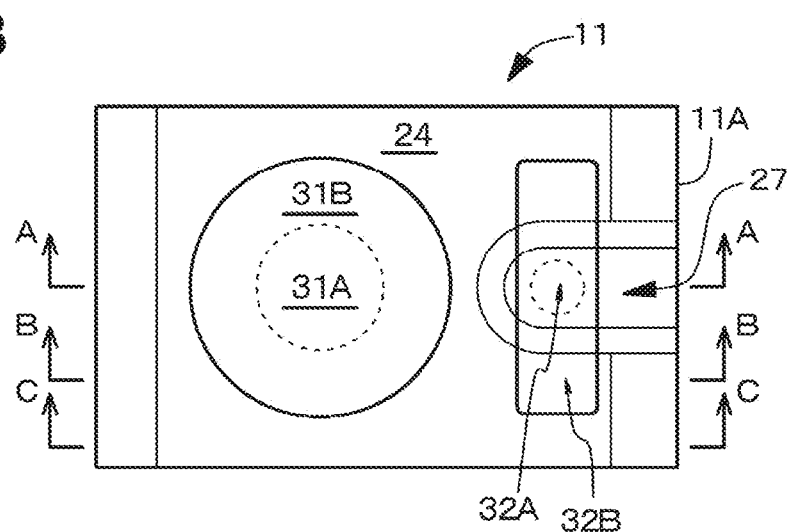
FIG. 1B is a schematic plan view of a light-emitting device constituting the light-emitting device assembly of the embodiment 1.
Figure 2A:
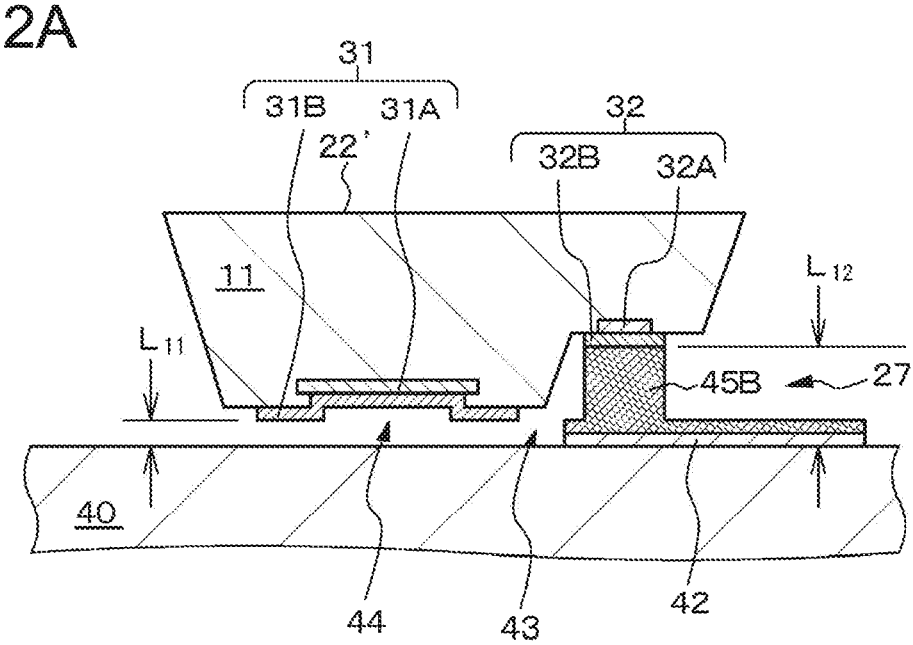
FIG. 2A and FIG. 2B are respectively schematic partial end views of the light-emitting device assembly of the embodiment 1 taken along the arrow A-A and the arrow B-B in FIG. 1A.
Figure 2B:
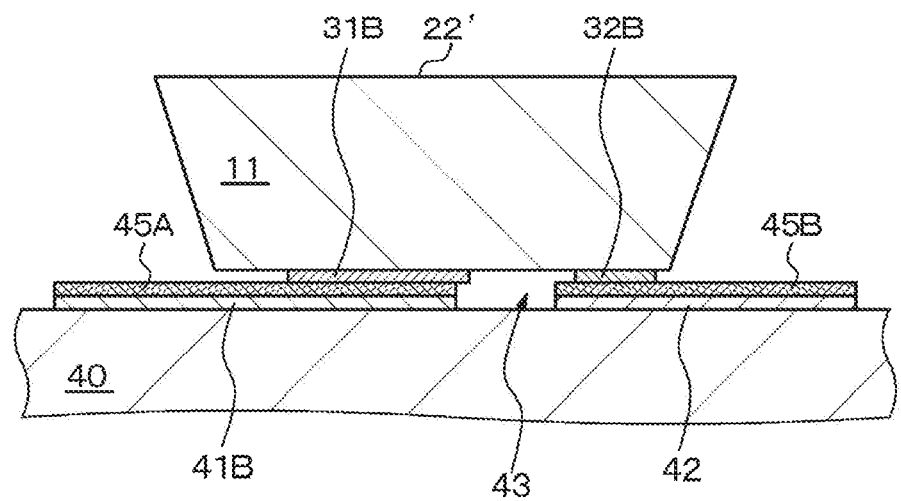

An embodiment 1 relates to a light-emitting device assembly according to the first aspect of the present disclosure, a method of producing the same, and a display apparatus according to the present disclosure. A schematic partial plan view of the light-emitting device assembly of the embodiment 1 is shown in FIG. 1A, and a schematic plan view of a light-emitting device constituting the light-emitting device assembly of the embodiment 1 is shown in FIG. 1B. Further, a schematic partial end view of the light-emitting device assembly of the embodiment 1 taken along the arrow A-A in FIG. 1A is shown in FIG. 2A, and a schematic partial end view of the light-emitting device assembly of the embodiment 1 taken along the arrow B-B in FIG. 1A is shown in FIG. 2B. Further, schematic partial end views of the light-emitting device constituting the light-emitting device assembly of the embodiment 1 taken along the arrow A-A, the arrow B-B, and the arrow C-C in FIG. 1B are respectively shown in FIG. 3A, FIG. 3B, and FIG. 3C.

Note that in the drawings, edge portions of a first connecting portion and a second connecting portion concealed by the light-emitting device are indicated by alternate long and short dash lines, and portions of a first electrode and a second electrode concealed by the light-emitting device and the like are indicated by dotted lines. Further, depending on the schematic end view of the light-emitting device, illustration of details of the components of the light-emitting device or a part thereof is omitted.

The light-emitting device assembly of the embodiment 1 includes a light-emitting device (specifically, light-emitting diode) 11 including a light-emitting layer 20, a first electrode 31, and a second electrode 32 electrically connected to the light-emitting layer 20; and a first connecting portion 41 and a second connecting portion 42 provided on a base 40, in which the first connecting portion 41 and the second connecting portion 42 are separated from each other by a separation portion 43, the base 40 being exposed from the separation portion 43, a wide portion 44 is provided on a first connecting portion side of the separation portion 43, the first electrode 31 includes a first portion 31A and a second portion 31B, the first portion 31A being in contact with the light-emitting layer 20, the second portion 31B of the first electrode 31 is connected to the first connecting portion 41, and the first portion 31A of the first electrode 31 extends from the second portion 31B of the first electrode 31.

The display apparatus of the embodiment 1 includes light-emitting device assemblies of the embodiment 1 or light-emitting device assemblies to be described in embodiments 2 to 4 to be described later arranged in a two-dimensional matrix pattern. The light-emitting device includes, for example, three types of light-emitting devices, i.e., a red light-emitting device, a green light-emitting device, and a blue light-emitting device. One pixel constituting the display apparatus includes, for example, one red light-emitting device, one green light-emitting device, and one blue light-emitting device. Specifically, $N_R=N_G=N_B=1$.

Further, an orthographic projection image of the first portion 31A of the first electrode 31 with respect to the base 40 and the wide portion 44 of the separation portion 43 overlap with each other at least in part. In the illustrated example, the orthographic projection image of the first portion 31A of the first electrode 31 with respect to the base 40 is included in the wide portion 44 of the separation portion 43. However, the wide portion 44 of the separation portion 43 may be included in the orthographic projection image of the first portion 31A of the first electrode 31 with respect to the base 40. Further, the first connecting portion 41 is divided by the wide portion 44 into two regions 41A and 41B. Here, a planar shape of the whole of the separation portion 43 and the wide portion 44 is a "T" shape, a horizontal bar of the "T" shape constitutes the separation portion 43 that separates the first connecting portion 41 and the second connecting portion 42 from each other, and a vertical bar of the "T" shape constitutes the wide portion 44 that divides the first connecting portion 41 into the two areas 41A and 41B. The width of the separation portion 43 may be wider than/the same as/narrower than the width of the wide portion 44. That is, the thickness of the horizontal bar of the "T" shape may be thicker than/the same as/thinner than the thickness of the vertical bar of the "T" shape. In the illustrated example, the width of the separation portion 43 is narrower than the width of the wide portion 44. That is, the thickness of the horizontal bar of the "T" shape is thinner than the thickness of the vertical bar of the "T" shape. The separation portion 43 and the wide portion 44 communicate with the outside. In addition, in the embodiment 1, the second portion 31B of the first electrode 31 extends from the first portion 31A and surrounds the first portion 31A while projecting toward the first connecting portion 41. The first portion 31A is in contact with the light-emitting layer 20. Further, the second portion 31B corresponds to the first pad portion. In the illustrated example, the planar shape of each of the first portion 31A and the second portion 31B is a circular shape. However, the present disclosure is not limited thereto, and the planar shape may be a square, a rectangle, a rounded square, a rounded rectangle, an ellipse, or the like.

In the embodiment 1, the first electrode 31 and the second electrode 32 are provided on the same side with respect to the light-emitting layer 20. Further, a communication unit (second communication unit 27) is provided in a part of the light-emitting device 11 in which the second electrode 32 is provided and around the part, the second electrode 32 communicating with the outside via the communication unit. Alternatively, when the shortest distance of space between the second portion 31B of the first electrode 31 and the base 40 is represented by $L_{11}$ and the shortest distance of space between the second electrode 32 and the base 40 is represented by $L_{12}$, a relationship of $L_{11}<L_{12}$ is satisfied (see FIG. 2A). Further, the second portion 31B of the first electrode 31 and the first connecting portion 41 are connected to each other via a first conductive unit 45A, and the second electrode 32 and the second connecting portion 42 are connected to each other via a second conductive unit 45B. In the illustrated example, the second communication unit 27 is provided on one side 11A of the light-emitting device 11, and a planar shape thereof is, for example, a semi-circle rectangular shape (shape obtained by combining two line segments and a semi-circle). As the values of $L_{11}$ and $L_{12}$, specifically, $L_{11}=0.5$ μm and $L_{12}=2$ μm, for example. However, the present disclosure is not limited to these values. Further, the size of the light-emitting device is, for example, not less than 5 μm and not more than 1 mm.

The light-emitting layer 20 has a stacked structure of a first compound semiconductor layer 21 having a first conductivity type (specifically, a p-type or an n-type), an active layer 23, and a second compound semiconductor layer 22 having a second conductivity type (specifically, an n-type or a p-type) different from the first conductivity type. Light emitted from the active layer 23 is emitted to the outside via the second compound semiconductor layer 22. The second communication unit 27 is formed in a part of the first compound semiconductor layer 21, the active layer 23, and the second compound semiconductor layer 22, and the second electrode 32 is formed in a part of the second compound semiconductor layer 22 exposed in the second communication unit 27. The second electrode 32 includes a first portion 32A and a second portion 32B. Further, the second portion 32B of the second electrode 32 is connected to the second connecting portion 42, and the first portion 32A of the second electrode 32 extends from the second portion 32B of the second electrode 32. The second portion 32B of the second electrode 32 surrounds the second portion 32B while projecting toward the second connecting portion 42. The first portion 32A of the second electrode 32 is in contact with the light-emitting layer 20 (specifically, the second compound semiconductor layer 22). The second portion 32B of the second electrode 32 corresponds to the second pad portion. The second communication unit 27 is provided in a part of the light-emitting device located at a part where the second portion 32B of the second electrode 32 is in contact with the first portion 32A and around the part.

The light-emitting layer 20 is covered by an insulating layer 24, except for a light output surface 22' of the second compound semiconductor layer 22. The insulating layer 24 extends on an edge portion of the first portion 31A of the first electrode 31. The second portion 31B of the first electrode 31 is formed on the first portion 31A of the first electrode and a part of the insulating layer 24. The insulating layer is formed of, for example, a silicon oxide ($SiO_X$) or a silicon nitride ($SiN_Y$).

The light-emitting device includes a red light-emitting device, a green light-emitting device, or a blue light-emitting device. The specific configurations of the red light-emitting device, the green light-emitting device, and the blue light-emitting device are, for example, as shown in the following Table 1 and Table 2.

That is, in the red light-emitting device, the light-emitting layer (stacked structure) 20 including the second compound semiconductor layer 22 having a p-conductivity type, the active layer 23, and the first compound semiconductor layer 21 having an n-conductivity type is formed of an AlGaInP-based compound semiconductor. As the light-emitting device production substrate (not shown) for producing the red light-emitting device, an n-GaAs substrate was used. The second compound semiconductor layer 22 is formed on the light-emitting device production substrate. The active layer 23 has a multiquantum well structure in which well layers each including a GaInP layer or an AlGaInP layer and barrier layers each including an AlGaInP layer having a different composition are stacked. Specifically, the barrier layers have four layers, and the well layers have three layers. Note that the conductivity type of the second compound semiconductor layer 22 may be an n-type, and the conductivity type of the first compound semiconductor layer 21 may be a p-type.

TABLE 1

Red light-emitting device

First compound semiconductor layer

| First cladding layer | n-AlInP: Si-doped |
| First guide layer | AlGaInP |
| Active layer | |

| Well layer/Barrier layer | GaInP/AlGaInP |
| Second compound semiconductor layer | |

| Second guide layer | AlGaInP |
| Second cladding layer | p-AlInP: Zn-doped |
| Contact layer | p-GaAs: Zn-doped |

In the green light-emitting device and the blue light-emitting device, the light-emitting layer (stacked structure) 20 including the second compound semiconductor layer 22 having an n-conductivity type, the active layer 23, and the first compound semiconductor layer 21 having a p-conductivity type is formed of a GaInN-based compound semiconductor. As the light-emitting device production substrate (not shown) for producing the green light-emitting device and the blue light-emitting device, an n-GaN substrate was used. The second compound semiconductor layer 22 is formed on the light-emitting device production substrate. The active layer 23 has a quantum well structure in which a well layer including an AlInGaN layer and a barrier layer including an AlInGaN layer having a different In composition are stacked. Alternatively, the active layer 23 has a quantum well structure in which a well layer including an InGaN layer and a barrier layer including a GaN layer are stacked. Note that the conductivity type of the second compound semiconductor layer 22 may be a p-type, and the conductivity type of the first compound semiconductor layer 21 may be an n-type.

TABLE 2

Green light-emitting device/Blue light-emitting device

First compound semiconductor layer

| Contact layer | p-GaN: Mg-doped |
| Second cladding layer | p-AlGaN: Mg-doped |
| Second guide layer | InGaN |
| Active layer | |

| Well layer/Barrier layer | InGaN/GaN |
| Second compound semiconductor layer | |

| First guide layer | InGaN |
| First cladding layer | n-AlInGaN: Si-doped |

The base 40 includes, for example, a glass substrate, the first connecting portion 41 and the second connecting portion 42 each formed of a copper foil or a copper plating layer being formed on the surface of the glass substrate. The first connecting portion 41 is connected to first wirings, and the second connecting portion 42 is connected to second wirings. Each of the plurality of first wirings has a band shape as a whole and extends in a first direction, and each of the plurality of second wirings has a band shape as a whole and extends in a second direction (e.g., direction orthogonal to the first direction) different from the first direction. Illustration of the first wiring and the second wiring is omitted. As the method of forming the base 40, a well-known method can be used.

Hereinafter, the method of producing the light-emitting device assembly of the embodiment 1 will be described with reference to FIG. 22A, FIG. 22B, FIG. 23A, FIG. 23B, FIG. 24A, FIG. 24B, FIG. 25A, and FIG. 25B, which are each a schematic partial end view of the light-emitting device and the like. FIG. 22A, FIG. 23A, FIG. 24A, and FIG. 25A are each a schematic partial end view similar to one taken along the arrow A-A in FIG. 1A, and FIG. 22B, FIG. 23B, FIG. 24B, and FIG. 25B are each a schematic partial end view similar to one taken along the arrow B-B in FIG. 1A. Note that the light-emitting device 11 can be produced on the basis of a well-known production method.

[Step-100]

Figure 3A:
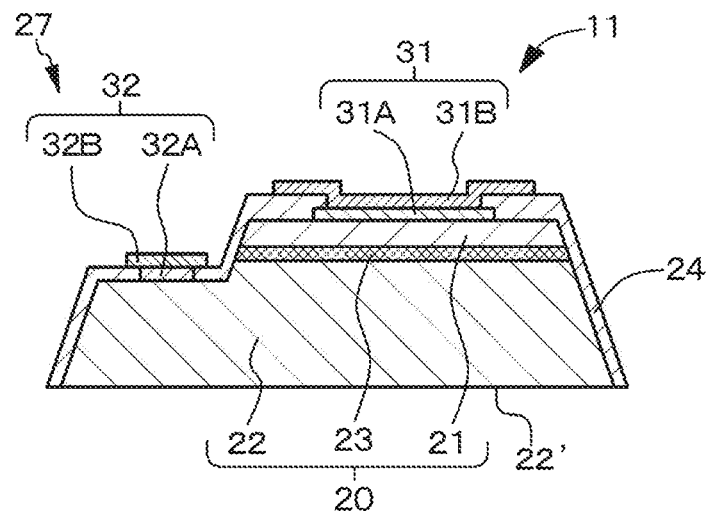
FIG. 3A, FIG. 3B, and FIG. 3C are respectively schematic partial end views of the light-emitting device constituting the light-emitting device assembly of the embodiment 1 taken along the arrow A-A, the arrow B-B, and the arrow C-C in FIG. 1B.
Figure 3B:
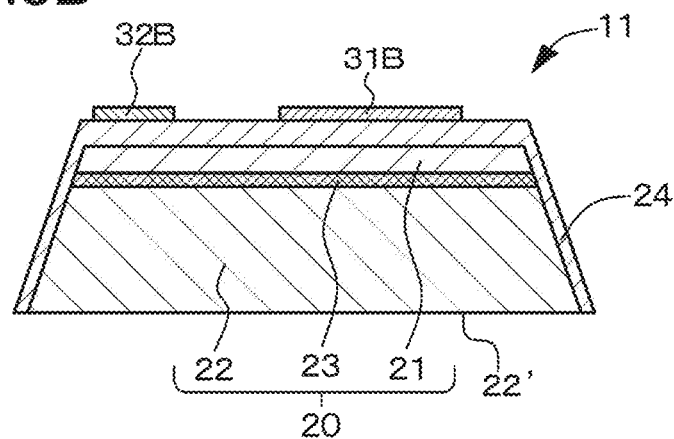
Figure 3C:
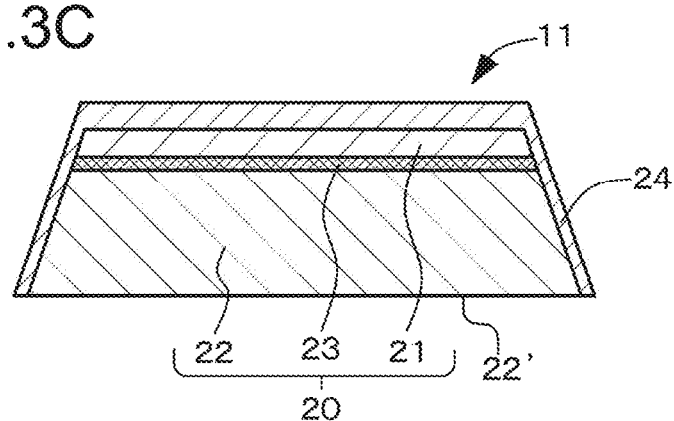

The light-emitting device 11 of the embodiment 1 having a structure whose schematic partial end view is shown in FIG. 3A, FIG. 3B, and FIG. 3C is prepared. Further, the base 40 is prepared, an uncured or semi-cured energy ray-curable adhesive layer 47 being formed (coated) on the surface of the base 40. The first connecting portion 41, the second connecting portion 42, and the surface of the base 40 on which the first connecting portion 41 and the second connecting portion 42 are not formed are covered by the adhesive layer 47.

[Step-110]

Figure 22A:
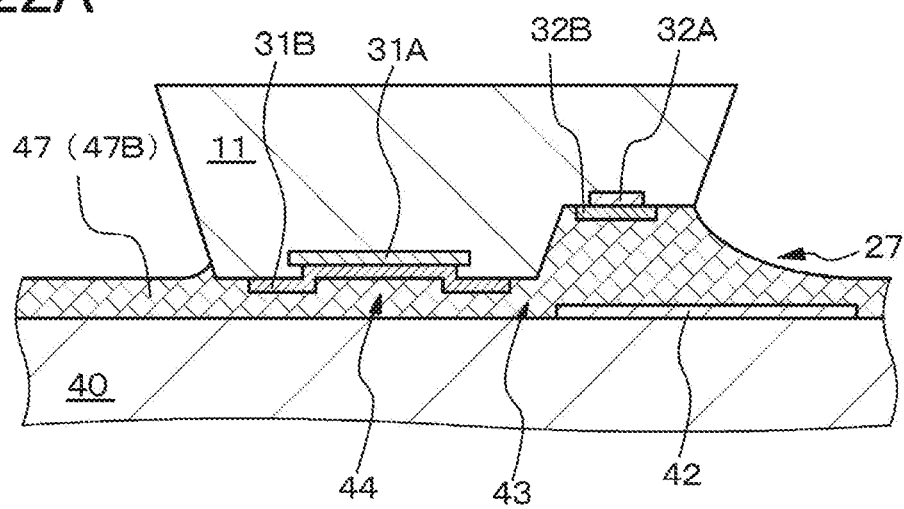
FIG. 22A and FIG. 22B are each a schematic partial end view of a light-emitting device and the like for describing a method of producing the light-emitting device assembly of the embodiment 1.
Figure 22B:
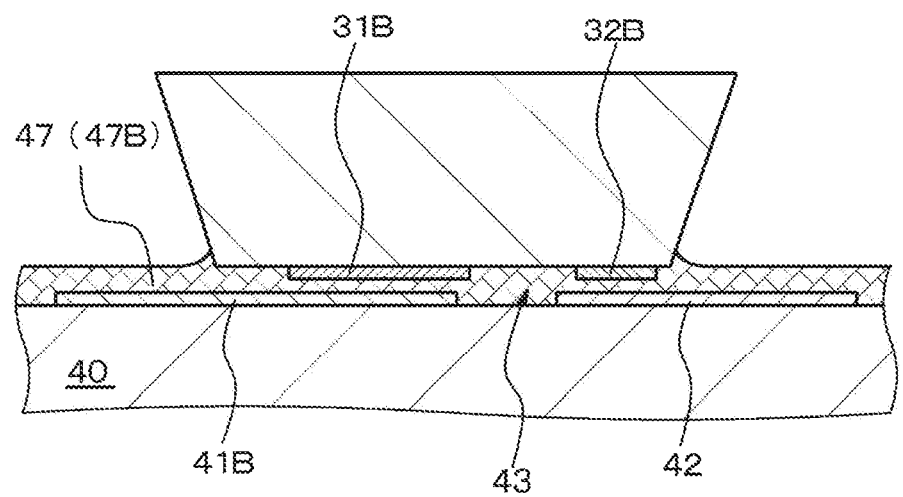

First, the light-emitting device 11 is disposed on the base 40 via a part 47B of the uncured or semi-cured energy ray-curable adhesive layer so that an orthographic projection image of the first portion 31A of the first electrode 31 with respect to the base 40 and the wide portion 44 of the separation portion 43 overlap with each other at least in part, the second portion 31B of the first electrode 31 faces the first connecting portion 41, and the light-emitting device 11 covers the separation portion 43. This state is shown in FIG. 22A and FIG. 22B. The part 47B of the uncured or semi-cured adhesive layer fills the surface of the light-emitting device 11 on a base side by the capillary phenomenon.

[Step-120]

Figure 23A:
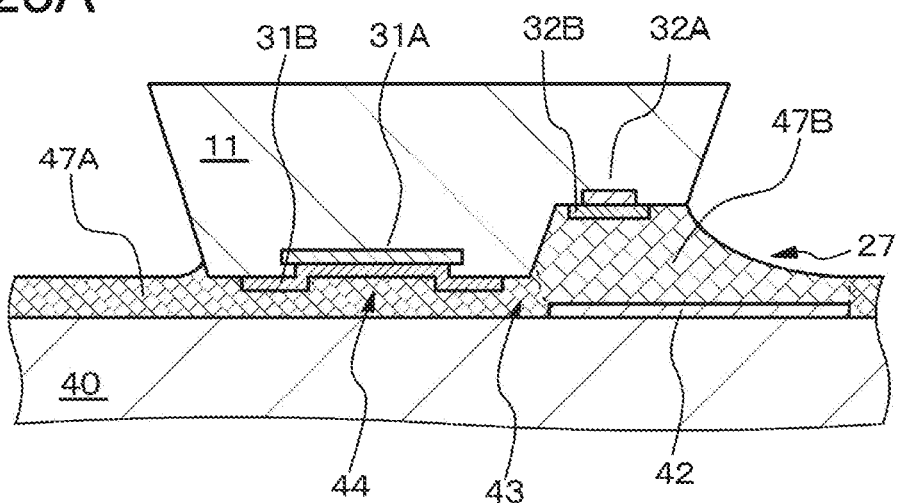
FIG. 23A and FIG. 23B are each a schematic partial end view of the light-emitting device and the like for describing the method of producing the light-emitting device assembly of the embodiment 1, subsequently to FIG. 22A and FIG. 22B.
Figure 23B:
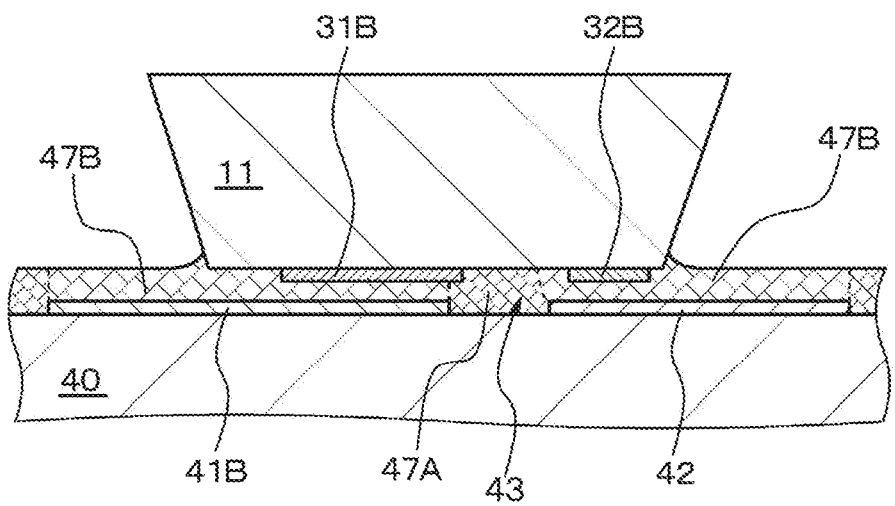
Figure 24A:
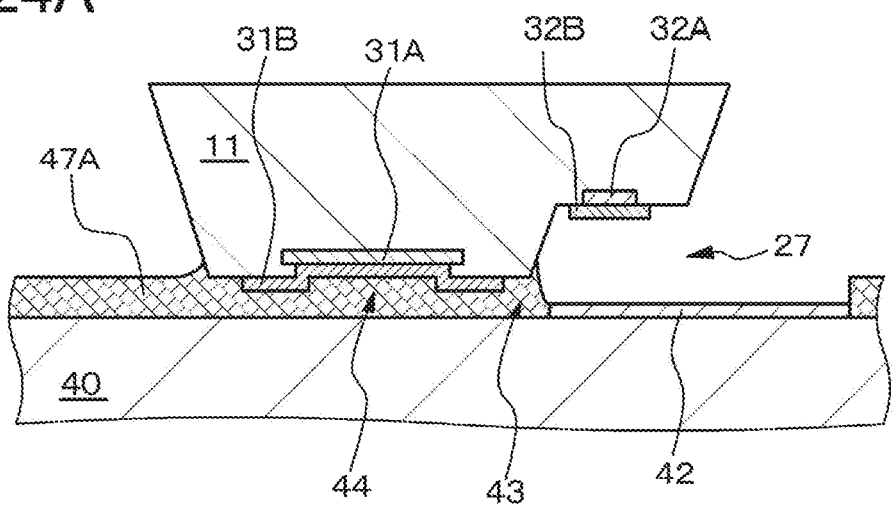
FIG. 24A and FIG. 24B are each a schematic partial end view of the light-emitting device and the like for describing the method of producing the light-emitting device assembly of the embodiment 1, subsequently to FIG. 23A and FIG. 23B.
Figure 24B:
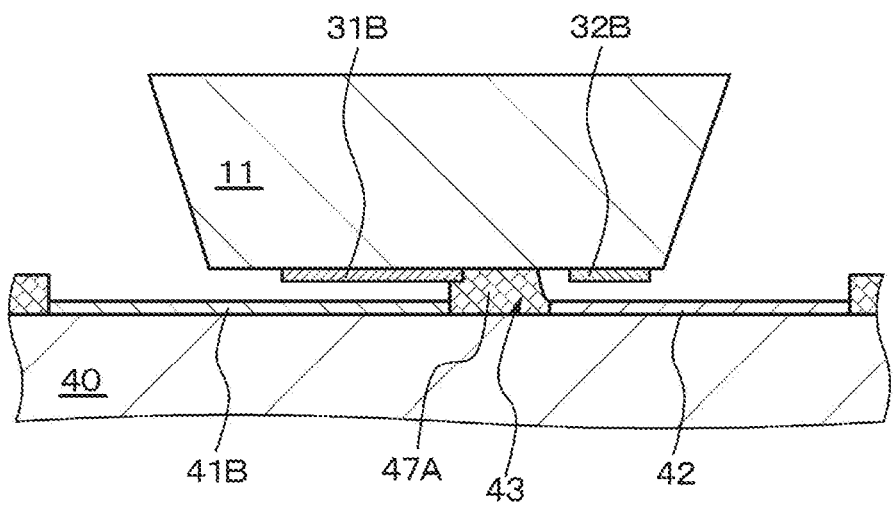

Next, an energy ray (specifically, ultraviolet rays) is applied to the base 40 from the side of the base 40 opposite to the side on which the light-emitting device 11 is disposed to cure a part of the adhesive layer that is not blocked by the first connecting portion 41 and the second connecting portion 42. The cured part of the adhesive layer is indicated by a reference symbol 47A. This state is shown in FIG. 23A and FIG. 23B. After that, the part 47B of the uncured or semi-cured adhesive layer is removed by using a solvent. This state is shown in FIG. 24A and FIG. 24B. The cured part 47A of the adhesive layer 47 is left on the separation portion 43 and the wide portion 44. The light-emitting device 11 is temporarily fixed on the base 40 by the cured part 47A of the adhesive layer 47. The part 47B of the uncured or semi-cured adhesive layer located around the second electrode 32 is easily and reliably removed via the second communication unit 27.

[Step-130]

Figure 25A:
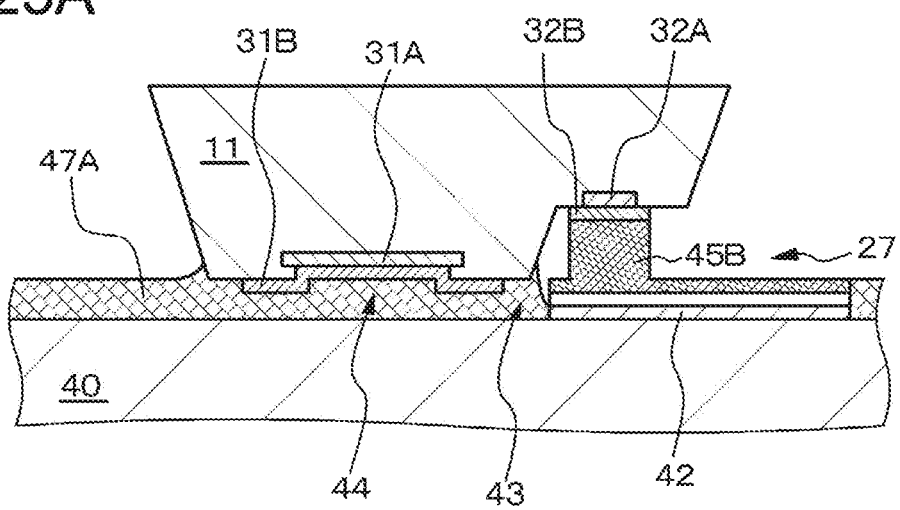
FIG. 25A and FIG. 25B are each a schematic partial end view of the light-emitting device and the like for describing the method of producing the light-emitting device assembly of the embodiment 1, subsequently to FIG. 24A and FIG. 24B.
Figure 25B:
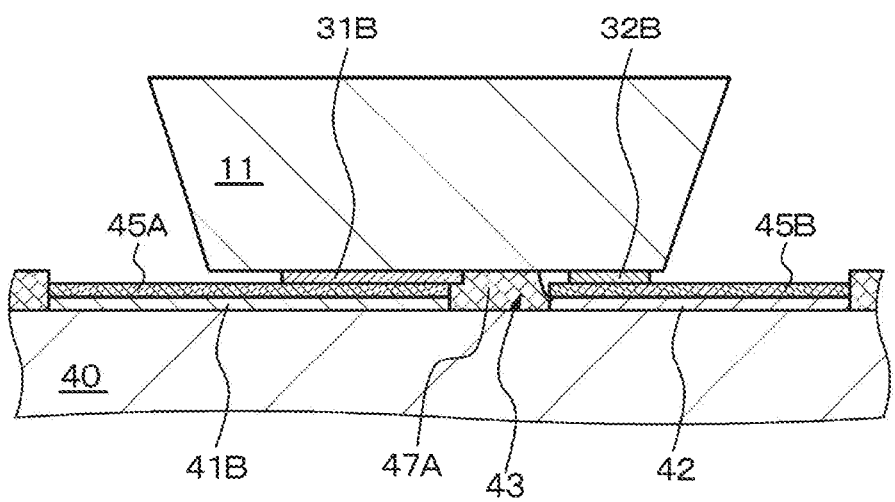

Then, on the basis of the plating method (specifically, copper plating by an electrolytic plating method), the second portion 31B of the first electrode 31 and the first connecting portion 41 are connected to each other, and the second portion 32B of the second electrode 32 and the second connecting portion 42 are connected to each other. The first connecting portion 41 and the second connecting portion 42 each include a copper layer. This state is shown in FIG. 25A and FIG. 25B. In a region in which no plating layer should be formed, it only needs to form a resist mask layer in advance as necessary. In this way, the second portion 31B of the first electrode 31 and the first connecting portion 41 are connected to each other via the first conductive unit 45A, and the second electrode 32 and the second connecting portion 42 are connected to each other via the second conductive unit 45B. The light-emitting device 11 is fixed to the first connecting portion 41 and the second connecting portion 42 by the first conductive unit 45A and the second conductive unit 45B.

[Step-140]

After that, the cured part 47A of the adhesive layer is removed by using a solvent via the separation portion 43 (specifically, in the embodiment 1, via the separation portion 43 and the wide portion 44). Since the separation portion 43 and the wide portion 44 are formed, it is possible to easily and reliably remove the cured part 47A of the adhesive layer. In this way, it is possible to achieve the structure shown in FIG. 2A and FIG. 2B.

In the light-emitting device assembly of the embodiment 1, the first connecting portion and the second connecting portion are separated from each other by the separation portion from which the base is exposed. That is, no resin for temporary fixation remains in the separation portion. Therefore, a problem that the resin layer for the temporary fixation is peeled off when the light-emitting device is used for a long time is not caused. Also in the method of producing the light-emitting device assembly of the embodiment 1, since the part of the cured adhesive layer is finally removed via the separation portion, the problem that the resin layer for the temporary fixation is peeled off when the light-emitting device is used for a long time is not caused.

Figure 4:
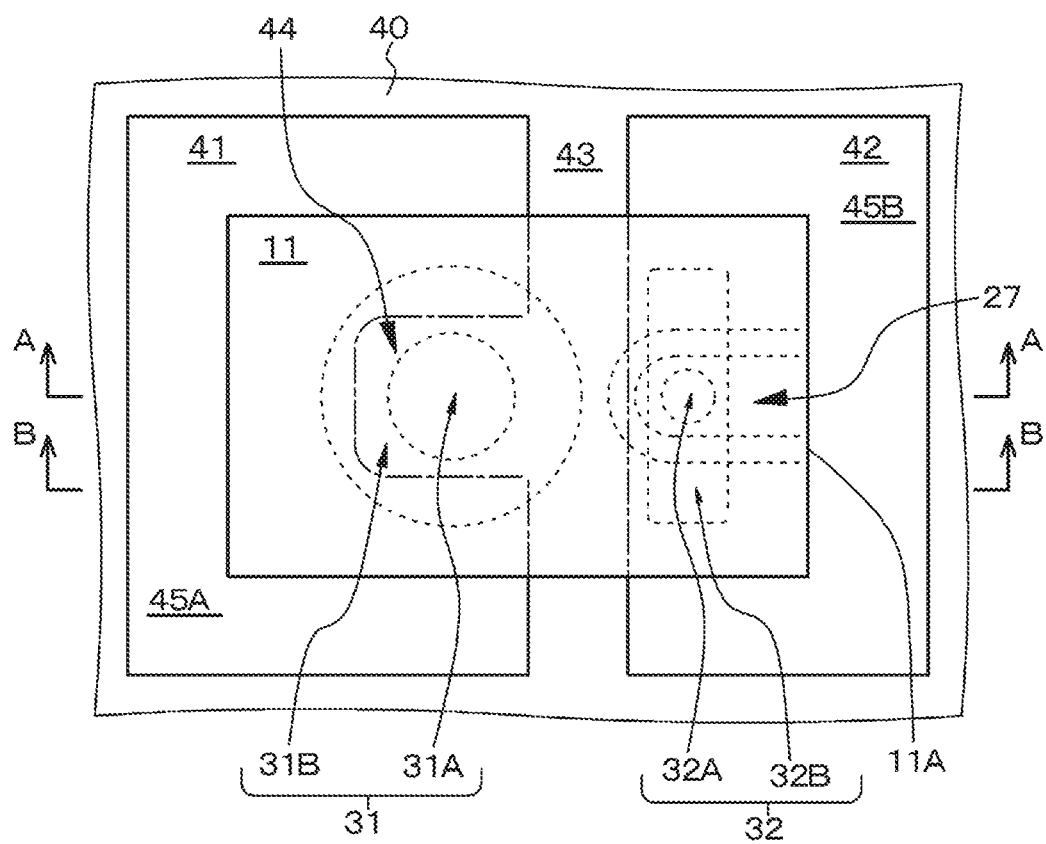
FIG. 4 is a schematic partial plan view of a modified example of the light-emitting device assembly of the embodiment 1.
Figure 5A:
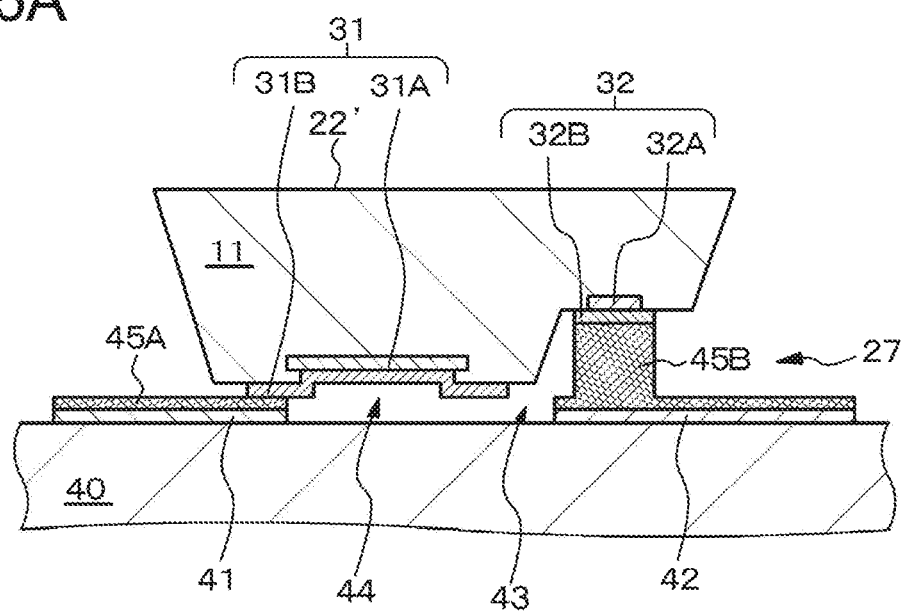
FIG. 5A and FIG. 5B are respectively schematic partial end views of the modified example of the light-emitting device assembly of the embodiment 1 taken along the arrow A-A and the arrow B-B in FIG. 4.
Figure 5B:
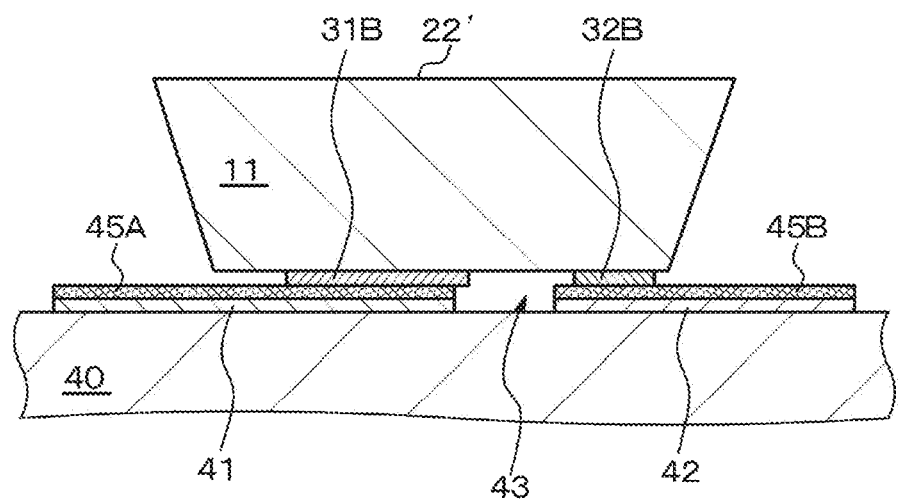

A modified example of the light-emitting device assembly of the embodiment 1 is shown in FIG. 4, FIG. 5A, and FIG. 5B. Note that FIG. 4 is a schematic partial plan view of a modified example of the light-emitting device assembly of the embodiment 1, FIG. 5A is a schematic partial end view of the modified example of the light-emitting device assembly of the embodiment 1 taken along the arrow A-A in FIG. 4, and FIG. 5B is a schematic partial end view of the modified example of the light-emitting device assembly of the embodiment 1 taken along the arrow B-B in FIG. 4. In the modified example of the light-emitting device assembly of the embodiment 1 shown in FIG. 4, FIG. 5A, and FIG. 5B, the wide portion 44 does not communicate with the outside. That is, the first connecting portion 41 is not divided into two regions by the wide portion 44.

Embodiment 2

Figure 6A:
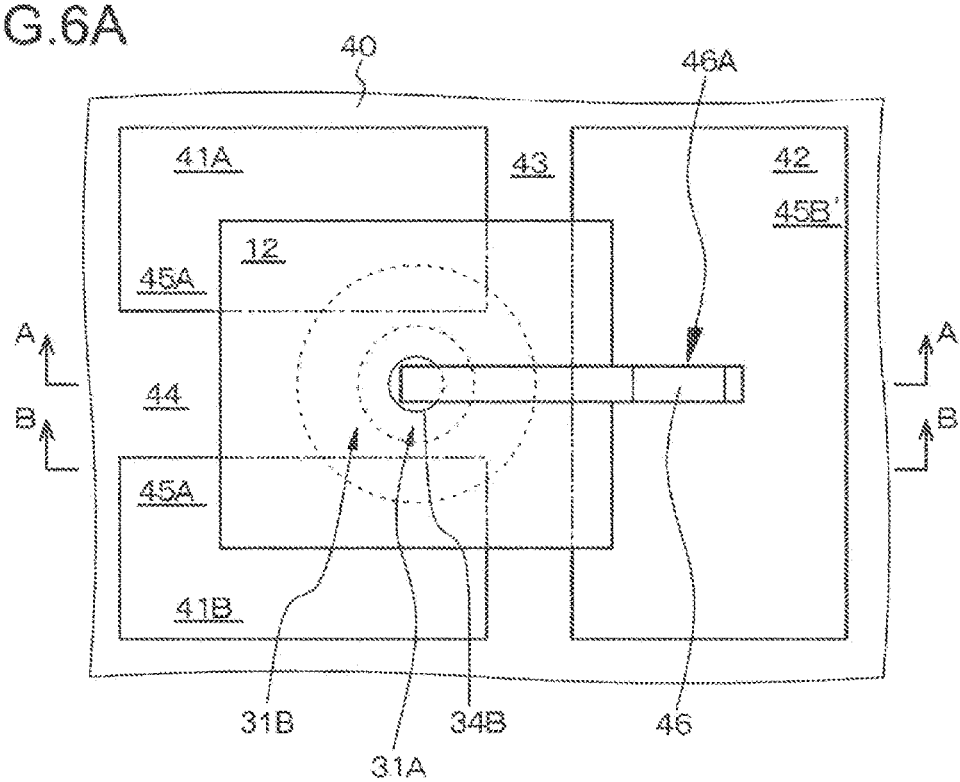
FIG. 6A is a schematic partial plan view of a light-emitting device assembly of an embodiment 2.
Figure 6B:
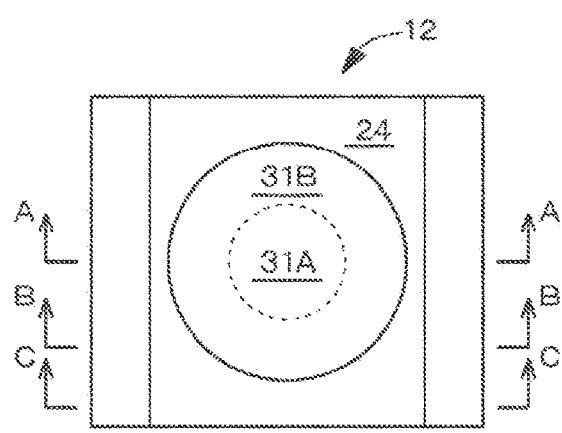
FIG. 6B is a schematic plan view of a light-emitting device constituting the light-emitting device assembly of the embodiment 2.
Figure 7A:
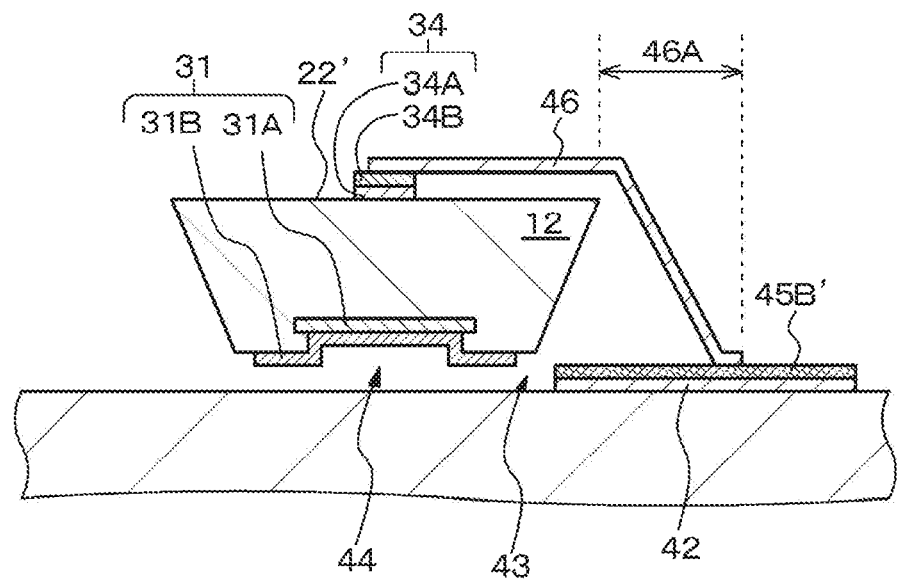
FIG. 7A and FIG. 7B are respectively schematic partial end views of the light-emitting device assembly of the embodiment 2 taken along the arrows A-A and the arrow B-B in FIG. 6A.
Figure 7B:
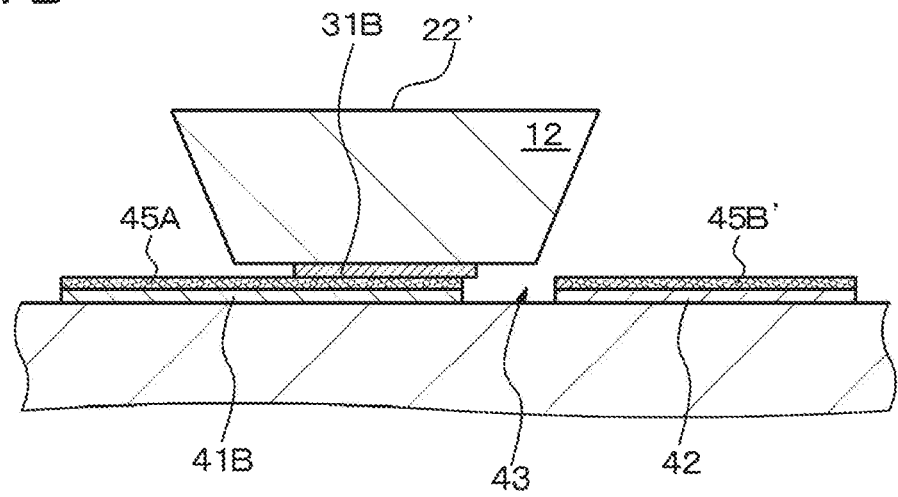

An embodiment 2 is an alternative of the embodiment 1. A schematic partial plan view of the light-emitting device assembly of the embodiment 2 is shown in FIG. 6A, and a schematic plan view of a light-emitting device constituting the light-emitting device assembly of the embodiment 2 is shown in FIG. 6B. Further, a schematic partial end view of the light-emitting device assembly of the embodiment 2 taken along the arrow A-A in FIG. 6A is shown in FIG. 7A, and a schematic partial end view of the light-emitting device assembly of the embodiment 2 taken along the arrow B-B in FIG. 6A is shown in FIG. 7B. Further, schematic partial end views of the light-emitting device constituting the light-emitting device assembly of the embodiment 2 taken along the arrow A-A, the arrow B-B, and the arrow C-C in FIG. 6B are respectively shown in FIG. 8A, FIG. 8B, and FIG. 8C.

In the light-emitting device assembly of the embodiment 2, a second electrode 34 is provided on the opposite side of the first electrode 31 with respect to the light-emitting layer 20, and the second electrode 34 and the second connecting portion 42 are connected to each other via a conductor layer 46. Further, an orthographic projection image of a part 46A of the conductor layer 46 that does not overlap with a light-emitting device (light-emitting diode) 12 with respect to the second connecting portion 42 is included in the second connecting portion 42. The second electrode 34 includes a first portion 34A of the second electrode 34 provided on the light output surface 22' of the second compound semiconductor layer 22, and a second portion 34B (corresponding to the second pad portion) of the second electrode 34 provided on the first portion 34A of the second electrode 34.

Hereinafter, the method of producing the light-emitting device assembly of the embodiment 2 will be described with reference to FIG. 26A, FIG. 26B, FIG. 27A, FIG. 27B, FIG. 28A, FIG. 28B, FIG. 29A, and FIG. 29B, which are each a schematic partial end view of the light-emitting device and the like. FIG. 26A, FIG. 27A, FIG. 28A, and FIG. 29A are each a schematic partial end view similar to one taken along the arrow A-A in FIG. 6A, and FIG. 26B, FIG. 27B, FIG. 28B, and FIG. 29B are each a schematic partial end view similar to one taken along the arrow B-B in FIG. 6A. Note that the light-emitting device 12 can be produced on the basis of a well-known production method.

[Step-200]

Figure 8A:
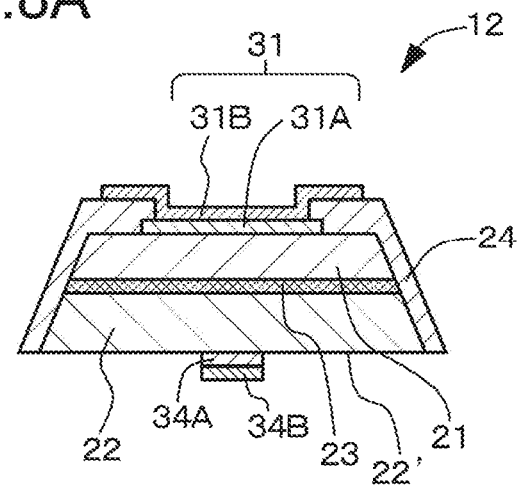
FIG. 8A, FIG. 8B, and FIG. 8C are respectively schematic partial end views of the light-emitting device constituting the light-emitting device assembly of the embodiment 2 taken along the arrow A-A, the arrow B-B, and the arrow C-C in FIG. 6B.
Figure 8B:
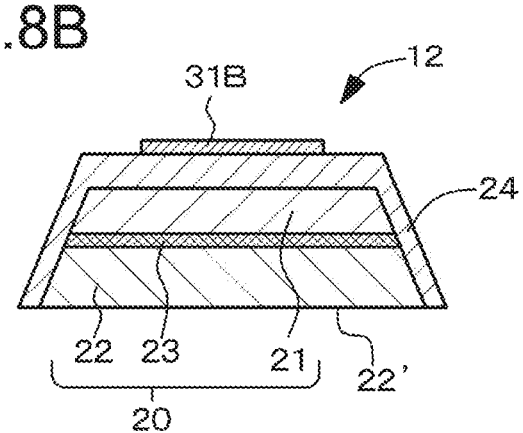
Figure 8C:
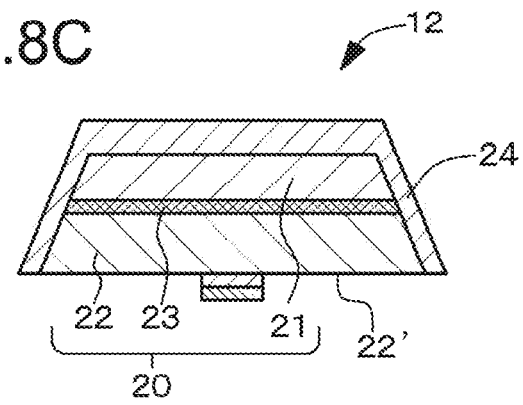

The light-emitting device 12 of the embodiment 2 having a structure whose schematic partial end view is shown in FIG. 8A, FIG. 8B, and FIG. 8C is prepared. Further, similarly to the embodiment 1, the base 40 is prepared, the uncured or semi-cured energy ray-curable adhesive layer 47 being formed on the surface of the base 40.

[Step-210]

First, similarly to [Step-110] of the embodiment 1, the light-emitting device 12 is disposed on the base 40 via the part 47B of the uncured or semi-cured energy ray-curable adhesive layer so that an orthographic projection image of the first portion 31A of the first electrode 31 with respect to the base 40 and the wide portion 44 of the separation portion 43 overlap with each other at least in part, the second portion 31B of the first electrode 31 faces the first connecting portion 41, and the light-emitting device 12 covers the separation portion 43. This state is shown in FIG. 26A and FIG. 26B.

[Step-220]

Next, similarly to [Step-120] of the embodiment 1, an energy ray (specifically, ultraviolet rays) is applied to the base 40 from the side of the base 40 opposite to the side on which the light-emitting device 12 is disposed to cure a part of the adhesive layer that is not blocked by the first connecting portion 41 and the second connecting portion 42. This state is shown in FIG. 27A and FIG. 27B. After that, the part 47B of the uncured or semi-cured adhesive layer is removed by using a solvent. This state is shown in FIG. 28A and FIG. 28B. The cured part 47A of the adhesive layer 47 is left on the separation portion 43 and the wide portion 44. Further, the light-emitting device 12 is temporarily fixed on the base 40 by the cured part 47A of the adhesive layer 47.

[Step-230]

Then, similarly to [Step-130] of the embodiment 1, on the basis of the plating method, the second portion 31B of the first electrode 31 and the first connecting portion 41 are connected to each other. This state is shown in FIG. 29A and FIG. 29B. Note that a plating layer 45B' is formed on the second connecting portion 42.

[Step-240]

Next, in order to form the conductor layer 46, a plating resist layer is formed on the entire surface on the basis of a well-known method. Then, similarly to [Step-130] of the embodiment 1, after forming, on the basis of the plating method, the conductor layer 46 that connects the second portion 34B of the second electrode 34 and the second connecting portion 42 to each other, the plating resist layer is removed. In this way, the second portion 31B of the first electrode 31 and the first connecting portion 41 are connected to each other via the first conductive unit 45A, and the second electrode 34 and the second connecting portion 42 are connected to each other via the conductor layer 46. The light-emitting device 12 is fixed to the first connecting portion 41 and the second connecting portion 42 by the first conductive unit 45A and the conductor layer 46.

[Step-250]

After that, the cured part 47A of the adhesive layer is removed by using a solvent via the separation portion 43 (specifically, in the embodiment 2, via the separation portion 43 and the wide portion 44). Since the separation portion 43 and the wide portion 44 are formed, it is possible to easily and reliably remove the cured part 47A of the adhesive layer. In this way, it is possible to achieve the structure shown in FIG. 7A and FIG. 7B.

Figure 9:
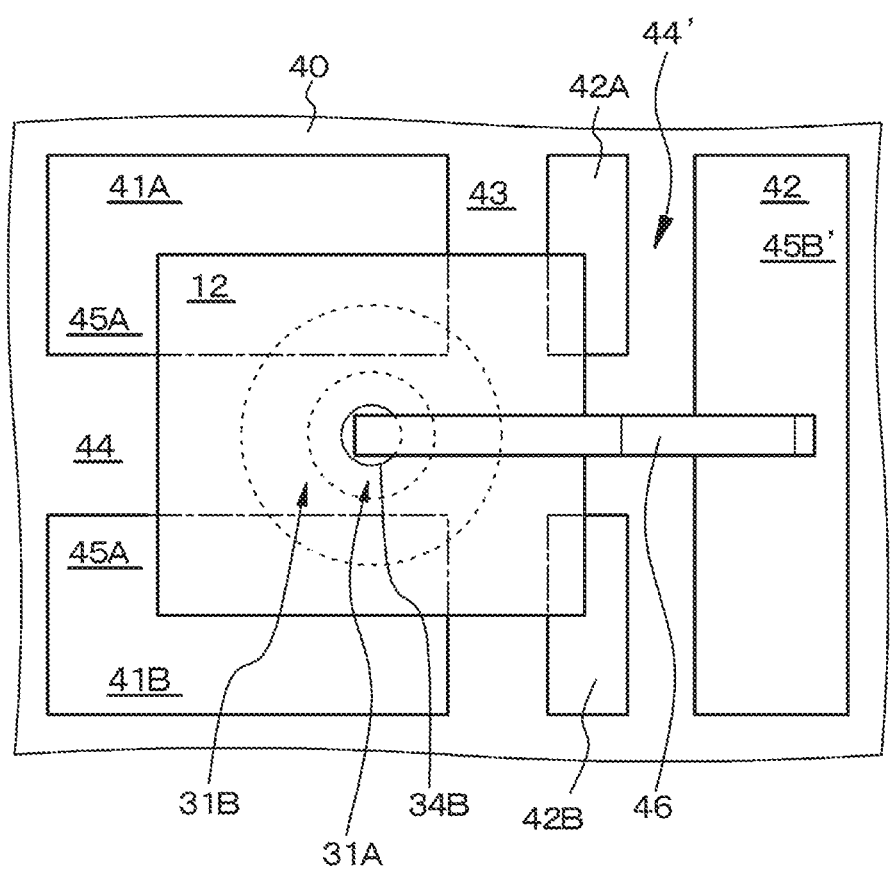
FIG. 9 is a schematic partial plan view of a modified example of the light-emitting device assembly of the embodiment 2.

A schematic partial plan view of a modified example of the light-emitting device assembly of the embodiment 2 is shown in FIG. 9. In this modified example, a second wide portion 44' facing the wide portion 44 is provided on a second connecting portion side of the separation portion 43, and the second connecting portion 42 is divided into at least two regions (specifically, regions 42, 42A, and 42B in the illustrated example) by the second wide portion 44'. By adopting such a structure, it is possible to more reliably remove the cured part 47A of the adhesive layer.

Embodiment 3

Figure 10:
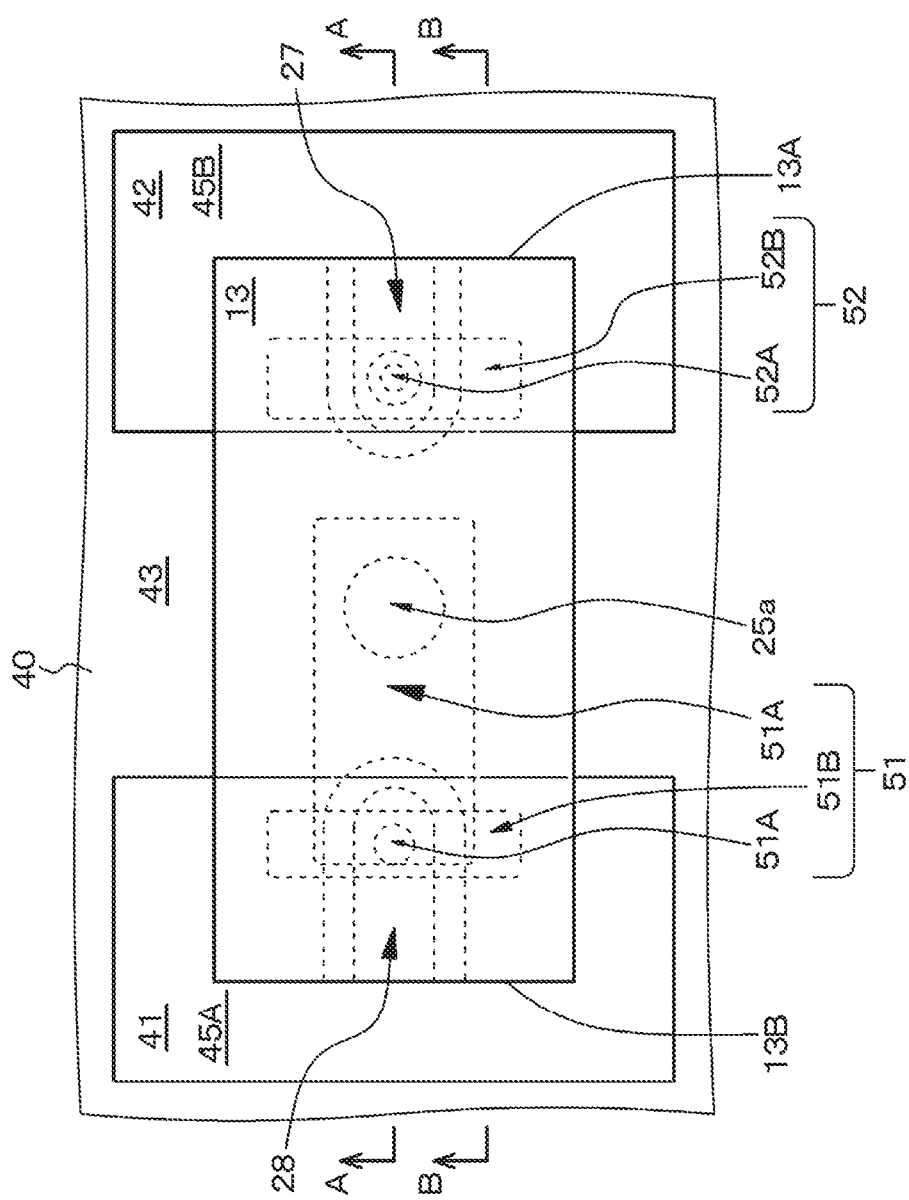
FIG. 10 is a schematic partial plan view of a light-emitting device assembly of an embodiment 3.
Figure 11A:
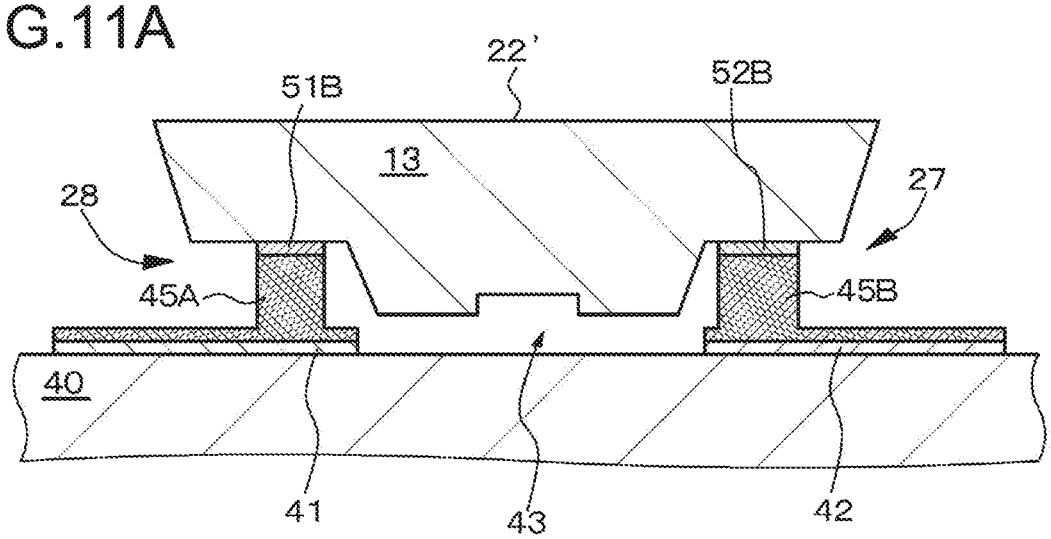
FIG. 11A is a schematic partial end view of the light-emitting device assembly of the embodiment 3 taken along the arrow A-A in FIG. 10.
Figure 11B:
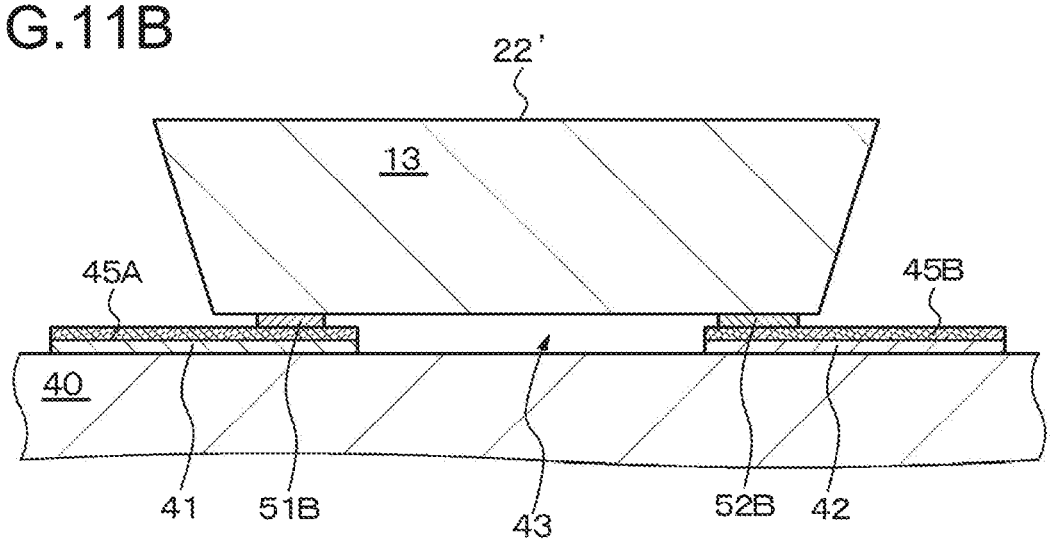
FIG. 11B is a schematic partial end view of the light-emitting device assembly of the embodiment 3 taken along the arrow B-B in FIG. 10.
Figure 12:
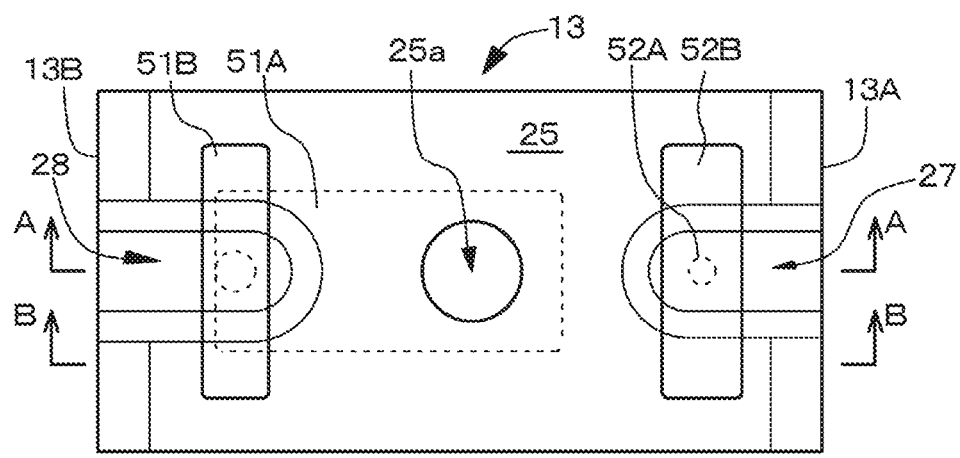
FIG. 12 is a schematic plan view of a light-emitting device constituting the light-emitting device assembly of the embodiment 3.
Figure 13A:
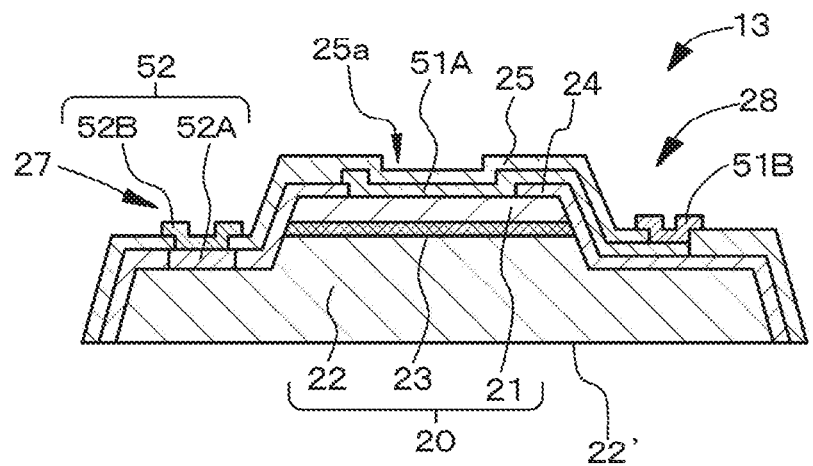
FIG. 13A and FIG. 13B are respectively schematic partial end views of the light-emitting device constituting the light-emitting device assembly of the embodiment 3 taken along the arrow A-A and the arrow B-B in FIG. 12.
Figure 13B:
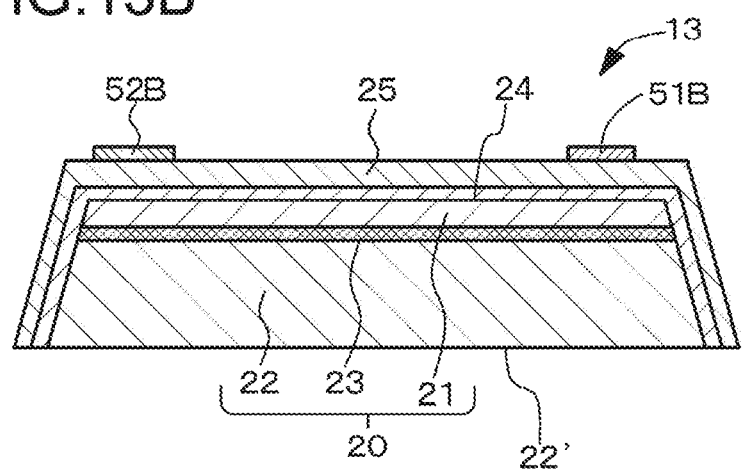

The embodiment 3 relates to a light-emitting device assembly according to the second aspect of the present disclosure and a method of producing the same. A schematic partial plan view of the light-emitting device assembly of the embodiment 3 is shown in FIG. 10. A schematic partial end view of the light-emitting device assembly of the embodiment 3 taken along the arrow A-A in FIG. 10 is shown in FIG. 11A, and a schematic partial end view of the light-emitting device assembly of the embodiment 3 taken along the arrow B-B in FIG. 10 is shown in FIG. 11B. Further, a schematic plan view of a light-emitting device constituting the light-emitting device assembly of the embodiment 3 is shown in FIG. 12, and schematic partial end views of the light-emitting device constituting the light-emitting device assembly of the embodiment 3 taken along the arrow A-A and the arrow B-B in FIG. 12 are shown in FIG. 13A and FIG. 13B.

The light-emitting device assembly of the embodiment 3 includes:

a light-emitting device (specifically, light-emitting diode) 13 including the light-emitting layer 20, a first electrode 51, and a second electrode 52 electrically connected to the light-emitting layer 20; and the first connecting portion 41 and the second connecting portion 42 provided on the base 40, in which the first connecting portion 41 and the second connecting portion 42 are separated from each other by the separation portion 43, the base 40 being exposed from the separation portion 43, the first electrode 51 includes a first portion 51A and a second portion 51B, the first portion 51A being in contact with the light-emitting layer 20, the second portion 51B of the first electrode 51 is connected to the first connecting portion 41, the first portion 51A of the first electrode 51 extends from the second portion 51B of the first electrode 51, and a communication unit (first communication unit) 28 is provided in a part of the light-emitting device in which the second portion 51B of the first electrode 51 is provided and around the part, the second portion 51B of the first electrode 51 communicating with the outside via the communication unit.

Further, in the light-emitting device assembly of the embodiment 3, the first electrode 51 and the second electrode 52 are provided on the same side with respect to the light-emitting layer 20. Further, the second communication unit 27 is provided in a part of the light-emitting device 13 in which the second electrode 52 is provided and around the part, the second electrode 52 communicating with the outside via the second communication unit 27. The second portion 51B of the first electrode 51 and the first connecting portion 41 are connected to each other via the first conductive unit 45A, and the second electrode 52 and the second connecting portion 42 are connected to each other via the second conductive unit 45B. The first communication unit 28 is formed in a part of the first compound semiconductor layer 21, the active layer 23, and the second compound semiconductor layer 22.

The configuration of the light-emitting layer 20 can be similar to that in the embodiment 1. The light-emitting layer 20 is covered by the insulating layer 24, except for a light output surface 22' of the second compound semiconductor layer 22. A second insulating layer 25 is formed on the first portion 51A of the first electrode 51 and the insulating layer 24. The first portion 51A of the first electrode 51 that is in contact with the light-emitting layer 20 extends on the insulating layer 24 to the first communication unit 28. A part 25a of the second insulating layer 25 formed on the first portion 51A of the first electrode 51 located above the top surface of the first compound semiconductor layer 21 is a circular recessed portion. However, the shape of the part 25a of the second insulating layer 25 is not limited thereto, and may be a square, a rectangle, a rounded square, a rounded rectangle, an ellipse, or the like. The part of the second insulating layer 25 located above the first portion 51A of the first electrode 51 in the first communication unit 28 has been removed, and the second portion 51B of the first electrode 51 is formed from the exposed first portion 51A of the first electrode 51 to the second insulating layer 25. The second portion 51B of the first electrode 52 surrounds the first portion 51A while projecting toward the first connecting portion 41. The first portion 51B of the first electrode 51 corresponds to the first pad portion. The first communication unit 28 is provided in a part of the light-emitting device located at a part where the first portion 51B of the first electrode 51 is in contact with the first portion 51A and around the part.

Similarly to the embodiment 1, the second communication unit 27 is formed in a part of the first compound semiconductor layer 21, the active layer 23, and the second compound semiconductor layer 22, and the second electrode 52 is formed in a part of the second compound semiconductor layer 22 exposed in the second communication unit 27. The second electrode 52 includes a first portion 52A and a second portion 52B. Further, the second portion 52B of the second electrode 52 is connected to the second connecting portion 42, and the first portion 52A of the second electrode 52 extends from the second portion 52B of the second electrode 52. The second portion 52B of the second electrode 52 surrounds the first portion 52A while projecting toward the second connecting portion 42. Further, the first portion 52A of the second electrode 52 is in contact with the light-emitting layer 20 (specifically, the second compound semiconductor layer 22). The second portion 52B of the second electrode 52 corresponds to the second pad portion.

In the illustrated example, the second communication unit 27 is provided on one side 13A of the light-emitting device 13, and a planar shape thereof is, for example, a semi-circle rectangular shape (shape obtained by combining two line segments and a semi-circle). Further, in the illustrated example, the first communication unit 28 is provided on another side 13B opposite to the one side 13A of the light-emitting device 13, and a planar shape thereof is, for example, a semi-circle rectangular shape (shape obtained by combining two line segments and a semi-circle).

The base 40 can have a configuration and structure substantially similar to those in the embodiment 1 except that no wide portion is formed.

Hereinafter, the method of producing the light-emitting device assembly of the embodiment 3 will be described with reference to FIG. 30A, FIG. 30B, FIG. 31A, FIG. 31B, FIG. 32A, FIG. 32B, FIG. 33A, and FIG. 33B, which are each a schematic partial end view of the light-emitting device and the like. FIG. 30A, FIG. 31A, FIG. 32A, and FIG. 33A are each a schematic partial end view similar to one taken along the arrow A-A in FIG. 10, and FIG. 30B, FIG. 31B, FIG. 32B, and FIG. 33B are each a schematic partial end view similar to one taken along the arrow B-B in FIG. 10. Note that the light-emitting device 13 can be produced on the basis of a well-known production method.

[Step-300]

The light-emitting device 13 of the embodiment 3 having a structure whose schematic partial end view is shown in FIGS. 13A and 13B is prepared. Further, similarly to the embodiment 1, the base 40 is prepared, the uncured or semi-cured energy ray-curable adhesive layer 47 being formed on the surface of the base 40.

[Step-310]

First, similarly to [Step-110] of the embodiment 1, the light-emitting device 13 is disposed on the base 40 via the part 47B of the uncured or semi-cured energy ray-curable adhesive layer so that the second portion 51B of the first electrode 51 faces the first connecting portion 41 and the light-emitting device 13 covers the separation portion 43. This state is shown in FIG. 30A and FIG. 30B. The part 47B of the uncured or semi-cured adhesive layer fills the surface of the light-emitting device 13 on a base side by the capillary phenomenon.

[Step-320]

Next, an energy ray (specifically, ultraviolet rays) is applied to the base 40 from the side of the base 40 opposite to the side on which the light-emitting device 13 is disposed to cure a part of the adhesive layer that is not blocked by the first connecting portion 41 and the second connecting portion 42. This state is shown in FIG. 31A and FIG. 31B. After that, the part 47B of the uncured or semi-cured adhesive layer is removed by using a solvent. This state is shown in FIG. 32A and FIG. 32B. The cured part 47A of the adhesive layer 47 is left on the separation portion 43. Further, the light-emitting device 13 is temporarily fixed on the base 40 by the cured part 47A of the adhesive layer 47. The part 47B of the uncured or semi-cured adhesive layer located in the vicinity of the first electrode 51 and the second electrode 52 is easily and reliably removed via the first communication unit 28 and the second communication unit 27.

[Step-330]

Then, similarly to [Step-130] of the embodiment 1, on the basis of the plating method, the second portion 51B of the first electrode 51 and the first connecting portion 41 are connected to each other. Simultaneously, the second portion 52B of the second electrode 52 and the second connecting portion 42 are connected to each other. This state is shown in FIG. 33A and FIG. 33B. The second portion 51B of the first electrode 51 and the first connecting portion 41 are connected to each other via the first conductive unit 45A, and the second electrode 52 and the second connecting portion 42 are connected to each other via the second conductive unit 45B. The light-emitting device 13 is fixed to the first connecting portion 41 and the second connecting portion 42 by the first conductive unit 45A and the second conductive unit 45B.

[Step-340]

After that, the cured part 47A of the adhesive layer is removed by using a solvent via the separation portion 43. Since the separation portion 43 is formed, it is possible to easily and reliably remove the cured part 47A of the adhesive layer. In this way, it is possible to achieve the structure shown in FIG. 11A and FIG. 11B.

Also in the light-emitting device assembly of the embodiment 3, the first connecting portion and the second connecting portion are separated from each other by the separation portion from which the base is exposed. That is, no resin for temporary fixation remains in the separation portion. Therefore, a problem that the resin layer for the temporary fixation is peeled off when the light-emitting device is used for a long time is not caused. Also in the method of producing the light-emitting device assembly of the embodiment 3, since the part of the cured adhesive layer is finally removed via the separation portion, the problem that the resin layer for the temporary fixation is peeled off when the light-emitting device is used for a long time is not caused.

Figure 14:
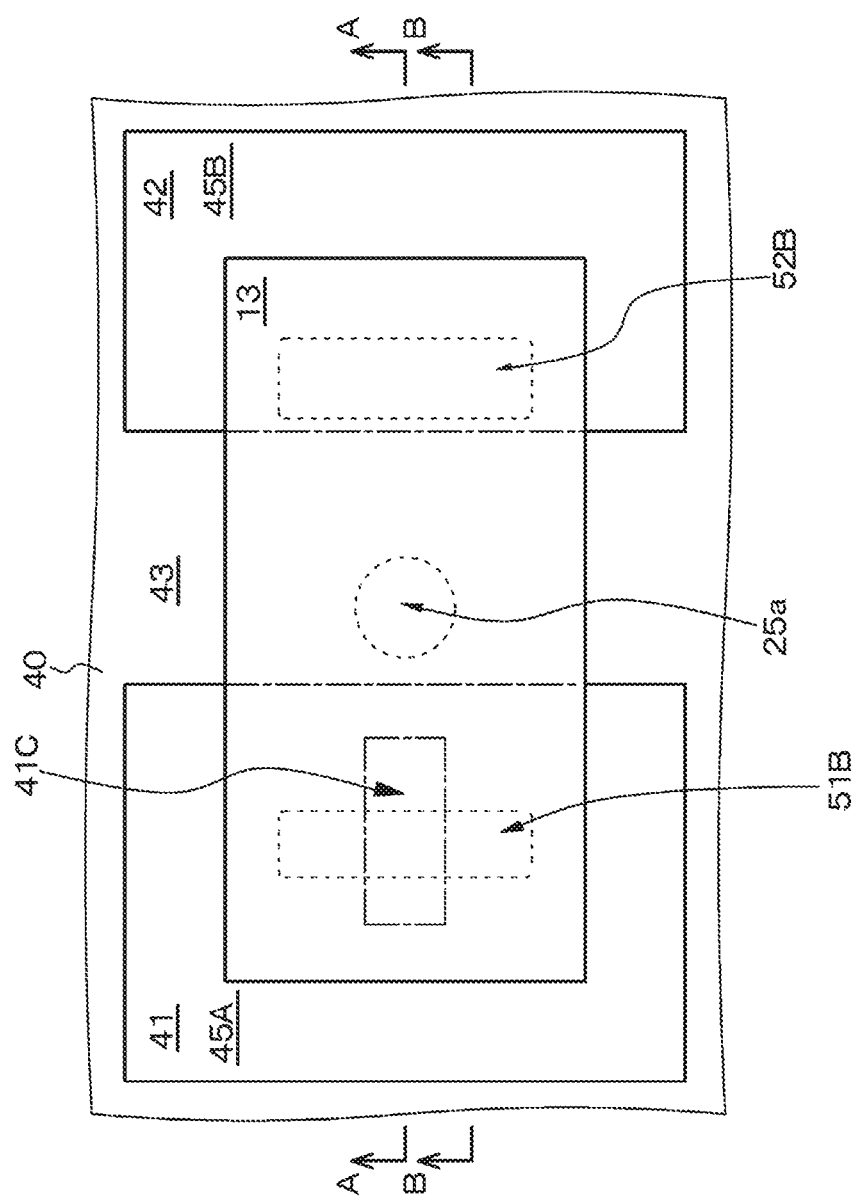
FIG. 14 is a schematic partial plan view of a modified example of the light-emitting device assembly of the embodiment 3.
Figure 15A:
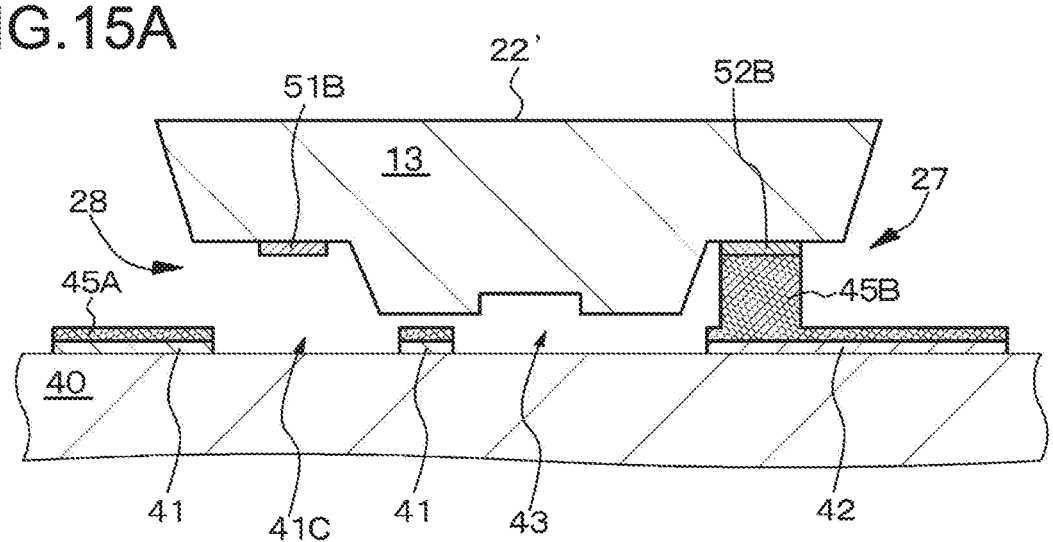
FIG. 15A is a schematic partial end view of the modified example of the light-emitting device assembly of the embodiment 3 taken along the arrow A-A in FIG. 14.
Figure 15B:
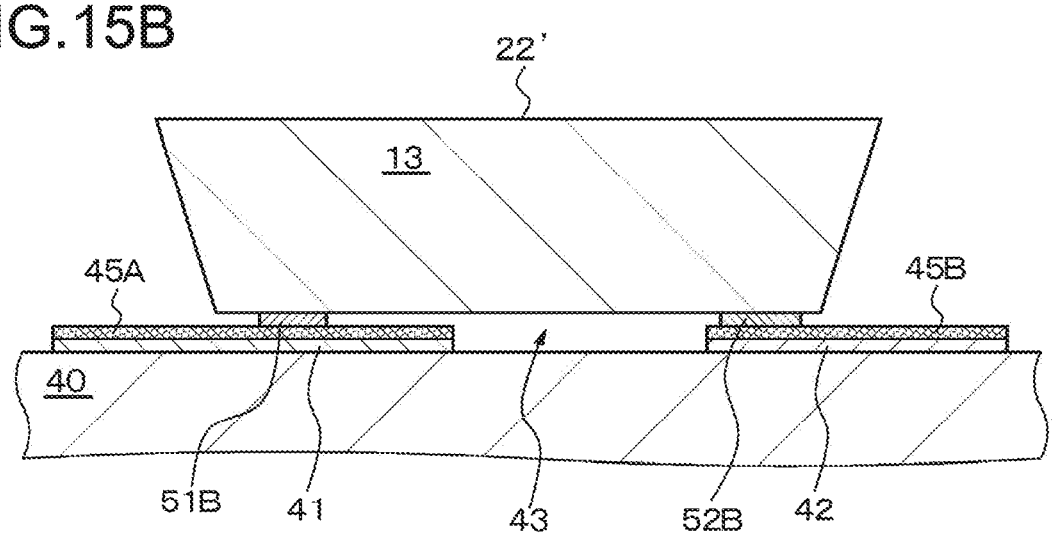
FIG. 15B is a schematic partial end view of the modified example of the light-emitting device assembly of the embodiment 3 taken along the arrow B-B in FIG. 14.
Figure 16:
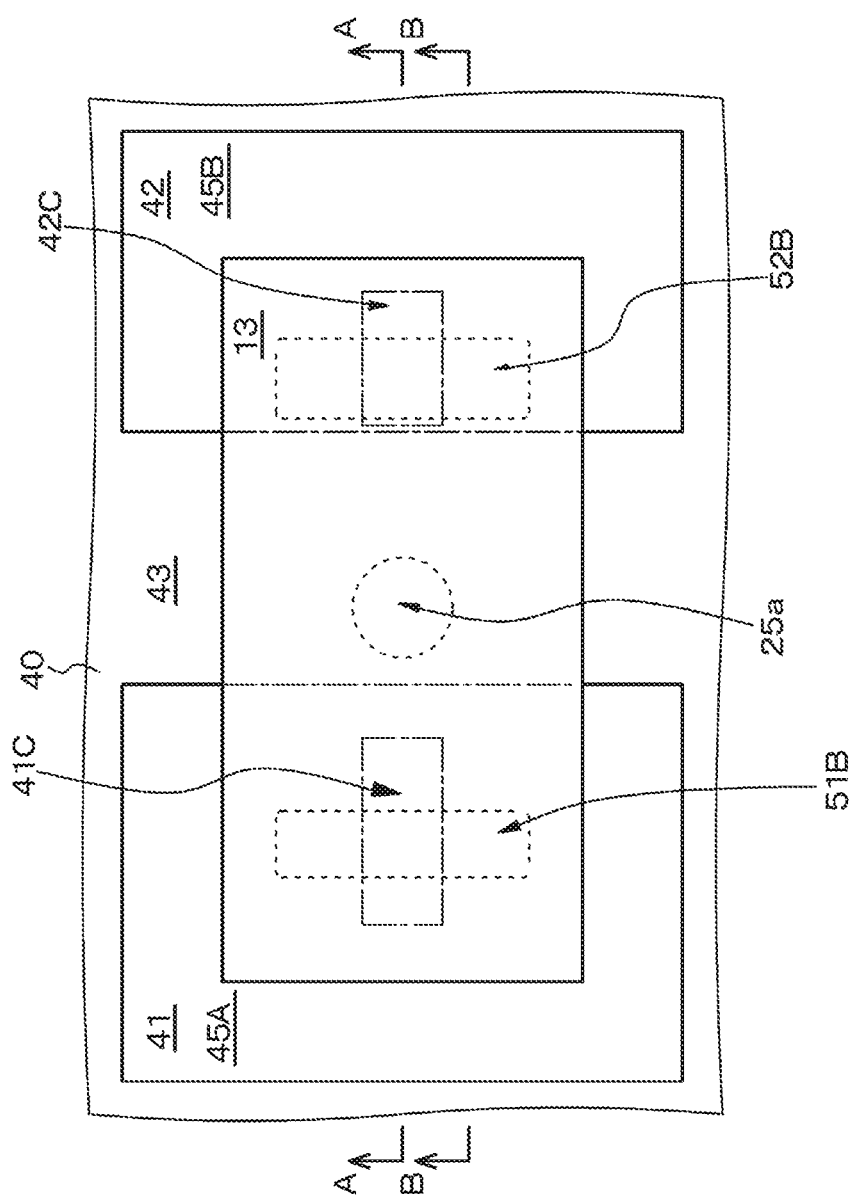
FIG. 16 is a schematic partial plan view of a different modified example of the light-emitting device assembly of the embodiment 3
Figure 17A:
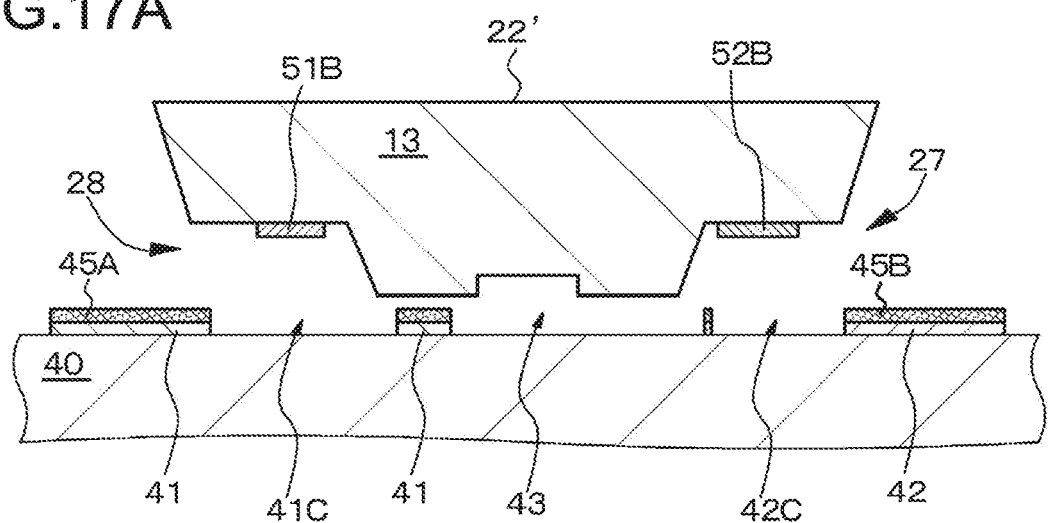
FIG. 17A is a schematic partial end view of the different modified example of the light-emitting device assembly of the embodiment 3 taken along the arrow A-A in FIG. 16.
Figure 17B:
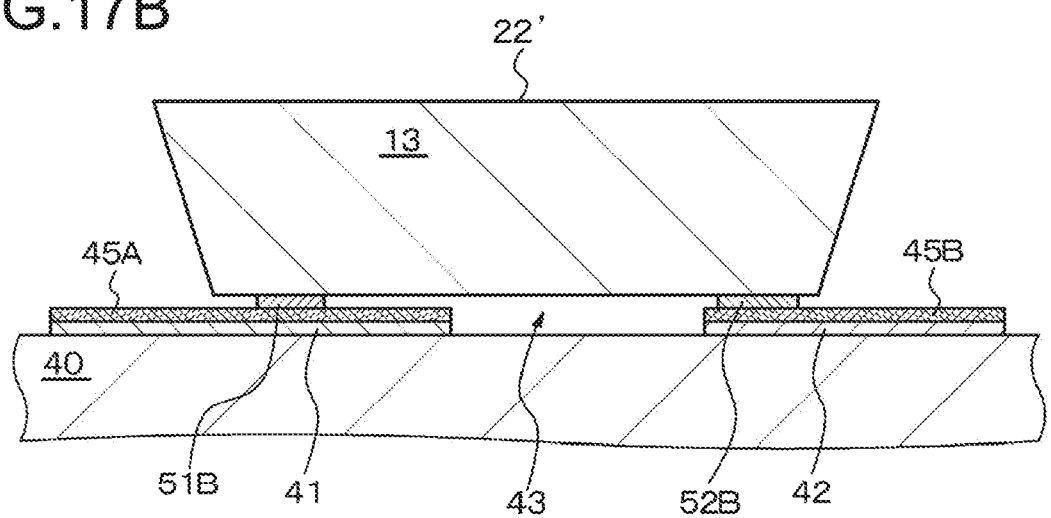
FIG. 17B is a schematic partial end view of the different modified example of the light-emitting device assembly of the embodiment 3 taken along the arrow B-B in FIG. 16.

A schematic partial plan view of a modified example of the light-emitting device assembly of the embodiment 3 is shown in FIG. 14, a schematic partial end view of the modified example of the light-emitting device assembly of the embodiment 3 taken along the arrow A-A in FIG. 14 is shown in FIG. 15A, and a schematic partial end view of the modified example of the light-emitting device assembly of the embodiment 3 taken along the arrow B-B in FIG. 14 is shown in FIG. 15B. Further, a schematic partial plan view of a different modified example of the light-emitting device assembly of the embodiment 3 is shown in FIG. 16, a schematic partial end view of the different modified example of the light-emitting device assembly of the embodiment 3 taken along the arrow A-A in FIG. 16 is shown in FIG. 17A, and a schematic partial end view of the different modified example of the light-emitting device assembly of the embodiment 3 taken along the arrow B-B in FIG. 16 is shown in FIG. 17B. Note that in FIG. 14 and FIG. 16, regarding the first electrode and the second electrode, only the second portion 51B of the first electrode 51 and the second portion 52B of the second electrode 52 are shown. In these modified examples, the first connecting portion 41 is not provided in a part 41C of the base 40 facing at least a part of the first electrode 51. By adopting such a structure, it is possible to more easily and reliably remove the part 47B of the uncured or semi-cured adhesive layer in the vicinity of the second portion 51B of the first electrode 51. Further, in the different modified example, the second connecting portion 42 is not provided in a part 42C of the base 40 facing at least a part of the second electrode 52. By adopting such a structure, it is possible to more easily and reliably remove the part 47B of the uncured or semi-cured adhesive layer in the vicinity of the second electrode. Note that such a structure in which the second connecting portion 42 is not provided in the part 42C of the base 40 facing at least a part of the second electrode can be applied to another embodiment.

Embodiment 4

Figure 18:
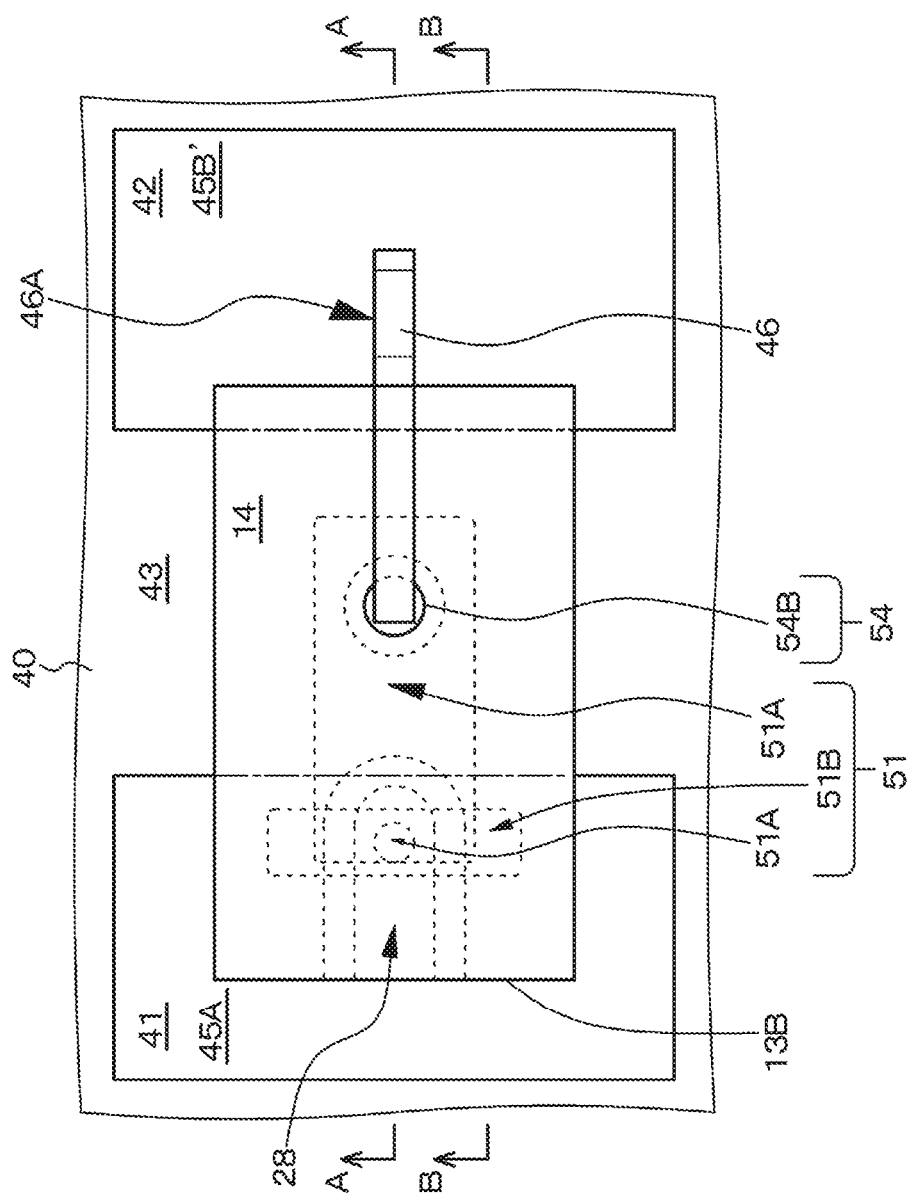
FIG. 18 is a schematic partial plan view of a light-emitting device assembly of an embodiment 4.
Figure 19A:
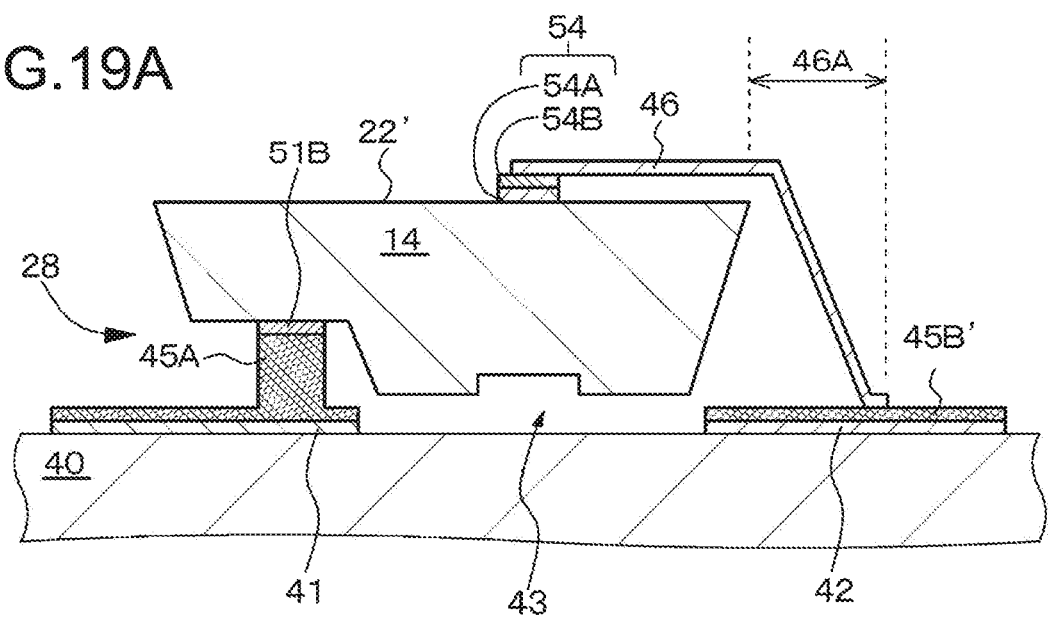
FIG. 19A is a schematic partial end view of the light-emitting device assembly of the embodiment 4 taken along the arrow A-A in FIG. 18.
Figure 19B:
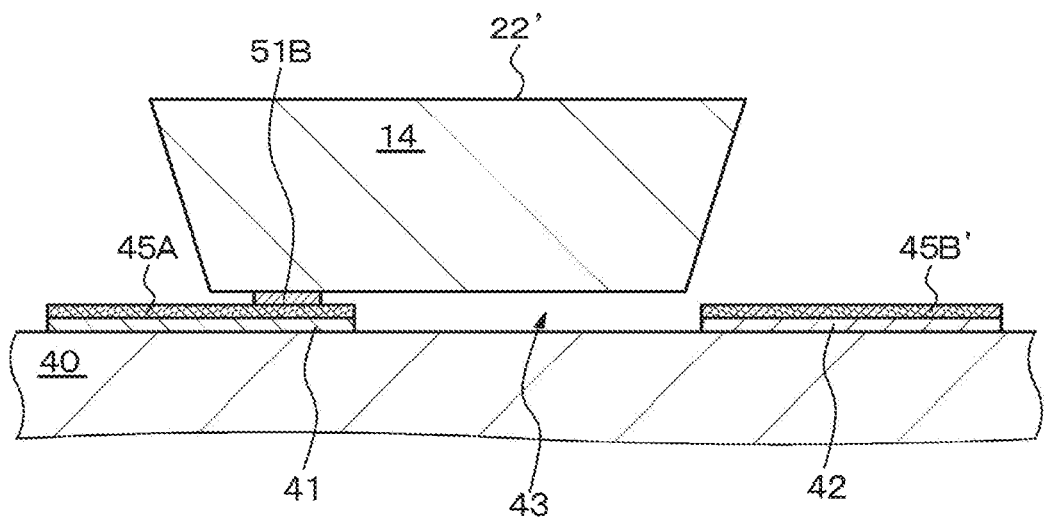
FIG. 19B is a schematic partial end view of the light-emitting device assembly of the embodiment 4 taken along the arrow B-B in FIG. 18.
Figure 20:
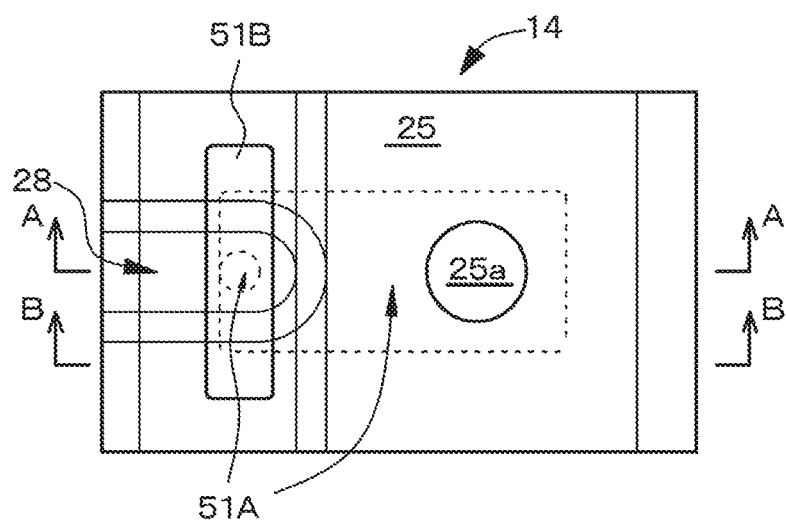
FIG. 20 is a schematic plan view of a light-emitting device constituting the light-emitting device assembly of the embodiment 4.

The embodiment 4 is an alternative of the embodiment 3. A schematic partial plan view of the light-emitting device assembly of the embodiment 4 is shown in FIG. 18, a schematic partial end view of the light-emitting device assembly of the embodiment 4 taken along the arrow A-A in FIG. 18 is shown in FIG. 19A, and a schematic partial end view of the light-emitting device assembly of the embodiment 4 taken along the arrow B-B in FIG. 18 is shown in FIG. 19B. Further, a schematic plan view of a light-emitting device constituting the light-emitting device assembly of the embodiment 4 is shown in FIG. 20, and schematic partial end views of the light-emitting device constituting the light-emitting device assembly of the embodiment 4 taken along the arrow A-A, the arrow B-B, and the arrow C-C are respectively shown in FIG. 21A and FIG. 21B.

In the light-emitting device assembly of the embodiment 4, a second electrode 54 is provided on the opposite side of the first electrode 51 with respect to the light-emitting layer 20, and the second electrode 54 and the second connecting portion 42 are connected to each other via the conductor layer 46. Further, an orthographic projection image of the part 46A of the conductor layer 46 that does not overlap with a light-emitting device (light-emitting diode) 14 with respect to the second connecting portion 42 is included in the second connecting portion 42. The second electrode 54 includes a first portion 54A of the second electrode 54 provided on the light output surface 22' of the second compound semiconductor layer 22, and a second portion 54B (that functions as the second pad portion) of the second electrode 54 provided on the first portion 54A of the second electrode 54.

Hereinafter, the method of producing the light-emitting device assembly of the embodiment 4 will be described with reference to FIG. 34A, FIG. 34B, FIG. 35A, FIG. 35B, FIG. 36A, FIG. 36B, FIG. 37A, and FIG. 37B, which are each a schematic partial end view of the light-emitting device and the like. FIG. 34A, FIG. 35A, FIG. 36A, and FIG. 37A are each a schematic partial end view similar to one taken along the arrow A-A in FIG. 18, and FIG. 34B, FIG. 35B, FIG. 36B, and FIG. 37B are each a schematic partial end view similar to one taken along the arrow B-B in FIG. 18. Note that the light-emitting device 14 can be produced on the basis of a well-known production method.

[Step-400]

Figure 21A:
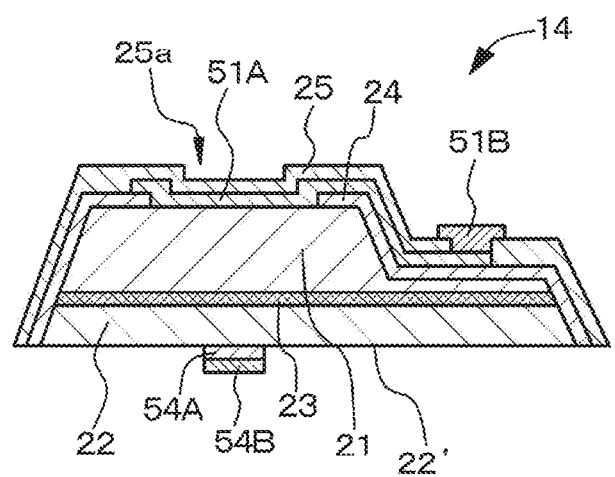
FIG. 21A and FIG. 21B are respectively a schematic partial end views of the light-emitting device constituting the light-emitting device assembly of the embodiment 4 taken along the arrow A-A and the arrow B-B in FIG. 20.
Figure 21B:
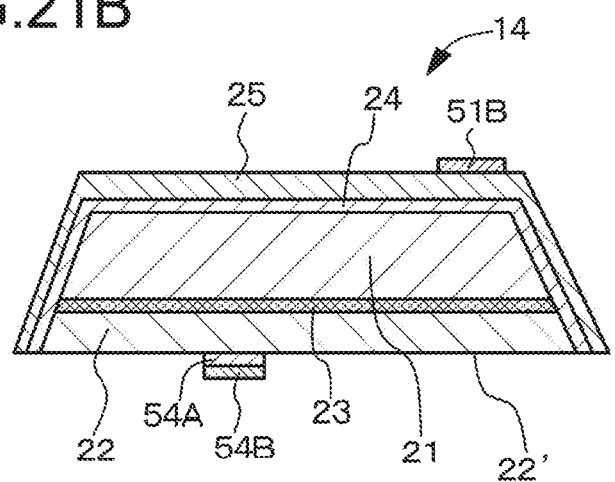

The light-emitting device 14 of the embodiment 4 having a structure whose schematic partial end view is shown in FIGS. 21A and 21B is prepared. Further, similarly to the embodiment 1, the base 40 is prepared, the uncured or semi-cured energy ray-curable adhesive layer 47 being formed on the surface of the base 40.

[Step-410]

First, similarly to [Step-310] of the embodiment 3, the light-emitting device 14 is disposed on the base 40 via the part 47B of the uncured or semi-cured energy ray-curable adhesive layer so that the second portion 51B of the first electrode 51 faces the first connecting portion 41 and the light-emitting device 14 covers the separation portion 43. This state is shown in FIG. 34A and FIG. 34B.

[Step-420]

Next, similarly to [Step-320] of the embodiment 3, an energy ray (specifically, ultraviolet rays) is applied to the base 40 from the side of the base 40 opposite to the side on which the light-emitting device 13 is disposed to cure a part of the adhesive layer that is not blocked by the first connecting portion 41 and the second connecting portion 42. This state is shown in FIG. 35A and FIG. 35B. After that, the part 47B of the uncured or semi-cured adhesive layer is removed by using a solvent. This state is shown in FIG. 36A and FIG. 36B. The cured part 47A of the adhesive layer 47 is left on the separation portion 43. Further, the light-emitting device 14 is temporarily fixed on the base 40 by the cured part 47A of the adhesive layer 47. The part 47B of the uncured or semi-cured adhesive layer located in the vicinity of the first electrode 51 is easily and reliably removed via the first communication unit 28.

[Step-430]

Then, similarly to [Step-330] of the embodiment 3, on the basis of the plating method, the second portion 51B of the first electrode 51 and the first connecting portion 41 are connected to each other. This state is shown in FIG. 37A and FIG. 37B. Note that the plating layer 45B' is formed on the second connecting portion 42.

[Step-440]

Next, in order to form the conductor layer 46, similarly to [Step-240] of the embodiment 2, a plating resist layer is formed on the entire surface on the basis of a well-known method. Then, similarly to [Step-130] of the embodiment 1, after forming, on the basis of the plating method, the conductor layer 46 that connects the second portion 54B of the second electrode 54 and the second connecting portion 42 to each other, the plating resist layer is removed. In this way, the second portion 51B of the first electrode 51 and the first connecting portion 41 are connected to each other via the first conductive unit 45A, and the second electrode 54 and the second connecting portion 42 are connected to each other via the conductor layer 46. The light-emitting device 14 is fixed to the first connecting portion 41 and the second connecting portion 42 by the first conductive unit 45A and the conductor layer 46.

[Step-450]

After that, the cured part 47A of the adhesive layer is removed by using a solvent via the separation portion 43. Since the separation portion 43 is formed, it is possible to easily and reliably remove the cured part 47A of the adhesive layer. In this way, it is possible to achieve the structure shown in FIG. 19A and FIG. 19B.

Also in the light-emitting device assembly of the embodiment 4, similarly to FIG. 9, the second wide portion 44' facing the wide portion 44 is provided on a second connecting portion side of the separation portion 43, and the second connecting portion 42 may be divided into at least two regions (e.g., regions 42, 42A, and 42B by the second wide portion 44'. By adopting such structure, it is possible to more reliably remove the cured part 47A of the adhesive layer.

Although the light-emitting device assembly, the method of producing the same, and the display apparatus according to the present disclosure have been described heretofore on the basis of favorable embodiments, the present disclosure is not limited to these embodiments. The configuration and structure of the light-emitting device described in the embodiments are examples, and also members and materials constituting them are examples and can be appropriately changed. For example, the order of stacking the compound semiconductor layer in the light-emitting device may be reversed. That is, although the first conductivity type is a p-type and the second conductivity type is an n-type in the embodiment, conversely, the first conductivity type may be an n-type and the second conductivity type may be a p-type.

Further, the configuration and structure in which the first electrode includes the first pad portion have been adopted in the embodiment. Alternatively, the second insulating layer may be covered by a fourth insulating layer, an opening portion may be formed in the fourth insulating layer, which reaches the first electrode, and a contact hole portion may be formed from such an opening portion to the fourth insulating layer. In this case, the contact hole portion corresponds to the second portion of the first electrode.

Further, as shown in a modified example of the light-emitting device of the embodiment 1 in FIG. 38A and a modified example of the light-emitting device of the embodiment 2 in FIG. 38B, a light-shielding film 29 may be formed in a desired region (region close to the outer surface of the light-emitting devices 11 and 12) in the illustrated example) of each of the light-emitting devices 11 and 12 so that an undesired region is not irradiated with light output from the light-emitting device. Examples of the material forming the light-shielding film include a material capable of blocking light such as titanium (Ti), chromium (Cr), tungsten (W), tantalum (Ta), aluminum (Al), and MoSi$_2$. The light-shielding film 29 is formed on a part of the insulating layer 24. Further, the light-shielding film 29 and the insulating layer 24 are covered by a third insulating layer 26, and the second portion 31B of the first electrode 31 is formed from the first portion 31A of the first electrode 31 to a part of the third insulating layer 26. The light-shielding film 29 can be applied to the light-emitting device of the embodiment 3 and the embodiment 4. In some cases, the first electrode may have a structure of serving also as a light-shielding film.

Further, in the example shown in FIG. 1A, an orthographic projection image of the first portion 31A of the first electrode 31 with respect to the base 40 is included in the wide portion 44 of the separation portion 43. However, the positional relationship between the orthographic projection image of the first portion 31A of the first electrode 31 with respect to the base 40 and the wide portion 44 of the separation portion 43 is not limited thereto. For example, as shown in FIG. 39, the width of the orthographic projection image of the first portion 31A of the first electrode 31 with respect to the base 40 may be the same as the width of the wide portion 44 of the separation portion 43. Alternatively, as shown in FIG. 40, the orthographic projection image of the first portion 31A of the first electrode 31 with respect to the base 40 may protrude from the wide portion 44 of the separation portion 43.

As the light-emitting device constituting the light-emitting device assembly (light-emitting unit), a fourth light-emitting device, a fifth light-emitting device, . . . may be added to a first light-emitting device, a second light-emitting device, and a third light-emitting device. Examples thereof include a light-emitting unit to which a sub-pixel that emits white light is added to improve the luminance, a light-emitting unit to which a sub-pixel that emits complementary color light is added to enlarge the color reproduction range, a light-emitting unit to which a sub-pixel that emits yellow light is added to enlarge the color reproduction range, and a light-emitting unit to which a sub-pixel that emits yellow light and cyan light is added to enlarge the color reproduction range.

The display apparatus (light-emitting device display apparatus) may be not only a flat type/direct view type image display apparatus of color display typified by a television receiver and a computer terminal but also an image display apparatus that projects an image on a retina of a human being and a projection type image display apparatus. Note that in these image display apparatuses, it only needs to, for example, adopt a field sequential driving method of displaying an image by controlling the light emission/non-light emission state of each of the first light-emitting device, the second light-emitting device, and the third light-emitting device in a time-division manner although the present disclosure is not limited thereto.

It should be noted that the present technology may take the following configurations.

[A01]<<Light-Emitting Device Assembly: First Aspect>>

A light-emitting device assembly, including:

a light-emitting device including a light-emitting layer, a first electrode, and a second electrode electrically connected to the light-emitting layer; and a first connecting portion and a second connecting portion provided on a base, in which the first connecting portion and the second connecting portion are separated from each other by a separation portion, the base being exposed from the separation portion, a wide portion is provided on a first connecting portion side of the separation portion, the first electrode includes a first portion and a second portion, the first portion being in contact with the light-emitting layer, the second portion of the first electrode is connected to the first connecting portion, the first portion of the first electrode extends from the second portion of the first electrode, and an orthographic projection image of the first portion of the first electrode with respect to the base and the wide portion of the separation portion overlap with each other at least in part.

[A02] The light-emitting device assembly according to [A01], in which
the first connecting portion is divided by the wide portion into two areas.

[A03] The light-emitting device assembly according to [A02], in which
a planar shape of the whole of the separation portion and the wide portion is a "T" shape,
a horizontal bar of the "T" shape constitutes the separation portion that separates the first connecting portion and the second connecting portion from each other, and
a vertical bar of the "T" shape constitutes the wide portion that divides the first connecting portion into the two areas.

[A04] The light-emitting device assembly according to any one of [A01] to [A03], in which
the second portion of the first electrode extends from the first portion and surrounds the first portion while projecting toward the first connecting portion.

[A05] The light-emitting device assembly according to any one of [A01] to [A04], in which
the first electrode and the second electrode are provided on the same side with respect to the light-emitting layer.

[A06] The light-emitting device assembly according to [A05], in which
a communication unit is provided in a part of the light-emitting device in which the second electrode is provided and around the part, the second electrode communicating with the outside via the communication unit.

[A07] The light-emitting device assembly according to [A05], in which
where the shortest distance of space between the second portion of the first electrode and the base is represented by $L_{11}$ and the shortest distance of space between the second electrode and the base is represented by $L_{12}$, a relationship of $L_{11}<L_{12}$ is satisfied.

[A08] The light-emitting device assembly according to any one of [A05] to [A07], in which
the second portion of the first electrode and the first connecting portion are connected to each other via a first conductive unit, and the second electrode and the second connecting portion are connected to each other via a second conductive unit.

[A09] The light-emitting device assembly according to any one of [A01] to [A04], in which
a second electrode is provided on the opposite side of the first electrode with respect to the light-emitting layer, and
the second electrode and the second connecting portion are connected to each other via a conductor layer.

[A10] The light-emitting device assembly according to [A09], in which
an orthographic projection image of a part of the conductor layer that does not overlap with a light-emitting device with respect to the second connecting portion is included in the second connecting portion.

[A11] The light-emitting device assembly according to any one of [A01] to [A10], in which
a light-shielding film is formed the light-emitting device.

[B01]<<Light-Emitting Device Assembly: Second Embodiment>>
A light-emitting device assembly, including:
a light-emitting device including
a light-emitting layer,
a first electrode, and
a second electrode electrically connected to the light-emitting layer; and
a first connecting portion and a second connecting portion provided on a base, in which
the first connecting portion and the second connecting portion are separated from each other by a separation portion, the base being exposed from the separation portion,
the first electrode includes a first portion and a second portion, the first portion being in contact with the light-emitting layer,
the second portion of the first electrode is connected to the first connecting portion,
the first portion of the first electrode extends from the second portion of the first electrode, and
a communication unit is provided in a part of the light-emitting device in which the second portion of the first electrode is provided and around the part, the second portion of the first electrode communicating with the outside via the communication unit.

[B02] The light-emitting device assembly according to [B01], in which
the first connecting portion is not provided in a part of the base facing at least a part of the first electrode.

[B03] The light-emitting device assembly according to [B01] or [B02], in which
the first electrode and the second electrode are provided on the same side with respect to the light-emitting layer.

[B04] The light-emitting device assembly according to [B03], in which
a second communication unit is provided in a part of the light-emitting device in which the second electrode is provided and around the part, the second electrode communicating with the outside via the second communication unit.

[B05] The light-emitting device assembly according to [B03] or [B04], in which
the second portion of the first electrode and the first connecting portion are connected to each other via a first conductive unit, and
the second electrode and the second connecting portion are connected to each other via a second conductive unit.

[B06] The light-emitting device assembly according to [B01] or [B02], in which
a second electrode is provided on the opposite side of the first electrode with respect to the light-emitting layer, and
the second electrode and the second connecting portion are connected to each other via a conductor layer.

[B07] The light-emitting device assembly according to [B06], in which
an orthographic projection image of a part of the conductor layer that does not overlap with a light-emitting device with respect to the second connecting portion is included in the second connecting portion.

[B08] The light-emitting device assembly according to any one of [B01] to [B07], in which
a light-shielding film is formed the light-emitting device.

[C01]<<Display Apparatus>>
A display apparatus, including:
the light-emitting device assemblies according to any one of [A01] to [B08] arranged in a two-dimensional matrix pattern.

[D01]<<Method of Producing Light-Emitting Device Assembly: First Embodiment>>
A method of producing a light-emitting device assembly including
a light-emitting device including a light-emitting layer, a first electrode, and a second electrode electrically connected to the light-emitting layer, and
a first connecting portion and a second connecting portion provided on a base, in which the first connecting portion and the second connecting portion are separated from each other by a separation portion, the base being exposed from the separation portion, a wide portion is provided on a first connecting portion side of the separation portion, the first electrode includes a first portion and a second portion, the first portion being in contact with the light-emitting layer, the second portion of the first electrode is connected to the first connecting portion, the first portion of the first electrode extends from the second portion of the first electrode, and an orthographic projection image of the first portion of the first electrode with respect to the base and the wide portion of the separation portion overlap with each other at least in part, the method including at least:

disposing the light-emitting device on the base via an uncured or semi-cured energy ray-curable adhesive layer in such a way that an orthographic projection image of the first portion of the first electrode with respect to the base and the wide portion of the separation portion overlap with each other at least in part, the second portion of the first electrode faces the first connecting portion, and the light-emitting device covers the separation portion; then, applying an energy ray to the base from a side of the base opposite to a side on which the light-emitting device is disposed to cure a part of the adhesive layer that is not blocked by the first connecting portion and the second connecting portion, and then removing the part of the uncured or semi-cured adhesive layer; then, connecting the second portion of the first electrode and the first connecting portion to each other; and then, removing the cured adhesive layer via the separation portion.

[D02]<<Method of Producing Light-Emitting Device Assembly: Second Embodiment>>

A method of producing a light-emitting device assembly including a light-emitting device including a light-emitting layer, a first electrode, and a second electrode electrically connected to the light-emitting layer, and a first connecting portion and a second connecting portion provided on a base, in which the first connecting portion and the second connecting portion are separated from each other by a separation portion, the base being exposed from the separation portion, the first electrode includes a first portion and a second portion, the first portion being in contact with the light-emitting layer, the second portion of the first electrode is connected to the first connecting portion, the first portion of the first electrode extends from the second portion of the first electrode, and a communication unit is provided in a part of the light-emitting device in which the second portion of the first electrode is provided and around the part, the second portion of the first electrode communicating with the outside via the communication unit, the method including at least:

disposing the light-emitting device on the base via an uncured or semi-cured energy ray-curable adhesive layer in such a way that an orthographic projection image of the first portion of the first electrode with respect to the base and the wide portion of the separation portion overlap with each other at least in part, the second portion of the first electrode faces the first connecting portion, and the light-emitting device covers the separation portion; then, applying an energy ray to the base from a side of the base opposite to a side on which the light-emitting device is disposed to cure a part of the adhesive layer that is not blocked by the first connecting portion and the second connecting portion, and then removing the part of the uncured or semi-cured adhesive layer; then, connecting the second portion of the first electrode and the first connecting portion to each other; and then, removing the cured adhesive layer via the separation portion.

REFERENCE SIGNS LIST 11, 12, 13, 14 light-emitting device
11A, 13A, 13B side of light-emitting device
20 light-emitting layer
21 first compound semiconductor layer
22 second compound semiconductor layer
22' light output surface of second compound semiconductor layer
23 active layer
24 insulating layer
25 second insulating layer
25a recessed portion of second insulating layer
26 third insulating layer
27 communication unit (second communication unit)
28 communication unit (first communication unit)
29 light-shielding film
31, 51 first electrode
31A, 51A second portion of first electrode
31B, 51B second portion of first electrode
32, 34, 52, 54 second electrode
32A, 34A, 52A, 54A first portion of second electrode
32B, 34B, 52B, 54B second portion of second electrode
40 base
41 first connecting portion
41A, 41B region of first connecting portion
78
41C part of base provided with no first connecting portion
42, 42A, 42B second connecting portion
42C part of base provided with no second connecting portion
43 separation portion
44 wide portion
44' second wide portion
45A first conductive unit
45B second conductive unit
45B' plating layer
46 conductor layer
46A part of conductor layer that does not overlap with light-emitting device
47 adhesive layer
47A cured part of adhesive layer (cured part)
47B uncured or semi-cured part of adhesive layer

The invention claimed is:

1. A light-emitting device assembly, comprising:
a light-emitting device including:
a light-emitting layer;
a first electrode on a first side of the light-emitting layer, wherein
the first electrode includes a first portion and a second portion,
the first portion is in contact with the light-emitting layer, and
the first portion extends from the second portion; and
a second electrode configured to electrically connect the light-emitting layer, wherein
the second electrode is on a second side of the light-emitting layer, and the second side is opposite to the first side;
a base;
a first connecting portion on the base, wherein the first connecting portion is connected to the second portion of the first electrode;
a second connecting portion on the base;
a conductor layer, wherein the second electrode is connected to the second connecting portion via the conductor layer; and
a separation portion between the first connecting portion and the second connecting portion, wherein
the base is exposed in the separation portion,
the separation portion includes a wide portion on a first connecting portion side of the separation portion, and
the first portion of the first electrode overlaps with the wide portion of the separation portion based on an orthographic projection of the first portion of the first electrode with respect to the base.

2. The light-emitting device assembly according to claim 1, wherein the wide portion is between a first area of the first connecting portion and a second area of the first connecting portion.

3. The light-emitting device assembly according to claim 2, wherein
a planar shape of the separation portion corresponds to a T shape,
a horizontal bar of the T shape constitutes the separation portion between the first connecting portion and the second connecting portion, and
a vertical bar of the T shape constitutes the wide portion between the first area and the second area of the first connecting portion.

4. The light-emitting device assembly according to claim 1, wherein
the second portion of the first electrode extends from the first portion towards the first connecting portion, and
the second portion of the first electrode surrounds the first portion of the first electrode.

5. The light-emitting device assembly according to claim 1, wherein
the second connecting portion includes a part of the conductor layer, and
the part of the conductor layer is in a non-overlapping arrangement with the light-emitting device.

6. A light-emitting device assembly, comprising:
a light-emitting device including:
a light-emitting layer;
a first electrode on a first side of the light-emitting layer, wherein
the first electrode includes a first portion and a second portion,
the first portion is in contact with the light-emitting layer, and
the first portion extends from the second portion; and
a second electrode configured to electrically connect the light-emitting layer, wherein
the second electrode is on a second side of the light-emitting layer, and
the second side is opposite to the first side;
a base;
a first connecting portion on the base, wherein the first connecting portion is connected to the second portion of the first electrode;
a second connecting portion on the base;
a conductor layer, wherein the second electrode is connected to the second connecting portion via the conductor layer;
a separation portion between the first connecting portion and the second connecting portion, wherein
the base is exposed in the separation portion; and
a communication unit in a part of the light-emitting device, wherein
the part of the light-emitting device includes the second portion of the first electrode, and
the second portion of the first electrode is configured to communicate with an outside of the light-emitting device assembly via the communication unit.

7. The light-emitting device assembly according to claim 6, wherein
the first connecting portion is absent in a part of the base, and
the part of the base faces the first electrode.

8. The light-emitting device assembly according to claim 6, wherein
the second connecting portion includes a part of the conductor layer, and
the part of the conductor layer is in a non-overlapping arrangement with the light-emitting device.

9. A display apparatus, comprising:
a plurality of light-emitting device assemblies in a two-dimensional matrix pattern, wherein each light-emitting device assembly of the plurality of light-emitting device assemblies comprises:
a light-emitting device including:
a light-emitting layer;
a first electrode on a first side of the light-emitting layer, wherein
the first electrode includes a first portion and a second portion,
the first portion is in contact with the light-emitting layer, and
the first portion extends from the second portion; and
a second electrode configured to electrically connect the light-emitting layer, wherein
the second electrode is on a second side of the light-emitting layer, and
the second side is opposite to the first side;
a base;
a first connecting portion on the base, wherein the first connecting portion is connected to the second portion of the first electrode;
a second connecting portion on the base;
a conductor layer, wherein the second electrode is connected to the second connecting portion via the conductor layer; and
a separation portion between the first connecting portion and the second connecting portion, wherein
the base is exposed in the separation portion,
the separation portion includes a wide portion on a first connecting portion side of the separation portion, and
the first portion of the first electrode overlaps with the wide portion of the separation portion based on an orthographic projection of the first portion of the first electrode with respect to the base.

10. A method of producing a light-emitting device assembly, the method comprising:
disposing a light-emitting device on a first side of a base of the light-emitting device assembly via an adhesive layer, wherein the adhesive layer is one of an uncured or a semi-cured energy ray-curable adhesive layer, and the light-emitting device assembly includes:
- the light-emitting device that includes:
  - a light-emitting layer;
  - a first electrode, wherein
    - the first electrode includes a first portion and a second portion,
    - the first portion is in contact with the light-emitting layer, and
    - the first portion extends from the second portion; and
  - a second electrode configured to electrically connect the light-emitting layer;
- a first connecting portion on the base, wherein the second portion of the first electrode faces the first connecting portion;
- a second connecting portion on the base; and
- a separation portion between the first connecting portion and the second connecting portion, wherein
  - the base is exposed in the separation portion,
  - the separation portion includes a wide portion on a first connecting portion side of the separation portion,
  - the first portion of the first electrode overlaps with the wide portion of the separation portion based on an orthographic projection of the first portion of the first electrode with respect to the base, and
  - the light-emitting device covers the separation portion;

applying an energy ray to the base from a second side of the base opposite to the first side to cure a part of the adhesive layer, wherein the part of the adhesive layer is not blocked by the first connecting portion and the second connecting portion;

removing one of an uncured part or a semi-cured part of the partly cured adhesive layer;

connecting the second portion of the first electrode to the first connecting portion; and removing the cured part of the partly cured adhesive layer via the separation portion.

11. A method of producing a light-emitting device assembly, the method comprising:

disposing a light-emitting device on a first side of a base of the light-emitting device assembly via an adhesive layer, wherein the adhesive layer is one of an uncured or a semi-cured energy ray-curable adhesive layer, and the light-emitting device assembly includes:
- the light-emitting device that includes:
  - a light-emitting layer;
  - a first electrode, wherein
    - the first electrode includes a first portion and a second portion,
    - the first portion is in contact with the light-emitting layer, and
    - the first portion extends from the second portion; and
  - a second electrode configured to electrically connect the light-emitting layer;
- a first connecting portion on the base, wherein the second portion of the first electrode faces the first connecting portion;
- a second connecting portion on the base;
- a separation portion between the first connecting portion and the second connecting portion, wherein
  - the base is exposed in the separation portion, and
  - the first portion of the first electrode overlaps with a wide portion of the separation portion based on an orthographic projection of the first portion of the first electrode with respect to the base; and
- a communication unit in a part of the light-emitting device, wherein
  - the part of the light-emitting device includes the second portion of the first electrode,
  - the second portion of the first electrode is configured to communicate with an outside of the light-emitting device assembly via the communication unit, and
  - the light-emitting device covers the separation portion;

applying an energy ray to the base from a second side of the base opposite to the first side to cure a part of the adhesive layer, wherein the part of the adhesive layer is not blocked by the first connecting portion and the second connecting portion;

removing one of an uncured part or a semi-cured part of the partly cured adhesive layer;

connecting the second portion of the first electrode to the first connecting portion; and removing the cured part of the partly cured adhesive layer via the separation portion.

\* \* \* \* \*